United States Patent
Kamochi et al.

(10) Patent No.: US 9,746,771 B2
(45) Date of Patent: Aug. 29, 2017

(54) LAMINATE BODY

(71) Applicant: FUJIFILM CORPORATION, Tokyo (JP)

(72) Inventors: Yoshitaka Kamochi, Haibara-gun (JP); Ichiro Koyama, Haibara-gun (JP); Yu Iwai, Haibara-gun (JP); Atsushi Nakamura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/048,187

(22) Filed: Feb. 19, 2016

(65) Prior Publication Data
US 2016/0170303 A1 Jun. 16, 2016

Related U.S. Application Data

(63) Continuation of application No. PCT/JP2014/071977, filed on Aug. 22, 2014.

(30) Foreign Application Priority Data

Aug. 23, 2013 (JP) ................................. 2013-173374
Mar. 28, 2014 (JP) ................................. 2014-068595
Aug. 21, 2014 (JP) ................................. 2014-168415

(51) Int. Cl.
*G03F 7/11* (2006.01)
*G03F 7/004* (2006.01)
(Continued)

(52) U.S. Cl.
CPC .............. *G03F 7/11* (2013.01); *G03F 7/0045* (2013.01); *G03F 7/0046* (2013.01);
(Continued)

(58) Field of Classification Search
CPC ........ G03F 7/11; G03F 7/0045; G03F 7/0046; G03F 7/0382; G03F 7/0397
(Continued)

(56) References Cited

U.S. PATENT DOCUMENTS 5,270,146 A * 12/1993 Tara .......................... G03F 7/11
430/259
2015/0221881 A1* 8/2015 Iwai .................. H01L 21/02118
257/40

FOREIGN PATENT DOCUMENTS

JP 2004-266197 A 9/2004
JP 2006-041317 A 2/2006
(Continued)

OTHER PUBLICATIONS

Machine translation of WO 2015/064603 (no date).*
(Continued)

*Primary Examiner* — Amanda C Walke
(74) *Attorney, Agent, or Firm* — Sughrue Mion, PLLC

(57) ABSTRACT

There is provided a laminate body which is capable of forming an excellent pattern on an organic semiconductor. A laminate body includes at least a water-soluble resin film and a resist film formed of a chemically amplified photosensitive resin composition on a surface of an organic semiconductor film in this order, in which the chemically amplified photosensitive resin composition contains a photoacid generator which is decomposed in an amount of 80% by mole or greater when exposed to light under the condition of 100 mJ/cm$^2$ or greater at a wavelength of 365 nm, a mask pattern is formed by an exposed portion being hardly soluble in a developer containing an organic solvent, and the formed mask pattern is used as an etching mask.

19 Claims, 1 Drawing Sheet

(51) Int. Cl.
  *G03F 7/039* (2006.01)
  *G03F 7/32* (2006.01)
  *G03F 7/038* (2006.01)

(52) U.S. Cl.
  CPC .......... *G03F 7/0382* (2013.01); *G03F 7/0392* (2013.01); *G03F 7/0397* (2013.01); *G03F 7/325* (2013.01)

(58) Field of Classification Search
  USPC ................................ 430/270.1, 271.1, 273.1
  See application file for complete search history.

(56) References Cited

FOREIGN PATENT DOCUMENTS

| JP | 2006-058497 A | 3/2006 | | |
|----|---------------|--------|---|---|
| JP | 2014-098889 A | 5/2014 | | |
| JP | WO 2015064603 A1 | * | 5/2015 | .......... H01L 51/448 |
| KR | 10-2012-0123224 A | 11/2012 | | |

OTHER PUBLICATIONS

International Preliminary Report on Patentability dated Mar. 3, 2016 from the International Bureau in counterpart International Application No. PCT/JP2014/071977.
International Search Report of PCT/JP2014/071977, dated Nov. 11, 2014. [PCT/ISA/210].
Written Opinion of PCT/JP2014/071977, dated Nov. 11, 2014. [PCT/ISA/237].
Extended European Search Report dated Sep. 6, 2016 from the European Patent Office in counterpart European Application No. 14838350.8.
Office Action dated Jun. 1, 2017 from the Korean Intellectual Property Office in counterpart Korean Application No. 10-2016-7004417.

* cited by examiner

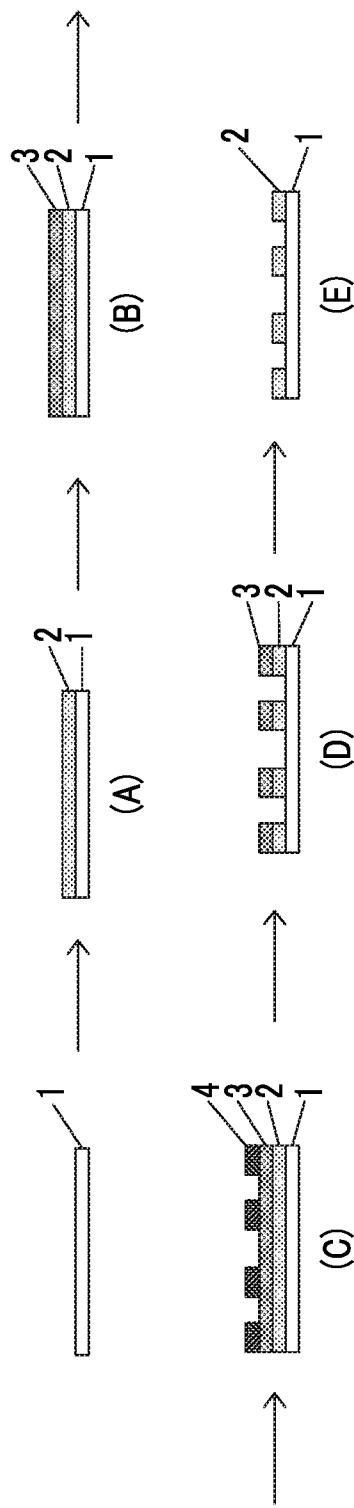

LAMINATE BODY

CROSS-REFERENCE TO RELATED APPLICATIONS

This application is a Continuation of PCT International Application No. PCT/JP2014/071977 filed on Aug. 22, 2014, which claims priority under 35 U.S.C §119(a) to Japanese Patent Application No. 2013-173374 filed on Aug. 23, 2013, Japanese Patent Application No. 2014-068595 filed on Mar. 28, 2014 and Japanese Patent Application No. 2014-168415 filed on Aug. 21, 2014. Each of the above application(s) is hereby expressly incorporated by reference, in its entirety, into the present application.

BACKGROUND OF THE INVENTION

1. Field of the Invention

The present invention relates to a laminate body and particularly relates to a laminate body of a resist composition.

2. Description of the Related Art

In recent years, electronic devices using an organic semiconductor have been widely used. An organic semiconductor has an advantage that it can be manufactured by a simpler process than that of a device using an inorganic semiconductor such as silicon of the related art. In addition, it is considered that material characteristics can be easily changed by changing the molecular structure, the variations of materials are abundant, and functions or elements which have not been obtained by an inorganic semiconductor can be realized. For example, an organic semiconductor can be applied to electronic devices such as an organic solar cell, an organic electroluminescence device, an organic light detector, an organic field effect transistor, an organic electroluminescence light emitting device, a gas sensor, an organic rectifier device, an organic inverter, and an information recording device.

Patterning of an organic semiconductor has been performed using printing technology, but there is a limit to fine processing when the patterning is performed using printing technology. Further, the organic semiconductor tends to be easily damaged.

JP2006-41317A discloses a method of patterning an organic semiconductor layer including: a process of forming an organic semiconductor layer; a process of laminating and forming a protective layer that protects the organic semiconductor layer from a mask layer on the organic semiconductor layer; a process of laminating and forming a mask layer having a predetermined pattern on the protective layer; and a process of patterning the protective layer and the organic semiconductor layer to have the same shape by performing etching that makes the mask layer into a mask, in which the protective layer is formed by an organic polymer compound or an insulating inorganic compound which is a material different from that of the mask layer and has hydrophilicity.

JP2004-266197A discloses that a photosensitive composition such as a photosensitive resin layer is formed on an organic semiconductor protective layer using a material which does not affect an organic semiconductor layer.

A method of the related art has a problem in that a mask layer remains as a protective layer after patterning is finished.

The present invention has been made to solve the above-described problem and an object thereof is to provide a laminate body which is capable of forming an excellent pattern.

SUMMARY OF THE INVENTION

As a result of intensive research, the present inventors found that patterning can be performed without damaging an organic semiconductor by forming a water-soluble resin film and a resist film formed of a chemically amplified photosensitive resin composition on one surface of an organic semiconductor in this order and performing etching after the resist film is patterned, thereby completing the present invention.

Specifically, the above-described problem has been solved by the following means <1> or preferably by <2> to <23>.

<1> A laminate body which includes at least a water-soluble resin film and a resist film formed of a chemically amplified photosensitive resin composition on a surface of an organic semiconductor film in this order, in which the chemically amplified photosensitive resin composition contains a photoacid generator which is decomposed in an amount of 80% by mole or greater when exposed to light under the condition of 100 mJ/cm$^2$ or greater at a wavelength of 365 nm, a mask pattern is formed by an exposed portion being hardly soluble in a developer containing an organic solvent, and the formed mask pattern is used as an etching mask.

<2> The laminate body according to <1>, in which the etching is dry etching.

<3> The laminate body according to <1>, in which the etching is wet etching.

<4> The laminate body according to any one of <1> to <3>, in which the sp value of a water-soluble resin of the water-soluble resin film is equal to or greater than 18 (MPa)$^{1/2}$ and less than 29 (MPa)$^{1/2}$.

<5> The laminate body according to any one of <1> to <3>, in which the sp value of a water-soluble resin of the water-soluble resin film is in a range of 20 (MPa)$^{1/2}$ to 26 (MPa)$^{1/2}$.

<6> The laminate body according to any one of <1> to <5>, in which the water-soluble resin of the water-soluble resin film is polyvinyl alcohol, polyvinylpyrrolidone, or a mixture of polyvinyl alcohol and polyvinylpyrrolidone.

<7> The laminate body according to any one of <1> to <5>, in which the water-soluble resin of the water-soluble resin film is polyvinylpyrrolidone.

<8> The laminate body according to any one of <1> to <7>, in which when the chemically amplified photosensitive resin composition is exposed to light under the condition of 100 mJ/cm$^2$ or greater at a wavelength of 365 nm, the polarity thereof is changed, and the chemically amplified photosensitive resin composition becomes hardly soluble in an organic solvent having an sp value of less than 18 (MPa)$^{1/2}$.

<9> The laminate body according to any one of <1> to <8>, in which the chemically amplified photosensitive resin composition includes a resin having a cyclic ether ester structure.

<10> The laminate body according to any one of <1> to <8>, in which the chemically amplified photosensitive resin composition includes a resin having a repeating unit that contains a group represented by the following Formula (11);

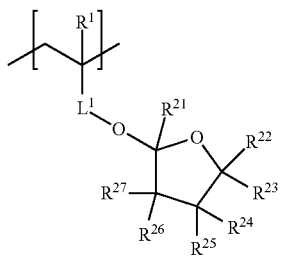

Formula (11)

in Formula (11), $R^1$ represents a hydrogen atom or an alkyl group, $L^1$ represents a carbonyl group or a phenylene group, and $R^{21}$ to $R^{27}$ each independently represent a hydrogen atom or an alkyl group.

<11> The laminate body according to any one of <1> to <10>, in which the chemically amplified photosensitive resin composition includes a resin having a repeating unit represented by the following Formula ($B^1$-1);

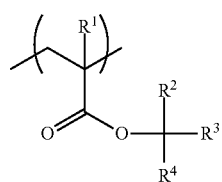

Formula ($B^1$-1)

in Formula ($B^1$-1), $R^1$ represents a hydrogen atom, an alkyl group, a cyano group, or a halogen atom; $R^2$ to $R^4$ each independently represent an alkyl group; and two of $R^2$ to $R^4$ may be bonded to each other to form a cyclic alkyl group.

<12> The laminate body according to any one of <1> to <11>, in which the chemically amplified photosensitive resin composition includes a resin having a repeating unit represented by the following Formula ($B^1$-2);

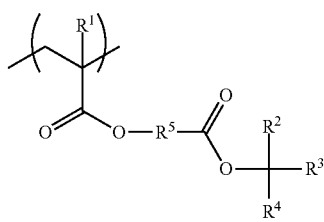

Formula ($B^1$-2)

in Formula ($B^1$-2), $R^1$ represents a hydrogen atom, an alkyl group, a cyano group, or a halogen atom; $R^2$ to $R^4$ each independently represent an alkyl group; two of $R^2$ to $R^4$ may be bonded to each other to form a cyclic alkyl group; and $R^5$ represents a divalent chain-like hydrocarbon group.

<13> The laminate body according to any one of <1> to <12>, in which the photoacid generator is a non-ionic photoacid generator which generates an acid having a pKa of −6 or less using irradiation with active rays or radiation and whose molar absorption coefficient at a wavelength of 365 nm is 4000 L/(mol·cm) or greater.

<14> The laminate body according to <13>, in which the non-ionic photoacid generator is a compound which includes a fluoroalkyl group having 2 or 3 carbon atoms and is a compound which generates a sulfonic acid including a fluoroalkyl group having 2 or 3 carbon atoms using irradiation with active rays and/or radiation.

<15> The laminate body according to <13> or <14>, in which the non-ionic photoacid generator is a compound represented by the following Formula (3);

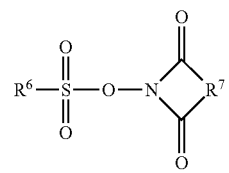

Formula (3)

in Formula (3), $R^6$ represents a fluoroalkyl group having 2 or 3 carbon atoms; and $R^7$ represents an alkylene group, an alkenylene group, or an arylene group.

<16> The laminate body according to any one of <13> to <15>, in which the non-ionic photoacid generator is a compound which includes a 5-membered ring imide sulfonate group.

<17> The laminate body according to <13> or <14>, in which the non-ionic photoacid generator is a compound represented by the following Formula (4);

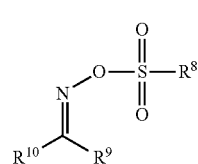

Formula (4)

in Formula (4), $R^8$ represents a fluoroalkyl group having 2 or 3 carbon atoms; $R^9$ represents an alkyl group having 1 to 8 carbon atoms or a fluoroalkyl group; and $R^{11}$ represents an aromatic hydrocarbon group or an aromatic heterocyclic group.

<18> The laminate body according to any one of <1> to <14>, in which the photoacid generator is a compound which includes an oxime sulfonate group.

<19> The laminate body according to any one of <1> to <18>, in which the chemically amplified photosensitive resin composition further includes a basic compound.

<20> The laminate body according to <19>, in which the basic compound is a primary amine compound.

<21> The laminate body according to any one of <1> to <8>, in which the chemically amplified photosensitive resin composition further includes a resin including a repeating unit represented by the following Formula ($B^1$-1) and/or a repeating unit represented by the following Formula ($B^1$-2), and a basic compound, and the photoacid generator is a non-ionic photoacid generator which generates an acid having a pKa of −6 or less using irradiation with active rays or radiation and whose molar absorption coefficient at a wavelength of 365 nm is 4000 L/(mol·cm) or greater;

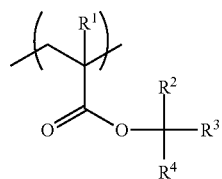

Formula (B¹-1)

in Formula (B¹-1), $R^1$ represents a hydrogen atom, an alkyl group, a cyano group, or a halogen atom; $R^2$ to $R^4$ each independently represent an alkyl group; and two of $R^2$ to $R^4$ may be bonded to each other to form a cyclic alkyl group;

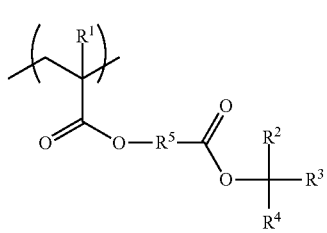

Formula (B¹-2)

in Formula (B¹-2), $R^1$ represents a hydrogen atom, an alkyl group, a cyano group, or a halogen atom; $R^2$ to $R^4$ each independently represent an alkyl group; two of $R^2$ to $R^4$ may be bonded to each other to form a cyclic alkyl group; and $R^5$ represents a divalent chain-like hydrocarbon group.

<22> The laminate body according to any one of <1> to <21>, in which the chemically amplified photosensitive resin composition is a negative type composition.

<23> The laminate body according to any one of <1> to <22>, further including a substrate on the opposite side of the organic semiconductor film to the side on which the water-soluble resin film is laminated.

According to the present invention, it is possible to provide a laminate body which is capable of forming an excellent pattern.

BRIEF DESCRIPTION OF THE DRAWING

FIG. 1 is a process view illustrating an example of a method of obtaining a substrate in which an organic semiconductor film is patterned.

DESCRIPTION OF THE PREFERRED EMBODIMENTS

The constituent elements in the present invention described below will be described based on representative embodiments of the present invention, but the present invention is not limited to such embodiments.

In regard to notation of a group (atomic group) in the present specification, in a case where it is not noted whether a group includes a substituent or not, it means that a group with a substituent and a group without a substituent are both included. For example, when an "alkyl group" is noted, an alkyl group without a substituent (unsubstituted alkyl group) as well as an alkyl group with a substituent (substituted alkyl group) are included.

In addition, "active rays" in the present specification mean, for example, a line spectrum of a mercury lamp, far-ultraviolet rays represented by an excimer laser, extreme ultraviolet rays (EUV light), X-rays, and electron beams. In addition, the light in the present invention indicates active rays or radiation. Further, "exposure to light" in the present specification, unless otherwise specified, includes not only exposure to a mercury lamp, far-ultraviolet rays represented by excimer light, X-rays, or EUV light but also drawings using particle beams such as electron beams or ion beams.

The numerical ranges expressed using "to" in the present specification indicate the ranges including the numerical values described before and after "to" as the lower limits and the upper limits.

Moreover, in the present specification, "(meth)acrylate" indicates both or one of acrylate and methacrylate, "(meth) acryl" indicates both or one of acryl and methacryl, and "(meth)acryloyl indicates both or one of acryloyl and methacryloyl.

"Processes" in the present specification include not only independent processes but also processes whose intended actions are achieved even in a case where the processes cannot be precisely distinguished from other processes.

The solid content concentration in the present specification indicates a weight percentage of a weight of other components from which a solvent is removed to the total weight of a composition. The solid content indicates a solid content at 25° C.

In the present specification, the weight average molecular weight is defined as a value obtained by GPC measurement in terms of polystyrene. In the present specification, a weight average molecular weight (Mw) and a number average molecular weight (Mn) can be acquired, for example, using an HLC-8220 (manufactured by TOSOH CORPORATION), and a TSKgel Super AWM-H (6.0 mm ID×15.0 cm manufactured by TOSOH CORPORATION) as a column. The measurement is carried out using 10 mmol/L lithium bromide NMP (N-methylpyrrolidinone) solution as an eluent unless otherwise noted.

<Laminate Body>

A laminate body of the present invention includes at least a water-soluble resin film (1) and a resist film formed of a chemically amplified photosensitive resin composition (2) on a surface of an organic semiconductor film in this order, in which the chemically amplified photosensitive resin composition (2) contains a photoacid generator which is decomposed in an amount of 80% by mole or greater when exposed to light under the condition of 100 mJ/cm² or greater at a wavelength of 365 nm, a mask pattern is formed by an exposed portion of the chemically amplified photosensitive resin composition being hardly soluble in a developer containing an organic solvent, and the formed mask pattern is used as an etching mask. Here, for example, etching may be dry etching or wet etching as described below.

When a normal resist film is formed on an organic semiconductor formed on a substrate and patterning is performed, the organic semiconductor is easily dissolved in an organic solvent contained in a resist and the organic semiconductor film is damaged.

On the contrary, in the present invention, a water-soluble resin film is formed on an organic semiconductor as a protective film and then a resist film is formed thereon. In this case, since the resist and the organic semiconductor are not in direct contact, it is possible to prevent the organic semiconductor from being damaged. In addition, since the resist film uses a chemically amplified photosensitive resin composition, long storage stability and fine pattern formability can be achieved.

Hereinafter, the present invention will be described in detail.

<<Organic Semiconductor Film>>

The organic semiconductor film used in the present invention indicates a film containing an organic material showing characteristics of a semiconductor. Similar to a case of a semiconductor formed of an inorganic material, there is a p-type organic semiconductor that conducts positive holes as a carrier and an n-type organic semiconductor that conducts electrons as a carrier. The flowability of a carrier in the organic semiconductor is expressed as a carrier mobility μ. Depending on the applications, the mobility is normally high, preferably $10^{-7}$ cm$^2$/Vs or greater, more preferably $10^{-6}$ cm$^2$/Vs or greater, and still more preferably $10^{-5}$ cm$^2$/Vs or greater. The mobility can be acquired by characteristics or a time-of-flight measurement (TOF) at the time of preparation of a field effect transistor (FET) element.

Typically, it is preferable that the organic semiconductor film is used by being formed on a substrate. That is, it is preferable that the substrate is formed on a surface which is the opposite side to a side on which the water-soluble resin film of the organic semiconductor film is laminated. As the substrate which can be used in the present invention, various materials, for example, silicon, quartz, ceramic, glass, a polyester film such as polyethylene naphthalene (PEN) or polyethylene terephthalate (PET), and a polyimide film can be used and any substrate may be selected according to the application thereof. For example, in a case where a flexible element is required, a flexible substrate can be used. Moreover, the thickness of the substrate is not particularly limited.

Any of an organic semiconductor material and an inorganic semiconductor material may be used as the p-type semiconductor material which can be used as long as the material shows hole transporting properties, preferred examples thereof include a p-type ic conjugated polymer (for example, substituted or unsubstituted polythiophene (for example, poly(3-hexylthiophene) (P3HT)), polyselenophene, polypyrrole, polyparaphenylene, polyparaphenylene vinylene, polythiophene vinylene, or polyaniline), a condensed polycyclic compound (for example, substituted or unsubstituted anthracene, tetracene, pentacene, anthrathiophene, or hexabenzocoronene), a triarylamine compound (for example, m-MTDATA, 2-TNATA, NPD, TPD, mCP, or CBP), a 5-membered heterocyclic compound (for example, a substituted or unsubstituted oligothiophene or TTF), a phthalocyanine compound (various substituted or unsubstituted central metals such as phthalocyanine, naphthalocyanine, anthracyanine, or tetrapyrazinoporphyrazine), a porphyrin compound (various substituted or unsubstituted central metals such as porphyrin), carbon nanotubes, a semiconductor polymer modified with carbon nanotubes, and graphene; more preferred examples thereof include a p-type π conjugated polymer, a condensed polycyclic compound, a triarylamine compound, a 5-membered heterocyclic compound, a phthalocyanine compound, and a porphyrin compound; and still more preferred examples thereof include a p-type π conjugated polymer.

Any of an organic semiconductor material and an inorganic semiconductor material may be used as the n-type semiconductor material which can be used as a semiconductor material as long as the material shows hole transporting properties, preferred examples thereof including a fullerene compound, an electron deficient phthalocyanine compound, a naphthalene tetracarbonyl compound, a perylene tetracarbonyl compound, a TCNQ compound, an n-type π conjugated polymer, and an n-type inorganic semiconductor; more preferred examples thereof including a fullerene compound, an electron deficient phthalocyanine compound, a naphthalene tetracarbonyl compound, a perylene tetracarbonyl compound, and a π conjugated polymer; and particularly preferred examples including a fullerene compound and a π conjugated polymer. In the present invention, a fullerene compound indicates a substituted or unsubstituted fullerene compound and any of $C_{60}$, $C_{70}$, $C_{76}$, $C_{78}$, $C_{80}$, $C_{82}$, $C_{84}$, $C_{86}$, $C_{88}$, $C_{90}$, $C_{96}$, $C_{116}$, $C_{180}$, $C_{240}$, and $C_{540}$ may be used as a fullerene. As the fullerene compound, substituted or unsubstituted $C_{60}$, $C_{70}$, or $C_{86}$ is preferable and PCBM ([6,6]-phenyl-$C_{61}$-butyric acid methyl ester) or an analog thereof (a compound obtained by substituting the $C_{60}$ portion with $C_{70}$ or $C_{86}$; a compound obtained by substituting the benzene ring substituent with another aromatic ring or a hetero ring; or a compound obtained by substituting methyl ester with n-butyl ester or i-butyl ester) is particularly preferable. Examples of electron deficient phthalocyanines include those formed by four or more electron withdrawing groups being bonded to various central metal atoms such as phthalocyanine ($F_{16}$MPc, FPc-S8, or the like), naphthalocyanine, anthracyanine, and substituted or unsubstituted tetrapyrazinoporphyrazine. The naphthalene tetracarbonyl compound is not particularly limited, and a naphthalene tetracarboxylic anhydride (NTCDA), a naphthalene bisimide compound (NTCDI), or a perinone pigment (Pigment Orange 43, Pigment Red 194, or the like) is preferable. The perylene tetracarbonyl compound is not particularly limited, and a perylene tetracarboxylic anhydride (PTCDA), a perylene bisimide compound (PTCDI), or a benzimidazole condensed ring (PV) is preferable. The TCNQ compound is substituted or unsubstituted TCNQ and a compound obtained by substituting a benzene ring portion of TCNQ with another aromatic ring or hetero ring and examples thereof include TCNQ, TCAQ, or TCN3T. Further, graphene may be exemplified. Particularly preferred examples of the n-type organic semiconductor materials are described below.

R in the formula is not particularly limited, and preferred examples thereof include a hydrogen atom, a substituted or unsubstituted branched or linear alkyl group (having preferably 1 to 18 carbon atoms, more preferably 1 to 12 carbon atoms, and still more preferably 1 to 8 carbon atoms), and a substituted or unsubstituted aryl group (having preferably 6 to 30 carbon atoms, more preferably 6 to 20 carbon atoms, and still more preferably 6 to 14 carbon atoms).

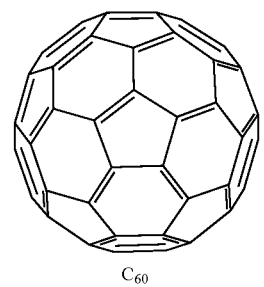

$C_{60}$

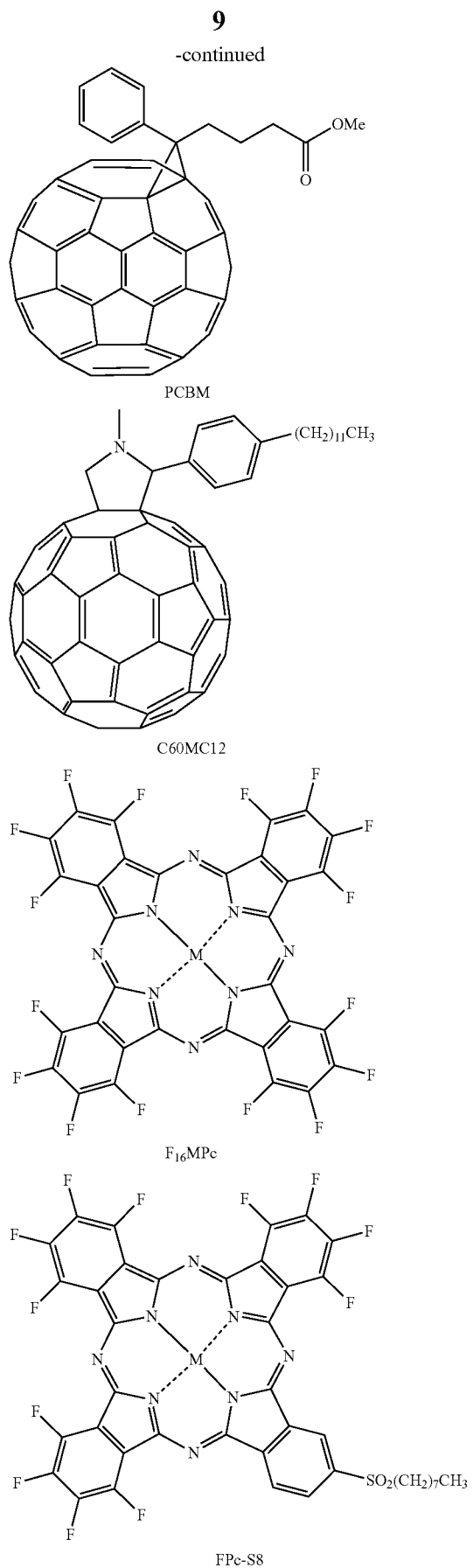
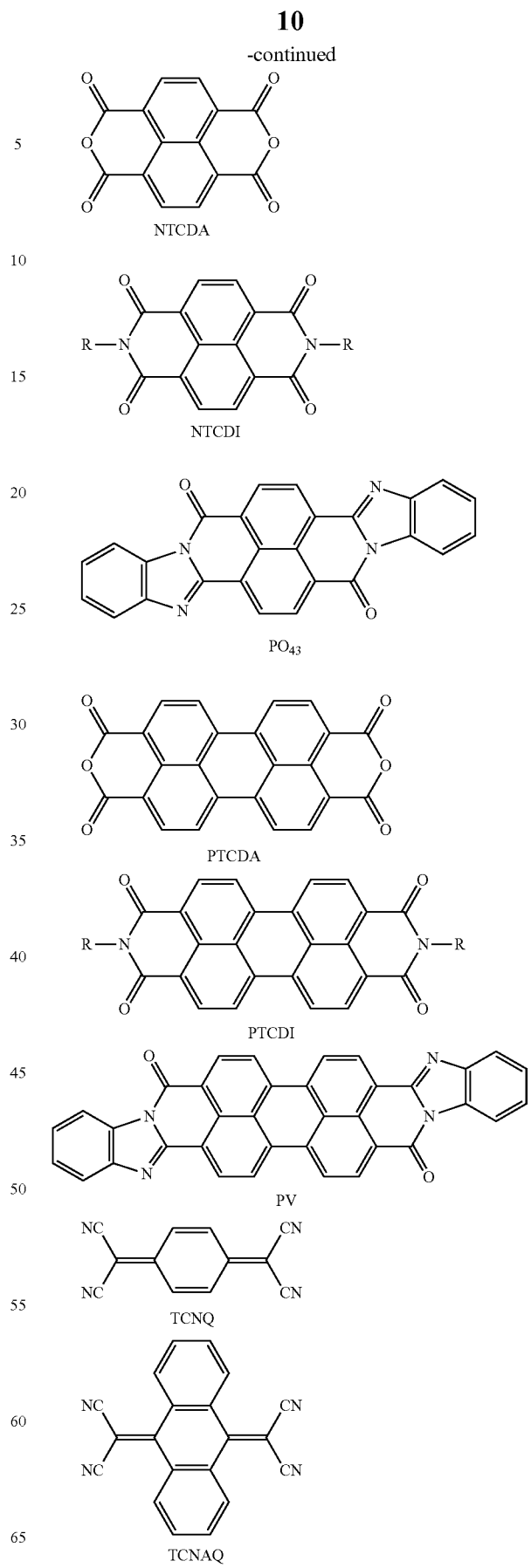

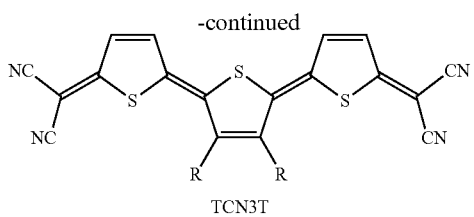

TCN3T

The above-described materials are used for film formation typically by being mixed with a solvent, being applied to have a layer form, and then being dried. As an application method, description of a water-soluble resin film described below can be referred to.

Examples of the solvent include a hydrocarbon-based solvent such as hexane, octane, decane, toluene, xylene, ethylbenzene, 1-methylnaphthalene, or 1,2-dichlorobenzene; a ketone-based solvent such as acetone, methyl ethyl ketone, methyl isobutyl ketone, or cyclohexanone; a halogenated hydrocarbon-based solvent such as dichloromethane, chloroform, tetrachloromethane, dichloroethane, trichloroethane, tetrachloroethane, chlorobenzene, dichlorobenzene, or chlorotoluene; an ester-based solvent such as ethyl acetate, butyl acetate, or amyl acetate; an alcohol-based solvent such as methanol, propanol, butanol, pentanol, hexanol, cyclohexanol, methyl cellosolve, ethyl cellosolve, or ethylene glycol; an ether-based solvent such as dibutyl ether, tetrahydrofuran, dioxane, or anisole; and a polar solvent such as N,N-dimethylformamide, N,N-dimethylacetamide, 1-methyl-2-pyrrolidone, 1-methyl-2-imidazolidinone, or dimethyl sulfoxide. These solvents may be used alone or in combination of two or more kinds thereof.

The proportion of the organic semiconductor in a composition (composition for forming an organic semiconductor) that forms the organic semiconductor film is preferably in a range of 0.1% by mass to 80% by mass and more preferably in a range of 0.1% by mass to 10% by mass, and a film having an arbitrary thickness can be formed using the composition.

Further, a resin binder may be mixed with the composition for forming an organic semiconductor. In this case, a material that forms a film and a binder resin are dissolved in the above-described suitable solvent or dispersed therein to make a coating solution, and then a thin film can be formed using various coating methods. Examples of the resin binder include an insulating polymer such as polystyrene, polycarbonate, polyarylene, polyester, polyamide, polyimide, polyurethane, polysiloxane, polysulfone, polymethyl methacrylate, polymethyl acrylate, cellulose, polyethylene, or polypropylene and a copolymer of these; a photoconductive polymer such as polyvinyl carbazole or polysilane; and a conductive polymer such as polythiophene, polypyrrole, polyaniline, or polyparaphenylene vinylene. These resin binders may be used alone or in combination of two or more kinds thereof. When mechanical strength of a thin film is considered, a resin binder having a high glass transition temperature is preferable. Further, when charge mobility is considered, a resin binder having a structure not containing a polar group, a photoconductive polymer, or a conductive polymer is preferable.

In a case where a resin binder is to be mixed in, the amount to be mixed in is preferably in a range of 0.1% by mass to 30% by mass in a film such as an organic semiconductor film.

According to the application thereof, a mixed solution to which a single or various semiconductor materials or additives are added may be applied to form a film blend formed of a plurality of materials. For example, in a case where a photoelectric conversion layer is prepared, a solution into which another semiconductor material is mixed can be used.

Moreover, at the time of film formation, a substrate may be heated or cooled, and the film quality or packing of molecules in the film can be controlled by changing the temperature of the substrate. The temperature of the substrate, which is not particularly limited, is preferably in a range of $-200°$ C. to $400°$ C., more preferably in a range of $-100°$ C. to $300°$ C., and still more preferably in a range of $0°$ C. to $200°$ C.

The characteristics of the formed organic semiconductor film can be adjusted by carrying out a post-treatment. For example, the characteristics can be improved by changing a morphology of the film or a packing of molecules of the film through exposure to a heat treatment or solvent vapor. In addition, when the film is exposed to a gas, a solvent, or a material having oxidizability or reducibility or an oxidation or a reduction reaction is caused due to these being mixed in, and the carrier density can then be adjusted.

The film thickness of the organic semiconductor film is not particularly limited and varies depending on the kind of an electronic device to be used. The film thickness thereof is preferably in a range of 5 nm to 50 µm, more preferably in a range of 10 nm to 5 µm, and still more preferably in a range of 20 nm to 500 nm.

<<Water-Soluble Resin Film>>

The water-soluble resin film is formed by applying a water-soluble resin composition containing a water-soluble resin to an organic semiconductor film and drying the organic semiconductor film. The water-soluble resin in the present invention indicates a resin whose solubility in water at $20°$ C. is 1% or greater.

The water-soluble resin film is unlikely to dissolve in a developer containing an organic solvent and needs to be dissolved in water. For this reason, the sp value (solubility parameter) of the water-soluble resin of the water-soluble resin film is preferably 18 $(MPa)^{1/2}$ to less than 29 $(MPa)^{1/2}$, more preferably 18.5 $(MPa)^{1/2}$ to less than 29 $(MPa)^{1/2}$, still more preferably 19 $(MPa)^{1/2}$ to less than 28 $(MPa)^{1/2}$, even sill more preferably 19.5 $(MPa)^{1/2}$ to 27 $(MPa)^{1/2}$, and particularly preferably 20 $(MPa)^{1/2}$ to 26 $(MPa)^{1/2}$. The sp value is a value calculated by a Hoy method and the Hoy method is described in "POLYMER HANDBOOK FOURTH EDITION".

Further, the water-soluble resin composition may contain two or more kinds of water-soluble resin. In this case, it is preferable that each of the two or more kinds of water-soluble resin are in the above-described ranges.

Examples of the water-soluble resin used in the present invention include polyvinylpyrrolidone, water-soluble polysaccharides (water-soluble cellulose, methyl cellulose, hydroxyethyl cellulose, hydroxypropyl cellulose, hydroxyethyl methyl cellulose, or hydroxypropyl methyl cellulose), pullulan or a pullulan derivative, starch, hydroxypropyl starch, carboxymethyl starch, chitosan, and cyclodextrin), polyvinyl alcohol, polyethylene oxide, and polyethyl oxazoline. Among these, polyvinylpyrrolidone, polyvinyl alcohol, or pullulan is preferable. It is preferable that the water-soluble resin includes polyvinylpyrrolidone, polyvinyl alcohol, or a mixture of polyvinylpyrrolidone and polyvinyl alcohol.

In addition, two or more kinds having main chain-like structures different from each other may be selected from among these and then used or used as a copolymer.

In a case where polyvinyl alcohol is used as a water-soluble resin, the saponification degree is preferably in a range of 70% by mole to 95% by mole and more preferably in a range of 80% by mole to 90% by mole.

The weight average molecular weight of the water-soluble resin that forms the water-soluble resin film used in the present invention is preferably in a range of 500 to 1,000,000, more preferably 2,000 to 800,000, and still more preferably 3,000 to 700,000 in terms of polystyrene according to the GPC method.

The weight average molecular weight can be suitably selected according to a substrate on which processing is performed. When the weight average molecular weight is in the above-described range, conformability with respect to an organic semiconductor substrate with differences in level can be further improved and occurrence of cracks on a film surface can be further minimized.

In addition, two or more water-soluble resins whose weight average molecular weights are different from each other may be selected and then used.

A water-soluble resin having a degree of dispersion (molecular weight distribution) of typically in a range of 1.0 to 3.0 and preferably in a range of 1.0 to 2.6 is preferably used.

It is preferable that the water-soluble resin composition that forms the water-soluble resin film used in the present invention contains a solvent.

In the water-soluble resin composition, it is preferable that arbitrary components of a water-soluble resin and various additives are dissolved in a solvent and that a solution is prepared.

As the solvent to be used for the water-soluble resin composition, known solvents other than water can be used and alcohols can be exemplified.

Examples of the solvent which are used for the water-soluble resin composition include (1) primary alcohols such as methanol, ethanol, 1-propanol, 1-butanol, 1-pentanol, 3-methyl-1-butanol, 1-hexanone, 4-methyl-1-pentanol, 1-heptanol, 5-methyl-1-hexanol, 1-octanol, 6-methyl-1-heptanol, 1-nonanone, and 1-decanol; (2) secondary alcohols such as 2-propanol, 2-butanol, 2-pentanol, 2-hexanol, 2-heptanol, 2-octanol, 2-nonanol, and 2-decanol; (3) tertiary alcohols such as t-butanol, t-amyl alcohol, 2,3-dimethyl-2-butanol, 2-methyl-2-pentanol, 3-methyl-3-pentanol, 3-ethyl-3-pentanol, 3-ethyl-2-methyl-3-pentanol, 2,3-dimethyl-3-pentanol, 2,3-dimethyl-3-pentanol, 2,3,4-trimethyl-3-pentanol, and 3,4,4-trimethyl-3-pentanol; (4) ethylene glycol monoalkyl ethers such as ethylene glycol monomethyl ether, ethylene glycol monoethyl ether, ethylene glycol monopropyl ether, and ethylene glycol monobutyl ether; and (5) propylene glycol monoalkyl ethers such as propylene glycol monomethyl ether, propylene glycol monoethyl ether, propylene glycol monopropyl ether, and propylene glycol monobutyl ether.

Among the above-described solvents, at least one from among water, primary alcohols, and secondary alcohols is preferable and at least one of water and 2-propanol is more preferable.

The solvent can be used alone or in a mixture of two or more kinds thereof.

As a method of applying the water-soluble resin composition, coating is preferable. Examples of the application method include a casting method, a blade coating method, a wire bar coating method, a spray coating method, a dipping (immersion) coating method, a bead coating method, an air knife coating method, a curtain coating method, an ink-jet method, a spin coating method, and a Langmuir-Blodgett (LB) method. In the present invention, a casting method, a spin coating method, or an ink-jet method is more preferable. When such a process is carried out, it is possible to produce a film such as an organic semiconductor film whose surface is flat and which has a large area at a low cost.

The solid content concentration of the water-soluble resin composition is preferably in a range of 0.5% by mass to 45% by mass, more preferably in a range of 1.0% by mass to 40% by mass, and still more preferably in a range of 2.0% by mass to 35% by mass. When the solid content concentration is adjusted to be in the above-described range, the composition can be uniformly applied.

It is preferable that the water-soluble resin composition contains a surfactant for the purpose of further improving coating properties.

Any of a non-ionic surfactant, an anionic surfactant, and an amphoteric fluorine-based surfactant may be used as a surfactant as long as surface tension can be decreased. Examples of the surfactant include non-ionic surfactants, for example, polyoxyethylene alkyl ethers such as polyoxyethylene lauryl ether, polyoxyethylene cetyl ether, and polyoxyethylene stearyl ether; polyoxyethylene alkyl allyl ethers such as polyoxyethylene octylphenyl ether and polyoxyethylene nonylphenyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; monoglyceride alkyl esters such as glycerol monostearate and glycerol monooleate; an oligomer containing fluorine or silicon; acetylene glycol; and an ethylene oxide adduct of acetylene glycol; anionic surfactants, for example, alkylbenzene sulfonates such as sodium dodecylbenzene sulfonate; alkylnaphthalene sulfonates such as sodium butylnaphthalene sulfonate, sodium pentylnaphthalene sulfonate, sodium hexylnaphthalene sulfonate, and sodium octylnaphthalene sulfonate; alkyl sulfates such as sodium lauryl sulfate; alkyl sulfonates such as sodium dodecyl sulfonate; and sulfosuccinates such as sodium dilauryl sulfosuccinate; and amphoteric surfactants, for example, alkyl betaines such as lauryl betaine and stearyl betaine; and amino acids. A non-ionic surfactant which has a small content of metal ions affecting electrical characteristics of an organic semiconductor, has excellent defoaming properties, and has an acetylene skeleton represented by the following Formula (1) is particularly preferable.

$$R^1\text{—}C\text{=}C\text{—}R^2 \quad (1)$$

In Formula (1), $R^1$ and $R^2$ each independently represent an alkyl group which may include a substituent and has 3 to 15 carbon atoms, an aromatic hydrocarbon group which may include a substituent and has 6 to 15 carbon atoms, or a heterocyclic aromatic group which may include a substituent and has 4 to 15 carbon atoms (examples of the substituent include an alkyl group having 1 to 20 carbon atoms, an aromatic hydrocarbon group having 6 to 15 carbon atoms, an aralkyl group having 7 to 17 carbon atoms, an alkoxy group having 1 to 20 carbon atoms, an alkoxycarbonyl group having 2 to 20 carbon atoms, or an acyl group having 2 to 15 carbon atoms).

In a case where the water-soluble resin composition contains a surfactant, the amount of the surfactant to be added is preferably in a range of 0.05% by mass to 8% by mass, more preferably in a range of 0.07% by mass to 5% by mass, and particularly preferably in a range of 0.1% by mass to 3% by mass when a water-soluble resin film is obtained.

These surfactants may be used alone or in combination of two or more kinds thereof.

The water-soluble resin composition may contain a plasticizer used to improve the mechanical strength of a film. Particularly, when a plasticizer is mixed in a case where the water-soluble resin film needs to have a film thickness of 2 μm or greater, generation of cracks can be more effectively prevented.

Examples of the plasticizer which can be used include polyethylene oxide, polypropylene oxide, a glycol, propylene glycol, polyethylene glycol, a polyvalent alcohol, glycerin, sorbitol, a glycerol ester, glycerol triacetate, a fatty acid triglyceride, and a combination of these. Particularly, glycerin having excellent compatibility with a water-soluble resin is preferable.

The film thickness of the water-soluble resin film is preferably in a range of 20 nm to 10 μm and more preferably in a range of 100 nm to 5 μm. The film thickness can be suitably selected according to the film thickness of an organic semiconductor on which processing is performed. The time for etching can be shortened as the film thickness of the water-soluble resin film becomes smaller, but the water-soluble resin film is lost before etching of the organic semiconductor is completed in a case where the film thickness of the organic semiconductor is large. For this reason, the organic semiconductor cannot be satisfactorily processed. The time for etching becomes longer as the film thickness of the water-soluble resin becomes larger, but the organic semiconductor can be satisfactorily processed even when the film thickness of the organic semiconductor is large.

The above-described film thickness can be obtained by setting the solid content concentration in the water-soluble resin composition to be in an appropriate range for a suitable viscosity and improving the coating properties and film forming properties.

<<Chemically Amplified Photosensitive Resin Composition>>

The photosensitive resin composition used in the present invention is a chemically amplified photosensitive resin composition. By allowing the photosensitive resin composition to be a chemically amplified type, long storage stability and fine pattern forming properties can be achieved.

In the present invention, when the chemically amplified photosensitive resin composition (hereinafter, also simply referred to as a "photosensitive resin composition") is exposed to light under the condition of 100 mJ/cm$^2$ or greater at a wavelength of 365 nm, the polarity thereof is changed. The chemically amplified photosensitive resin composition becomes hardly soluble in an organic solvent having an sp value of preferably less than 19 (MPa)$^{1/2}$, more preferably 18.5 (MPa)$^{1/2}$ or less, and still more preferably 18.0 (MPa)$^{1/2}$ or less. In addition, it is more preferable that the polarity thereof is changed as described above by the photosensitive resin composition being exposed to light under the condition of 100 mJ/cm$^2$ to 200 mJ/cm$^2$ at a wavelength of 365 nm.

Since a finer trench hole pattern can be formed and thus particularly good effects can be obtained, it is preferable that the photosensitive resin composition used in the present invention is a negative type resist composition.

It is preferable that the photosensitive resin composition used in the present invention contains at least a resin (hereinafter, referred to as a "specific resin A") which can be developed by a developer containing an organic solvent and a photoacid generator (hereinafter, also referred to as a "specific photoacid generator") which is decomposed in an amount of 80% by mole or greater when exposed to light under the condition of 100 mJ/cm$^2$ or greater at a wavelength of 365 nm. With the photosensitive resin composition in the present invention, generation of a residue at the time of development is prevented and a resist film having a surface with excellent smoothness can be formed.

Here, the "residue" in the present invention indicates a residue existing on the peripheral edge of the end portion of a pattern-like resist film when the pattern-like resist film is formed using the photosensitive resin composition.

Specific Resin A

The specific resin A used in the present invention is a resin component constituting the chemically amplified photosensitive resin composition, is typically a resin that includes a repeating unit containing a group dissociated by an acid, and may include another repeating unit.

For example, it is preferable that the specific resin A includes an acid decomposable repeating unit (repeating unit that includes a group dissociated by an acid) and is a resin whose dissolution rate in a developer containing an organic solvent is decreased by an action of an acid.

In the present invention, it is preferable that the specific resin A is a resin which becomes soluble in an organic solvent having an sp value of 18.0 (MPa)$^{1/2}$ or less and which becomes hardly soluble in an organic solvent having an sp value of 18.0 (MPa)$^{1/2}$ or less when a tetrahydrofuranyl group (hereinafter, also referred to as a "specific acid decomposable group") in a constituent unit represented by Formula (1) is decomposed or dissociated.

Here, the expression "soluble in an organic solvent having an sp value of 18.0 (MPa)$^{1/2}$ or less" in the present invention means that the dissolution rate of a coating film (thickness: 1 μm) of the specific resin A, in butyl acetate at 23° C., which is formed by coating a substrate with a solution of the specific resin A and heating the substrate at 100° C. for 1 minute is 20 nm/sec or greater. In addition, the expression "hardly soluble in an organic solvent having an sp value of 18.0 (MPa)$^{1/2}$ or less" means that the dissolution rate of a coating film (thickness: 1 μm) of the specific resin A, in butyl acetate at 23° C., which is formed by coating a substrate with a solution of the specific resin A and heating the substrate at 100° C. for 1 minute is less than 10 nm/sec.

The dissolution rate of the specific resin A in the present invention in an inorganic solvent having an sp value of 18.0 (MPa)$^{1/2}$ or less is more preferably 40 nm/sec or greater. In addition, when the specific acid decomposable group of the specific resin A is decomposed, the dissolution rate thereof in an inorganic solvent having an sp value of 18.0 (MPa)$^{1/2}$ or less is preferably less than 1 nm/sec.

It is preferable that the specific resin A in the present invention is an acrylic polymer.

The "acrylic polymer" in the present invention is an addition polymerization type resin and is a polymer including a constituent unit derived from (meth)acrylic acid and/or an ester thereof. Further, the acrylic polymer may include a constituent unit other than the constituent unit derived from (meth)acrylic acid and/or an ester thereof, for example, a constituent unit derived from styrenes or a constituent unit derived from a vinyl compound.

It is preferable that the specific resin A includes 50% by mole or greater of the constituent unit derived from (meth)acrylic acid and/or an ester thereof, and more preferable that the specific resin A includes 80% by mole or greater of the constituent unit with respect to the total constituent units in a polymer, and particularly preferable that the specific resin A is a polymer formed only of the constituent unit derived from (meth)acrylic acid and/or an ester thereof.

In addition, "the constituent unit derived from (meth)acrylic acid and/or an ester thereof" is also referred to as an "acrylic constituent unit". Further, (meth)acrylic acid is a general term for methacrylic acid and acrylic acid.

Repeating Unit (a1)

The specific resin A used in the present invention normally includes a repeating unit (a1) containing a group dissociated by an acid. As a preferred example of the group dissociated by an acid, a group represented by the following Formula (1) is exemplified.

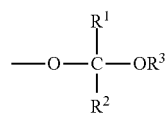
(1)

In Formula (1), $R^1$ and $R^2$ each independently represent a hydrogen atom or a linear, branched, or cyclic alkyl group which may be substituted. At this time, a case where both of $R^1$ and $R^2$ represent a hydrogen atom is excluded.

$R^3$ represents a linear, branched, or cyclic alkyl group which may be substituted or an aralkyl group which may be substituted.

$R^1$ and $R^3$ may be linked to each other to form a cyclic ether.

In Formula (1), the number of carbon atoms of a linear or branched alkyl group as $R^1$ or $R^2$ is preferably in a range of 1 to 6. As a substituent, an alkoxy group having 1 to 6 carbon atoms or a halogen atom is preferable.

The number of carbon atoms of a cyclic alkyl group as $R^1$ or $R^2$ is preferably in a range of 3 to 6. As a substituent, an alkyl group having 1 to 6 carbon atoms, an alkoxy group having 1 to 6 carbon atoms, or a halogen atom is preferable.

The number of carbon atoms of a linear or branched alkyl group as $R^3$ is preferably in a range of 1 to 10. As a substituent, an alkoxy group having 1 to 6 carbon atoms or a halogen atom is preferable.

The number of carbon atoms of a cyclic alkyl group as $R^3$ is preferably in a range of 3 to 10. As a substituent, an alkyl group having 1 to 6 carbon atoms, an alkoxy group having 1 to 6 carbon atoms, or a halogen atom is preferable.

The number of carbon atoms of an aralkyl group as $R^3$ is preferably in a range of 7 to 10. As a substituent, an alkyl group having 1 to 6 carbon atoms, an alkoxy group having 1 to 6 carbon atoms, or a halogen atom is preferable.

In the case where $R^1$ and $R^3$ are linked to each other to form a cyclic ether, it is preferable that an alkylene chain having 2 to 5 carbon atoms is formed by $R^1$ and $R^3$ being linked to each other.

As a constituent unit having an acid dissociable group represented by Formula (1), a constituent unit in which a phenolic hydroxyl group of hydroxystyrene or novolac is protected by an acetal group is exemplified. As one of preferred constituent units, a constituent unit having an acid dissociable group represented by the following Formula (2) is exemplified, and examples thereof include 1-alkoxyalkoxystyrene, 1-(haloalkoxy)alkoxystyrene, 1-(aralkyloxy)alkoxystyrene, and tetrahydropyranyloxystyrene. Among these, 1-alkoxyalkoxystyrene or tetrahydropyranyloxystyrene is more preferable and 1-alkoxyalkoxystyrene is particularly preferable.

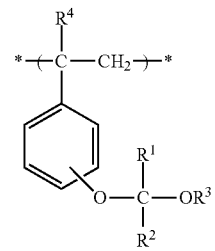
(2)

In Formula (2), $R^1$ and $R^2$ each independently represent a hydrogen atom or a linear, branched, or cyclic alkyl group which may be substituted. At this time, a case where both of $R^1$ and $R^2$ represent a hydrogen atom is excluded.

$R^3$ represents a linear, branched, or cyclic alkyl group which may be substituted or an aralkyl group which may be substituted.

$R^1$ and $R^3$ may be linked to each other to form a cyclic ether.

$R^4$ represents a hydrogen atom or a methyl group.

In Formula (2), $R^1$ to $R^3$ have the same definitions as those for $R^1$ to $R^3$ in Formula (1).

A constituent unit represented by Formula (2) may include a substituent such as an alkyl group or an alkoxy group on a benzene ring.

As another preferred example of a constituent unit having an acid dissociable group represented by Formula (1), a repeating unit represented by the following Formula (1-1) is exemplified.

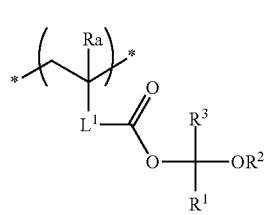
(1-1)

In Formula (1-1), $R^1$ represents an alkyl group, $R^2$ represents an alkyl group, and $R^3$ represents a hydrogen atom or an alkyl group. $R^1$ and $R^2$ may be linked to each other to form a ring.

Ra represents a hydrogen atom, an alkyl group, a cyano group, or a halogen atom.

$L^1$ represents a single bond or a divalent linking group.

In Formula (1-1), an alkyl group as $R^1$ may be linear, branched, or cyclic. The linear or branched alkyl group may include a substituent, and the number of carbon atoms thereof is preferably in a range of 1 to 20 and more preferably in a range of 1 to 10. Specific examples of the linear or branched alkyl group as $R^1$ include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group. It is preferable that the alkyl group as $R^1$ is a methyl group, an ethyl group, a propyl group, an isopropyl group, an n-butyl group, a sec-butyl group, a t-butyl group, or a neopentyl group.

In Formula (1-1), the cyclic alkyl group as $R^1$ may include a substituent and may be a monocyclic type group or a polycyclic type group. The number of carbon atoms thereof is preferably in a range of 3 to 20 and more preferably in a range of 3 to 10. Specific examples of the cyclic alkyl group as $R^1$ include a cyclopropyl group, a cyclobutyl group, a cyclopentyl group, a cyclohexyl group, a cyloheptyl group, a cyclooctyl group, a decahydronaphthyl group, a cyclodecyl group, a 1-adamantyl group, a 2-adamantyl group, a 1-norbornyl group, and a 2-norbornyl group. Among these, a cyclopropyl group, a cyclopentyl group, a cyclohexyl group, or a 1-adamantyl group is preferable.

As a substituent which can be included in the linear or branched alkyl group as $R^1$, a cyclic alkyl group, an aryl group, an alkoxy group, an aryloxy group, an acyl group, or a halogen atom (for example, a fluorine atom or a chlorine atoms) is exemplified.

Further, specific examples and preferred examples of the cyclic alkyl group as a substituent which can be included in the linear or branched alkyl group as $R^1$ are the same as the specific examples and preferred examples described above as the cyclic alkyl group as $R^1$.

Examples of the substituent which can be included in the cyclic alkyl group as $R^1$ include an alkyl group, an aryl group, an alkoxy group, an aryloxy group, an acyl group, and a halogen atom.

Specific examples and preferred examples of an alkyl group as the substituent which can be included in the cyclic alkyl group as $R^1$ are the same as the specific examples and preferred examples described above as the linear or branched alkyl group as $R^1$.

The aryl group as the substituent which can be included in the alkyl group as $R^1$ is preferably an aryl group having 6 to 15 carbon atoms and more preferably an aryl group having 6 to 12 carbon atoms, and has a structure (for example, a biphenyl group or a terphenyl group) in which a plurality of aromatic rings are connected to each other through a single bond. Specific examples of the aryl group as the substituent which can be included in the alkyl group as $R^1$ include a phenyl group, a naphthyl group, an anthranyl group, a biphenyl group, and a terphenyl group. Preferred examples of the aryl group as the substituent which can be included in the alkyl group as $R^1$ include a phenyl group, a naphthyl group, and a biphenyl group.

Examples of an alkyl group portion of the alkoxy group as the substituent which can be included in the alkyl group as $R^1$ include the same as those exemplified as the alkyl group of $R^1$ in Formula (1-1). Particularly preferred examples of the alkoxy group include a methoxy group, an ethoxy group, an n-propoxy group, and an n-butoxy group.

Examples of an aryl group portion of the aryloxy group as the substituent which can be included in the alkyl group as $R^1$ include the same as those exemplified above as the aryl group.

Examples of an acyl group as the substituent which can be included in the alkyl group or a cycloalkyl group as $R^1$ include a linear or branched acyl group having 2 to 12 carbon atoms such as an acetyl group, a propionyl group, an n-butanoyl group, an i-butanoyl group, an n-heptanoyl group, a 2-methylbutanoyl group, a 1-methylbutanoyl group, or a t-heptanoyl group.

In Formula (1-1), an alkyl group as $R^2$ may be linear, branched, or cyclic. The linear or branched alkyl group may include a substituent, and the number of carbon atoms thereof is preferably in a range of 1 to 30 and more preferably in a range of 1 to 20. Specific examples of the linear or branched alkyl group as $R^2$ include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group. It is preferable that the alkyl group as $R^2$ is a methyl group, an ethyl group, a propyl group, an isopropyl group, an n-butyl group, a sec-butyl group, a t-butyl group, or a neopentyl group.

The cyclic alkyl group as $R^2$ may include a substituent and may be a monocyclic type group or a polycyclic type group. The number of carbon atoms thereof is preferably in a range of 3 to 30 and more preferably in a range of 3 to 20. Specific examples of the cyclic alkyl group as $R^2$ include a cyclopropyl group, a cyclobutyl group, a cyclopentyl group, a cyclohexyl group, a cyloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, an 8-tricyclo[5.2.1.0$^{2,6}$]decyl group, and a 2-bicylo[2.2.1]heptyl group. Among these, a cyclopentyl group, a cyclohexyl group, a 2-adamantyl group, an 8-tricyclo[5.2.1.0$^{2,6}$]decyl group, and a 2-bicylo[2.2.1]heptyl group are preferable.

As a substituent which can be included in the linear or branched alkyl group as $R^2$, a cyclic alkyl group, an aryl group, a heterocyclic group, an alkoxy group, an aryloxy group, an acyloxy group, or a halogen atom (for example, a fluorine atom or a chlorine atoms) is exemplified.

Further, specific examples and preferred examples of the cyclic alkyl group as a substituent which can be included in the linear or branched alkyl group as $R^2$ are the same as the specific examples and preferred examples described above as the cyclic alkyl group as $R^2$.

Examples of the substituent which can be included in the cyclic alkyl group as $R^2$ include an alkyl group, an aryl group, a heterocyclic group, an alkoxy group, an aryloxy group, an acyloxy group, and a halogen atom (for example, a fluorine atom or a chlorine atom).

Specific examples and preferred examples of an alkyl group as the substituent which can be included in the cyclic alkyl group as $R^2$ are the same as the specific examples and preferred examples described above as the alkyl group as $R^1$.

Examples of the aryl group as the substituent which can be included in the alkyl group as $R^2$ include the same as those exemplified above as the substituent which can be included in the alkyl group as $R^1$.

The heterocyclic group as $R^2$ is preferably a heterocyclic group having 6 to 20 carbon atoms and more preferably a heterocyclic group having 6 to 12 carbon atoms. Specific examples of the heterocyclic ring as $R^2$ include a pyridyl group, a pyrazyl group, a tetrahydrofuranyl group, a tetrahydropyranyl group, a tetrahydrothiophene group, a pyperidyl group, a piperazyl group, a furanyl group, a pyranyl group, and a chromanyl group.

Examples of an alkyl group portion of the alkoxy group as the substituent which can be included in the alkyl group as $R^2$ include as those exemplified as the alkyl group as $R^1$. As the alkoxy group, a methoxy group, an ethoxy group, an n-propoxy group, or an n-butoxy group is particularly preferable.

Examples of an aryl group portion of the aryloxy group as the substituent which can be included in the alkyl group as $R^2$ include as those exemplified as the aryl group described above.

Examples of the acyloxy group as the substituent which can be included in the alkyl group as $R^2$ include a linear or branched acyloxy group having 2 to 12 carbon atoms such as an acetyloxy group, a propionyloxy group, an n-butanoyloxy group, an i-butanoyloxy group, an n-heptanoyloxy group, a 2-methylbutanoyloxy group, a 1-methylbutanoyloxy group, or a t-heptanoyloxy group.

In Formula (1-1), $R^1$ and $R^2$ may be linked to each other to form a ring. The formed ring may include a substituent.

It is preferable that a 5- or 6-membered ring is formed and more preferable that a tetrahydrofuranyl ring or a tetrahydropyranyl group is formed.

In Formula (1-1), the number of carbon atoms of an alkyl group as $R^3$ is preferably in a range of 1 to 10, more preferably in a range of 1 to 5, still more preferably in a range of 1 to 3, and still more preferably 1 or 2 (that is, a methyl group or an ethyl group). Specific examples of the alkyl group include a methyl group, an ethyl group, an n-propyl group, an isopropyl group, an n-butyl group, an isobutyl group, a sec-butyl group, and a t-butyl group.

It is preferable that $R^3$ represents a hydrogen atom or an alkyl group having 1 to 5 carbon atoms, more preferable that $R^3$ represents a hydrogen atom or an alkyl group having 1 to 3 carbon atoms, still more preferable that $R^3$ represents a hydrogen atom or a methyl group, and particularly preferable that $R^3$ represents a hydrogen atom.

The alkyl group as Ra may include a substituent and is preferably an alkyl group having 1 to 4 carbon atoms.

Preferred examples of the substituent which may be included in the alkyl group as Ra include a hydroxyl group and a halogen atom.

Examples of the halogen atom as Ra include a fluorine atom, a chlorine atom, a bromine atom, and an iodine atom.

As Ra, a methyl group, a hydroxymethyl group, or a perfluoroalkyl group having 1 to 4 carbon atoms (for example, a trifluoromethyl group) is preferable and a methyl group is particularly preferable from viewpoints of improving a glass transition point (Tg) of a specific resin (A) and improving resolving power and space width roughness.

At this time, in a case where $L^1$ represents a phenylene group, it is preferable that Ra represents a hydrogen atom.

As the divalent linking group as $L^1$, an alkylene group, a divalent aromatic ring group, —COO-$L^{11}$-, —O-$L^{11}$-, or a group obtained by combining two or more of these is exemplified. Here, $L^{11}$ represents an alkylene group, a divalent aromatic ring group, or a group obtained by combining an alkylene group and a divalent aromatic ring group.

As the divalent aromatic ring group, a phenylene group such as a 1,4-phenylene group, a 1,3-phenylene group, or a 1,2-phenylene group; or a 1,4-naphthylene group is preferable and a 1,4-phenylene group is more preferable.

It is preferable that $L^1$ represents a single bond, a group represented by —COO-$L^a$-, or a group represented by -$L^{12}$-O—CH$_2$— and particularly preferable that $L_1$ represents a single bond. Here, $L^{12}$ represents a divalent aromatic ring group.

In a case where the alkylene group as $L^{11}$ is a cyclic alkylene group, the alkylene group contains an ester bond and may form a lactone ring. It is preferable that $L^{11}$ represents an alkylene group which has 1 to 9 carbon atoms and may contain a heteroatom or a carbonyl bond and more preferable that $L^{11}$ represents a methylene group, an ethylene group, or a propylene group.

It is preferable that $L^{12}$ represents an arylene group having 1 to 10 carbon atoms, more preferable that $L^{12}$ represents a 1,4-phenylene group, a 1,3-phenylene group, or a 1,2-phenylene group, and still more preferable that $L^{12}$ represents a 1,4-phenylene group or a 1,3-phenylene group.

Preferred specific examples of the divalent linking group as $L^1$ are shown below, but the present invention is not limited thereto.

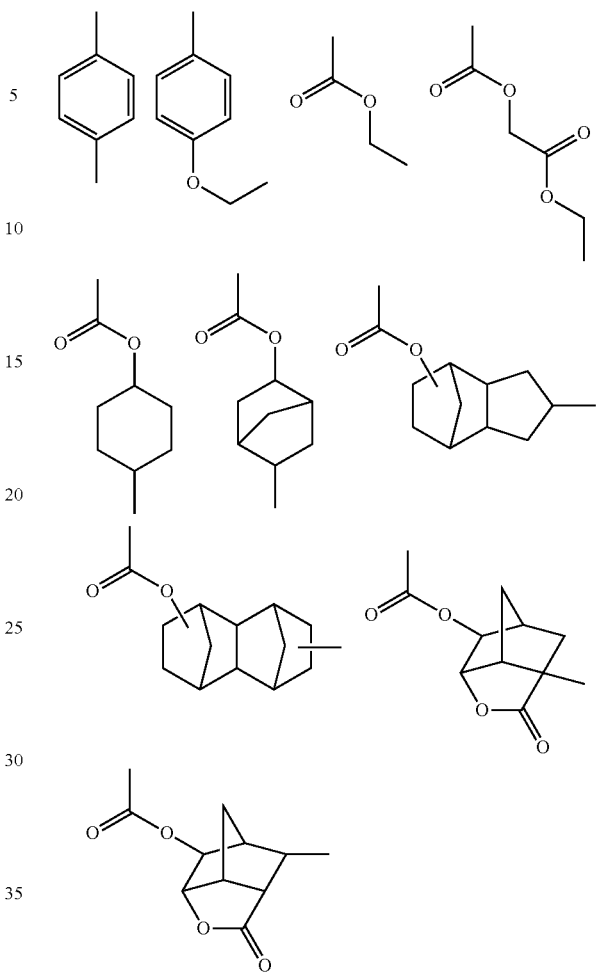

From a viewpoint that the glass transition point (Tg) of the specific resin (A) is further increased and thus the resolving power or the like can be further improved when a fine pattern is formed, it is preferable that the repeating unit represented by Formula (1-1) is a repeating unit represented by the following Formula (1-11).

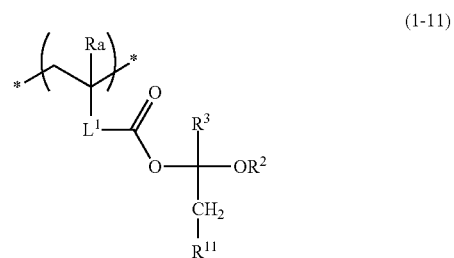

(1-11)

In Formula (1-11), $R^2$, $R^3$, $L^1$, and Ra have the same definitions as those for $R^2$, $R^3$, $L^1$, and Ra in Formula (1-1).

$R^{11}$ represents an alkyl group, an aryl group, an aralkyl group, an alkoxy group, an acyl group, or a heterocyclic group. $R^{11}$ and $R^2$ may be linked to each other to form a ring.

$R^{11}$ may represent a linear, branched, or cyclic alkyl group.

Specific examples and preferred examples of the alkyl group as $R^{11}$ are the same as those described above as the specific examples and preferred examples of the alkyl group as $R^1$.

Specific examples and preferred examples of the aryl group as $R^{11}$ are the same as those described above as a substituent which can be included in the alkyl group as $R^1$.

It is preferable that the aralkyl group as $R^{11}$ is an aralkyl group having 6 to 20 carbon atoms and more preferable that the aralkyl group as $R^{11}$ is an aralkyl group having 7 to 12 carbon atoms. Specific examples of the aralkyl group as $R^{11}$ include a benzyl group, a phenethyl group, a naphthylmethyl group, and a naphthylethyl group.

Examples of an alkyl group portion of the alkoxy group as $R^{11}$ include those exemplified as the alkyl group as $R^1$. As the alkoxy group, a methoxy group, an ethoxy group, an n-propoxy group, or an n-butoxy group is particularly preferable.

Examples of the acyl group as $R^{11}$ include a linear or branched acyl group having 2 to 12 carbon atoms such as acetyl group, a propionyl group, an n-butanoyl group, an i-butanoyl group, an n-heptanoyl group, a 2-methylbutanoyl group, a 1-methylbutanoyl group, or a t-heptanoyl group.

The heterocyclic group as $R^{11}$ is preferably a heterocyclic group having 6 to 20 carbon atoms and more preferably a heterocyclic group having 6 to 12 carbon atoms. Specific examples of the heterocyclic ring as $R^{11}$ include a pyridyl group, a pyrazyl group, a tetrahydrofuranyl group, a tetrahydropyranyl group, a tetrahydrothiophene group, a pyperidyl group, a piperazyl group, a furanyl group, a pyranyl group, and a chromanyl group.

$R^{11}$ and $R^2$ may be linked to each other to form a ring. The formed ring may include a substituent. It is preferable that a 5- or 6-membered ring is formed and more preferable that a tetrahydrofuranyl ring or a tetrahydropyranyl group is formed.

The alkyl group, the aryl group, the aralkyl group, the alkoxy group, the acyl group, and the heterocyclic group as $R^{11}$ may further include a substituent.

Examples of the substituent which can be further included in the alkyl group as $R^{11}$ include a cyclic alkyl group, an aryl group, an amino group, an amide group, an ureido group, an urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group.

In addition, the number of carbon atoms of the alkyl group and the number of carbon atoms of the substituent which can be further included in the cyclic alkyl group are respectively and preferably in a range of 1 to 8.

Examples of a substituent which can be further included in the aryl group, the aralkyl group, the heterocyclic ring, and a ring formed by $R^{11}$ and $R^2$ being linked to each other as $R^{11}$ include a nitro group, a halogen atom such as a fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

From a viewpoint that the glass transition point (Tg) of the specific resin (A) is further increased and thus the resolving power or the like can be further improved when a fine pattern is formed, it is preferable that the repeating unit represented by Formula (1-11) is a repeating unit represented by the following Formula (1-12).

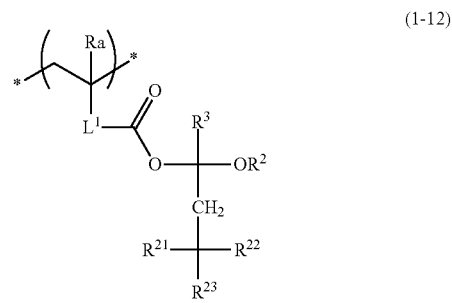

(1-12)

In Formula (1-12) above, $R^2$, $R^3$, $L^1$, and Ra have the same definitions as those for $R^2$, $R^3$, $L^1$, and Ra in Formula (1-1).

$R^{21}$ to $R^{23}$ each independently represent a hydrogen atom, an alkyl group, an aryl group, an aralkyl group, or a heterocyclic group, and at least two of $R^{21}$ to $R^{23}$ each independently represent an alkyl group, an aryl group, an aralkyl group, or a heterocyclic group.

At least two or $R^{21}$ to $R^{23}$ may be bonded to each other to form a ring. At least one of $R^{21}$ to $R^{23}$ may be bonded to $R^2$ to form a ring.

The alkyl group as $R^{21}$ to $R^{23}$ may be linear, branched, or cyclic. Specific examples and preferred examples of the alkyl group as $R^{21}$ to $R^{23}$ are the same as those described above as the specific examples and preferred examples of the alkyl group as $R^1$.

As described above, it is preferable that at least two of $R^{21}$ to $R^{23}$ each independently represent an alkyl group, an aryl group, an aralkyl group, or a heterocyclic ring and all of $R^{21}$ to $R^{23}$ represent an alkyl group, an aryl group, an aralkyl group, or a heterocyclic ring.

Specific examples and preferred examples of the cyclic alkyl group as $R^{21}$ to $R^{23}$ are the same as those described above as the specific examples and preferred examples of the cyclic alkyl group as $R^1$.

Specific examples and preferred examples of the cyclic aryl group as $R^{21}$ to $R^{23}$ are the same as the aryl group described above as a sub stituent which can be included in the alkyl group or the cyclo alkyl group as $R^1$.

Specific examples and preferred examples of the aralkyl group as $R^{21}$ to $R^{23}$ are the same as those described above as the specific examples and preferred examples of the aralkyl group as $R^{11}$.

Specific examples and preferred examples of the heterocyclic group as $R^{21}$ to $R^{23}$ are the same as those described above as the specific examples and preferred examples of the aralkyl group as $R^{11}$.

At least one of $R^{21}$ to $R^{23}$ may be linked to $R^2$ to form a ring. The formed ring may include a substituent. It is preferable that a 5- or 6-membered ring is formed and more preferable that a tetrahydrofuranyl ring or a tetrahydropyranyl group is formed.

The alkyl group, the aryl group, the aralkyl group, and the heterocyclic group as $R^{21}$ to $R^{23}$ may further include a substituent.

Specific examples of the substituent which can be further included in the alkyl group as $R^{21}$ to $R^{23}$ are the same those described above as the specific examples of the substituent which can be further included in the alkyl group as $R^{11}$.

In addition, the number of carbon atoms of the alkyl group and the number of carbon atoms of the substituent which can be further included in the alkyl group are respectively and preferably in a range of 1 to 8.

Specific examples and preferred examples of the substituent which can be further included in the aryl group, the aralkyl group, or the heterocyclic ring as $R^{21}$ to $R^{23}$, or the ring formed by at least one of $R^{21}$ to $R^{23}$ being linked to $R_2$ are the same as those described above as the specific examples and preferred examples of the substituent which can be further included in the aryl group, the aralkyl group, or the heterocyclic ring as $R^{11}$, or the ring formed by $R^{11}$ and $R^2$ being linked to each other.

At least two of $R^{21}$ to $R^{23}$ may be bonded to each other to form a ring.

In a case where at least two of $R^{21}$ to $R^{23}$ are bonded to each other to form a ring, examples of a ring which is formed include a cyclopentane ring, a cyclohexane ring, an adamantane ring, a norbornene ring, and a norbornane ring. Among these, a cyclohexane ring is particularly preferable. These rings may include a substituent and examples of the substituent which can be included include respective groups described above as the specific examples of the alkyl group and the substituent which can be included in the alkyl group.

In a case where all of $R^{21}$ to $R^{23}$ are bonded to each other to form a ring, examples of the ring to be formed include an adamantane ring, a norbornane ring, a norbornene ring, a bicylo[2,2,2]octane ring, and a bicylo[3,1,1]heptane ring. Among these, an adamantane ring is particularly preferable. These rings may include a substituent and examples of the substituent which can be included include respective groups described above as the specific examples of the alkyl group and the substituent which can be included in the alkyl group.

From a viewpoint that the glass transition point of the specific resin (A) is higher and the resolving power can be improved, it is preferable that $R^{21}$ to $R^{23}$ each independently represent an alkyl group.

The number of carbon atoms of a group represented by —$C(R^{21})(R^{22})(R^{23})$ in Formula (1-12) above is preferably 15 or less. In this manner, the affinity between a resist film to be obtained and a developer becomes sufficient and an exposed portion can be more reliably removed by the developer (that is, developability can be sufficiently obtained).

Specific examples of $R^{11}$ (preferably, a group represented by —$C(R^{21})(R^{22})(R^{23})$) will be shown below, but the present invention is not limited thereto. In the specific examples shown below, "*" represents a bond connected to a group represented by —$CH_2$— of Formula (1-11) or (1-12).

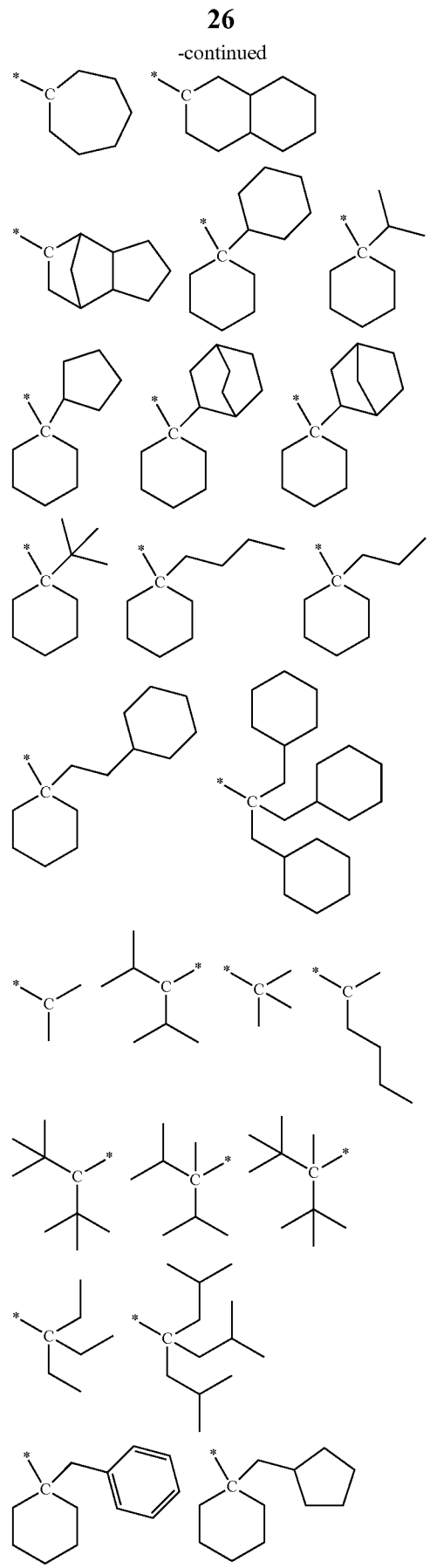

-continued

-continued

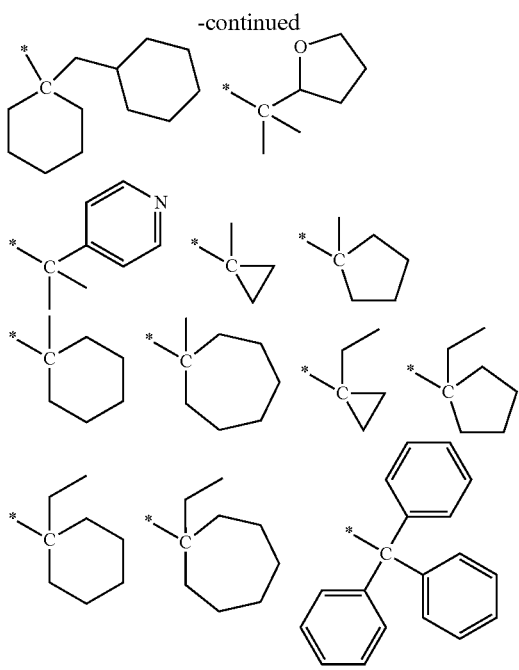

In the same manner, from a viewpoint that the glass transition point (Tg) of the specific resin (A) is further increased and thus the resolving power or the like can be further improved when a fine pattern is formed, it is preferable that the repeating unit represented by Formula (1-1) is a repeating unit represented by the following Formula (1-13).

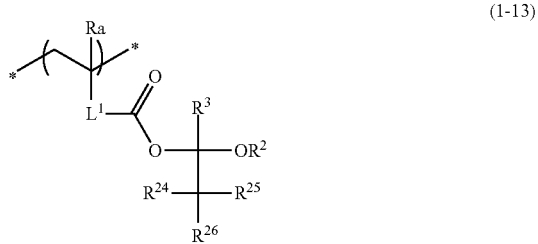

(1-13)

In Formula (1-13) above, $R^2$, $R^3$, $L^1$, and Ra have the same definitions as those for $R^2$, $R^3$, $L^1$, and Ra in Formula (1-1).

$R^{24}$ to $R^{26}$ each independently represent an alkyl group, an aryl group, an aralkyl group, or a heterocyclic group. Preferred examples of $R^{24}$ to $R^{26}$ are the same as the preferred examples described above as $R^{21}$ to $R^{23}$, but it is more preferable that all of $R^{24}$ to $R^{26}$ represent an alkyl group, still more preferable that all of $R^{24}$ to $R^{26}$ represent a linear or branched alkyl group, and particularly preferable that all of $R^{24}$ to $R^{26}$ represent a methyl group.

At least two of $R^{24}$ to $R^{26}$ may be bonded to each other to form a ring. Preferred examples of the ring to be formed include the examples described above in regard to a ring which is formed by at least two of $R^{21}$ to $R^{23}$ being bonded to each other. Particularly, preferred examples thereof include a cyclopentyl ring, a cyclohexyl ring, a norbornene ring, and an adamantane ring.

At least one of $R^{24}$ to $R^{26}$ may be bonded to $R^2$ to form a ring. Preferred examples of the ring to be formed include the examples described above in regard to a ring formed by at least one of $R^{21}$ to $R^{23}$ being bonded to $R^2$.

From viewpoints of further reliably securing a high contrast (γ value is high), improving resolving power and space width roughness in formation of a fine isolated space pattern, and more reliably achieving high resolving power, excellent exposure latitude, and uniformity of local pattern dimensions in formation of a fine hole pattern, the content of a repeating unit (total content in a case where plural kinds of repeating unit are included) represented by Formula (1-1), (1-11), or (1-12) in the specific resin (A) is preferably 55% by mole or greater and more preferably 60% by mole or greater with respect to all repeating units in the specific resin (A).

The upper limit thereof, which is not particularly limited, is preferably 85% by mole or less, more preferably 80% by mole or less, and still more preferably 75% by mole or less from a viewpoint of more reliably achieving the effects of the present invention.

The copolymerization composition of the constituent units which include an acid dissociable group represented by Formula (1) is preferably in a range of 10% by mole to 90% by mole and more preferably in a range of 20% by mole to 50% by mole with respect to all components.

It is more preferable that the specific resin A includes a repeating unit containing a cyclic ether ester group as a group dissociated by an acid. As the repeating unit containing a cyclic ether ester group, a repeating unit represented by the following Formula (11) is more preferable.

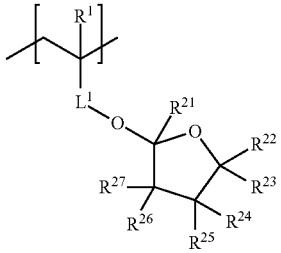

Formula (11)

(In Formula (11), $R^1$ represents a hydrogen atom or an alkyl group, $L^1$ represents a carbonyl group or a phenylene group, $R^{21}$ to $R^{27}$ each independently represent a hydrogen atom or an alkyl group.)

Next, the constituent unit represented by Formula (11) will be described in detail.

Examples of the alkyl group as $R^1$ include a linear, branched, or cyclic alkyl group having 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Among these alkyl groups, a linear alkyl group having 1 to 12 carbon atoms, a branched alkyl group having 3 to 12 carbon atoms, or a cyclic alkyl group having 5 to 10 carbon atoms is preferable, a linear alkyl group having 1 to 12 carbon atoms is more preferable, and a methyl group or an ethyl group is still more preferable.

Among these, it is preferable that $R^1$ represents a hydrogen atom or a methyl group and more preferable that $R^1$ represents a methyl group.

$L^1$ represents a carbonyl group or a phenylene group and it is preferable that $L^1$ represents a carbonyl group.

$R^{21}$ to $R^{27}$ each independently represent a hydrogen atom or an alkyl group. The alkyl group as $R^{21}$ to $R^{27}$ has the same definition as that for $R^1$ and the preferred embodiment is the same as that of $R^1$.

In addition, from viewpoints of decomposition properties and synthesis, it is preferable that one or more of $R^{21}$ to $R^{27}$ represent a hydrogen atom and more preferable that all of $R^{21}$ to $R^{27}$ represent a hydrogen atom.

The constituent unit represented by Formula (11) in the present invention contains a protected carboxy group and/or a protected phenolic hydroxyl group.

A carboxylic acid monomer which is capable of forming a unit represented by Formula (11) can be used as a constituent unit by a carboxy group being protected if the carboxylic acid monomer may become a constituent unit when the carboxy group is protected, and examples thereof include acrylic acid and methacrylic acid. In addition, as the constituent unit, a constituent unit derived from carboxylic acid in which these carboxylic groups are protected is preferably exemplified.

When the phenolic hydroxyl group is protected, as a monomer including a phenolic hydroxyl group which is capable of forming a constituent unit represented by Formula (11), a monomer which may become a constituent unit by a phenolic hydroxyl group being protected can be used. Preferred examples thereof include hydroxystyrenes such as p-hydroxystyrene and α-methyl-p-hydroxystyrene. Among these, α-methyl-p-hydroxystyrene is more preferable.

As a radical polymerizable monomer used to form a constituent unit represented by Formula (11), a commercially available product or a product obtained through synthesis using a known method can be used. For example, the radical polymerizable monomer can be synthesized by reacting (meth)acrylic acid with a dihydrofuran compound in the presence of an acid catalyst.

Further, after a carboxy group to be protected or a phenolic hydroxyl group-containing monomer is polymerized with constituent units (a2) to (a4) described below or a precursor thereof, the radical polymerizable monomer can be formed by reacting a carboxy group or a phenolic hydroxyl group with a dihydrofuran compound. In addition, preferred specific examples of a constituent unit to be formed in the above-described manner are the same as the constituent units derived from the preferred specific examples of the radical polymerizable monomer.

As a group which is included in the specific resin A and is dissociated by an acid, a group represented by the following Formula ($B^1$) is preferably exemplified.

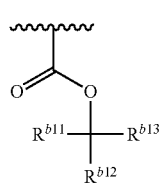

(B¹)

In Formula ($B^1$), the wavy line indicates a position linked to a main chain or a side chain of the specific resin A.

$R^{b11}$, $R^{b12}$, and $R^{b13}$ each independently represent a group selected from an unsubstituted linear or branched alkyl group having 1 to 20 carbon atoms or an unsubstituted cyclic alkyl group having 3 to 20 carbon atoms, and two of $R^{b11}$, $R^{b12}$, and $R^{b13}$, may be bonded to each other to form a ring.

$R^{b11}$, $R^{b12}$, and $R^{b13}$ each independently represent a group selected from an unsubstituted linear or branched alkyl group having 1 to 20 carbon atoms or an unsubstituted cyclic alkyl group having 3 to 10 carbon atoms.

The number of carbon atoms of the unsubstituted linear alkyl group is preferably in a range of 1 to 20, more preferably in a range of 1 to 15, and still more preferably in a range of 1 to 10. Specific examples thereof include a methyl group, an ethyl group, a propyl group, a hexyl group, and an octyl group.

The number of carbon atoms of the unsubstituted branched alkyl group is preferably in a range of 3 to 20, more preferably in a range of 3 to 15, and still more preferably in a range of 3 to 10. Specific examples thereof include an iso-propyl group, an n-butyl group, a sec-butyl group, a tert-butyl group, and an iso-butyl group.

The number of carbon atoms of the unsubstituted cyclic alkyl group is preferably in a range of 3 to 20, more preferably in a range of 3 to 15, and still more preferably in a range of 3 to 10. The cyclic alkyl group may be monocyclic or polycyclic. Specific examples thereof include a cyclopropyl group, a cyclobutyl group, a cyclopentyl group, a cyclohexyl group, a norbornyl group, an isobornyl group, a camphanyl group, an adamantyl group, a dicyclopentyl group, an α-pinel group, and a tricyclodecanyl group.

Two of $R^{b11}$, $R^{b12}$, and $R^{b13}$ may be bonded to each other to form a ring. Examples of a ring formed by two of $R^{b11}$, $R^{b12}$ and $R^{b13}$ being bonded to each other include a cyclopentane ring, a cyclohexane ring, a norbornane ring, an isobornane ring, and an adamantane ring.

As a repeating unit which contains a group represented by Formula ($B^1$), a repeating unit represented by the following Formula ($B^1$-1) is preferably exemplified.

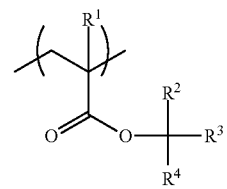

Formula ($B^1$-1)

In Formula ($B^1$-1), $R^1$ represents a hydrogen atom, an alkyl group, a cyano group, or a halogen atom. $R^2$ to $R^4$ each independently represent an alkyl group and two of $R^2$ to $R^4$ may be bonded to each other to form a cyclic alkyl group.

In Formula ($B^1$-1), it is preferable that $R^1$ represents a hydrogen atom or an alkyl group.

In Formula ($B^1$-1), in a case where $R^1$ represents an alkyl group, the definition of $R^1$ is the same as that for $R^1$ in Formula (11) and the preferred ranges are the same as each other.

In Formula ($B^1$-1), in a case where $R^1$ represents a halogen atom, a fluorine atom, a chlorine atom, or a bromine atom is preferable.

In Formula ($B^1$-1), the definition of $R^2$ is the same as that for $R^{b11}$ in Formula ($B^1$) and a methyl group is preferable.

In Formula ($B^1$-1), the definition of $R^3$ is the same as that for $R^{b12}$ in Formula ($B^1$) and a methyl group is preferable.

In Formula (B¹-1), the definition of $R^4$ is the same as that for $R^{b13}$ in Formula (B¹) and a methyl group is preferable.

In Formula (B¹-1), in a case where two of $R^2$ to $R^4$ are bonded to each other to form a cyclic alkyl group, it is preferable that $R^2$ and $R^3$ or $R^3$ and $R^4$ are bonded to each other. The number of carbon atoms of the cyclic alkyl group to be formed is preferably in a range of 3 to 10.

As a repeating unit which contains a group represented by Formula (B¹), a repeating unit represented by the following Formula (B¹-2) is also preferable.

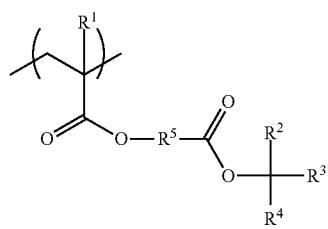

Formula (B¹-2)

In Formula (B¹-2), $R^1$ represents a hydrogen atom, an alkyl group, a cyano group, or a halogen atom. $R^2$ to $R^4$ each independently represent an alkyl group; and two of $R^2$ to $R^4$ may be bonded to each other to form a cyclic alkyl group. $R^5$ represents a divalent chain-like hydrocarbon group.

In Formula (B¹-2), it is preferable that $R^1$ represents a hydrogen atom or an alkyl group.

In Formula (B¹-2), in a case where $R^1$ represents an alkyl group, the definition of $R^1$ is the same as that for $R^1$ in Formula (11) and the preferred ranges are the same as each other.

In Formula (B¹-2), in a case where $R^1$ represents a halogen atom, the definition of $R^1$ is the same as that for $R^1$ in Formula (B¹-1), and the preferred ranges are the same as each other.

In Formula (B¹-2), the definitions of $R^2$ to $R^4$ are the same as those for $R^2$ to $R^4$ in Formula (B¹-1) and a methyl group is preferable.

In Formula (B¹-2), in a case where two of $R^2$ to $R^4$ are bonded to each other to form a cyclic alkyl group, it is preferable that $R^2$ and $R^3$ or $R^3$ and $R^4$ are bonded to each other. The number of carbon atoms of the cyclic alkyl group to be formed is preferably in a range of 3 to 10.

In Formula (B¹-2), $R^5$ represents a divalent chain-like hydrocarbon group. The chain-like hydrocarbon group may be a linear or branched chain-like group and a linear chain-like group is preferable. The number of carbon atoms of the chain-like hydrocarbon group is preferably in a range of 1 to 10, more preferably 1 to 6, and still more preferably in a range of 1 to 3. Particularly, as the chain-like hydrocarbon group, an alkylene group having 1 to 3 carbon atoms is preferable and a methylene group is more preferable.

As a repeating unit which contains a group represented by Formula (B¹), a repeating unit represented by the following Formula (IV) is also preferable.

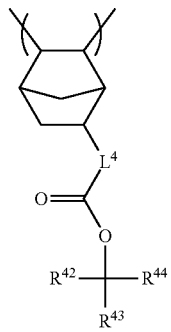

(IV)

In Formula (IV), $R^{42}$, $R^{43}$, and $R^{44}$ each independently represent a group selected from an unsubstituted linear or branched alkyl group having 1 to 20 carbon atoms or an unsubstituted cyclic alkyl group having 3 to 20 carbon atoms, and $R^{42}$, $R^{43}$, and $R^{44}$ may be bonded to one another to form a ring. $L^4$ represents a divalent linking group.

The definitions of $R^{42}$, $R^{43}$, and $R^{44}$ are the same as those for $R^2$ to $R^4$ in Formula (B¹-1) and preferred ranges are the same as each other.

$L^4$ represents a divalent linking group. Examples of the divalent linking group include a linear, branched, or cyclic alkylene group and a group formed by combining these. These groups may contain at least one selected from an ester bond, an ether bond, an amide bond, and an urethane bond. Further, these groups may be unsubstituted or may include a substituent. As the substituent, a hydroxyl group or the like is exemplified. As the substituent, it is preferable that a substituent other than a hydroxyl group is not contained.

The number of carbon atoms of the linear alkylene group is preferably in a range of 2 to 10.

The number of carbon atoms of the branched alkylene group is preferably in a range of 3 to 10.

The number of carbon atoms of the cyclic alkylene group is preferably in a range of 3 to 10.

Specific examples of the divalent linking group include an ethylene group, a propylene group, a butylene group, a hexylene group, a 2-hydroxy-1,3-propanediyl group, a 3-oxa-1,5-pentanediyl group, and a 3,5-dioxa-1,8-octanediyl group.

As another example of a group which is included in the specific resin A and is dissociated by an acid, a group in which a hydrogen atom of an alkali-soluble group (i) is substituted with an acid-dissociable dissolution inhibition group (ii) represented by the following Formula (21) is preferably exemplified.

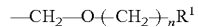 Formula (21)

(In the formula, $R^1$ represents an aliphatic cyclic group having 20 or less carbon atoms. n represents an integer of 0 or 1 to 5.)

It is preferable that the alkali-soluble group (i) is one or more selected from an alcoholic hydroxyl group, a phenolic hydroxyl group, and a carboxyl group. Among these, because of high transparency and suitable alkali solubility, an alcoholic hydroxyl group is preferable. Among these, it is more preferable that the alcoholic hydroxyl group is an alcoholic hydroxyl group in which a carbon atom adjacent to a carbon atom which is bonded to the alcoholic hydroxyl group has at least one fluorine atom.

The alcoholic hydroxyl group may be simply a hydroxy group, or may be an alcoholic hydroxyl group-containing alkyloxy group, an alcoholic hydroxyl group-containing alkyloxyalkyl group, or an alcoholic hydroxyl group-containing alkyl group. As the alkyloxy group, the alkyloxyalkyl group, or the alkyl group, a lower alkyloxy group, a lower alkyloxy lower alkyl group, or a lower alkyl group is exemplified. The term "lower" here means that the number of carbon atoms is 4 or less.

Specific examples of the lower alkyloxy group include a methyloxy group, an ethyloxy group, a propyloxy group, and a butyloxy group. Specific examples of the lower alkyloxy lower alkyl group include a methyloxy methyl group, an ethyloxy methyl group, a propyloxy methyl group, and a butyloxy methyl group. Specific examples of the lower alkyl group include a methyl group, an ethyl group, a propyl group, and a butyl group.

In addition, a part or all of hydrogen atoms of an alkyloxy group, an alkyloxy alkyl group, or an alkyl group in an alcoholic hydroxyl group-containing alkyloxy group, or an alcoholic hydroxyl group-containing alkyl alkyl group, or an alcoholic hydroxyl group-containing alkyl group may be substituted with fluorine atoms. Preferred examples thereof include a group obtained by substituting a part of hydrogen atoms of these alkyloxy portions in an alcoholic hydroxyl group-containing alkyloxy group or an alcoholic hydroxyl group-containing alkyloxyalkyl group with fluorine atoms; and a group obtained by substituting a part of hydrogen atoms of the alkyl group in an alcoholic hydroxyl group-containing alkyl group with fluorine atoms, that is, an alcoholic hydroxyl group-containing fluoroalkyloxy group, an alcoholic hydroxyl group-containing fluoroalkyloxy alkyl group, or an alcoholic hydroxyl group-containing fluoroalkyl group.

Examples of the alcoholic hydroxyl group-containing fluoroalkyloxy group include a (HO)C(CF$_3$)$_2$CH$_2$O-group-containing (2-bis(hexafluoromethyl)-2-hydroxy-ethyloxy group and a (HO)C(CF$_3$)$_2$CH$_2$CH$_2$O-group-containing (3-bis(hexafluoromethyl)-3-hydroxy-propyloxy group. Examples of the alcoholic hydroxyl group-containing fluoroalkyloxy alkyl group include a (HO)C(CF$_3$)$_2$CH$_2$O—CH$_2$-group and a (HO)C(CF$_3$)$_2$CH$_2$CH$_2$O—CH$_2$-group. Examples of the alcoholic hydroxyl group-containing fluoroalkyl group include a (HO)C(CF$_3$)$_2$CH$_2$-group-containing (2-bis(hexafluoromethyl)-2-hydroxy-ethyl group, and a (HO)C(CF$_3$)$_2$CH$_2$CH$_2$-group-containing (3-bis(hexafluoromethyl)-3-hydroxy-propyl group.

As the phenolic hydroxyl group, a phenolic hydroxyl group contained in a novolac resin or poly-(α-methyl)hydroxystyrene is exemplified. Among these, from a viewpoint of availability at a low cost, a phenolic hydroxyl group of poly-(α-methyl)hydroxystyrene is preferable.

As the carboxyl group, a carboxyl group in a constituent unit derived from an ethylenically unsaturated carboxylic acid is exemplified. Examples of the ethylenically unsaturated carboxylic acid include an unsaturated carboxylic acid such as acrylic acid, methacrylic acid, maleic acid, or fumaric acid. Among these, from a viewpoint of availability at a low cost, acrylic acid and methacrylic acid are preferable.

In Formula (21), R$^1$ represents an aliphatic cyclic group having 20 or less carbon atoms, and an aliphatic cyclic group having 5 to 12 carbon atoms is preferable. The aliphatic cyclic group may include a substituent. The value of n is preferably 0 or 1.

The term "aliphatic cyclic group" indicates a monocyclic group or a polycyclic group (alicyclic group) which is not aromatic. The "aliphatic cyclic group" is not limited to a group formed of carbon and hydrogen, but it is preferable that the aliphatic cyclic group is a hydrocarbon group. In addition, the "hydrocarbon group" may be saturated or unsaturated, but normally it is preferable that the hydrocarbon group is saturated.

Examples of such an aliphatic cyclic group include a monovalent group derived from cyclohexane, cyclopentane, adamantane, norbornane, norbornene, methylnorbornane, ethylnorbornane, methylnorbornene, ethylnorbornene, isobornane, tricyclodecane, or tetracyclododecane. Such an aliphatic cyclic group can be used by being appropriately selected from groups which have been suggested multiple times in an ArF resist. Among these, a cyclohexyl group, a cyclopentyl group, an adamantyl group, a norbornyl group, a norbornenyl group, a methylnorbornyl group, an ethylnorbornyl group, a methylnorbornenyl group, an ethylnorbornenyl group, or a tetracyclododecanyl group is industrially preferable and an adamantyl group is more preferable.

In Formula (21), it is more preferable that R$^1$ represents an aliphatic cyclic group including at least one or more hydrophilic groups and preferred examples of the hydrophilic group include a carbonyl group (preferably a ketonic carbonyl group), an ester group (—COOR), an alcoholic hydroxyl group, ether (—OR), an imino group, and an amino group. Among these, from a viewpoint of availability, a carbonyl group is more preferable.

As the acid dissociable dissolution inhibition group (ii), groups represented by the following Formulae (4) to (15) can be exemplified.

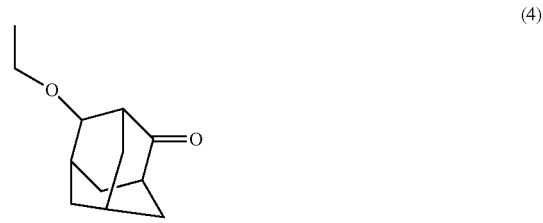

(4)

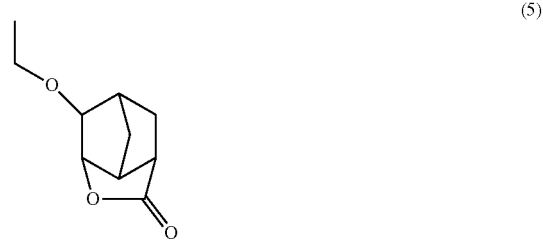

(5)

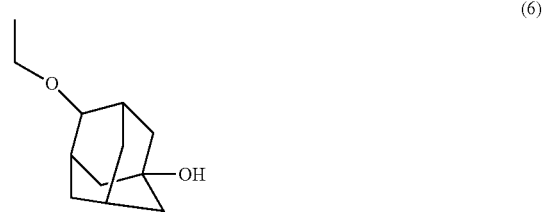

(6)

(7)

(8) 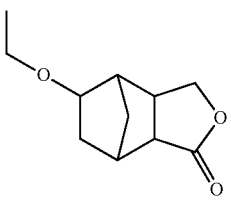

(9) 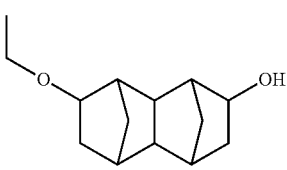

(10) 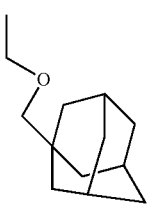

(11) 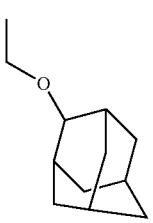

(12) 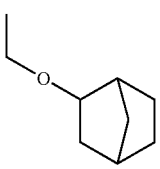

(13) 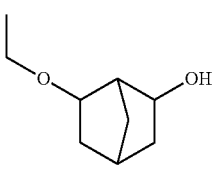

(14) 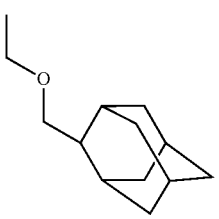

(15) 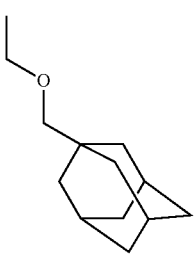

As the group dissociated by an acid, a repeating unit represented by the following Formula (16) is preferable as the repeating unit containing a group in which a hydrogen atom of the alkali-soluble group (i) is substituted with the acid dissociable dissolution inhibition group (ii) represented by Formula (21).

Formula (16)

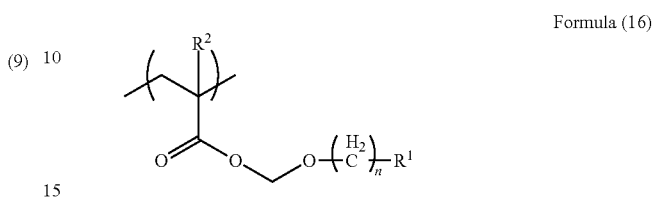

(In the formula, $R^2$ represents a hydrogen atom, a fluorine atom, a lower alkyl group having 20 or less carbon atoms, or a fluorinated lower alkyl group; $R^1$ represents an aliphatic cyclic group having 20 or less carbon atoms; and n represents an integer of 0 or 1 to 5.)

In Formula (16), $R^2$ represents a hydrogen atom, a fluorine atom, a lower alkyl group having 20 or less carbon atoms, or a fluorinated lower alkyl group having 20 or less carbon atoms, and a lower alkyl group having 1 to 4 carbon atoms or a fluorinated lower alkyl group having 1 to 4 carbon atoms is preferable. Specific examples thereof include a methyl group, an ethyl group, a propyl group, a butyl group, and a trifluoromethyl group. Among these, from a viewpoint of availability at a low cost, a hydrogen atom or a methyl group is preferable. n represents an integer of 0 or 1 to 5, and 0 or 1 is preferable.

As a preferred example of the repeating unit represented by Formula (16), a repeating unit represented by the following Formula (17) is exemplified.

Formula 17

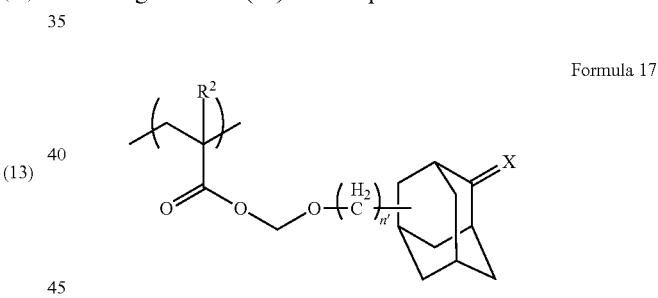

(In the formula, $R^2$ has the same definition as that for $R^2$ in Formula (16), and X represents two hydrogen atoms or one oxygen atom. n' represents 0 or 1. That is, when X represents two hydrogen atoms, X represents a methylene chain (—$CH_2$—).)

As a preferred example of the repeating unit represented by Formula (17), repeating units represented by the following Formulae (18) to (20) are exemplified. In the formula, $R^2$ has the same definition as that for $R^2$ in Formula (16).

Formula 18

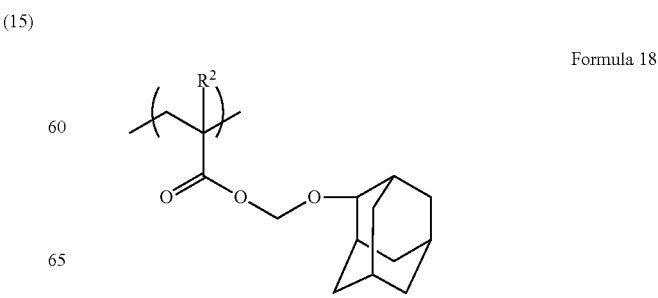

Formula 19

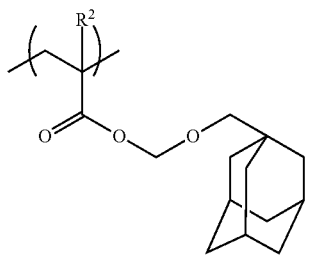

Formula 20

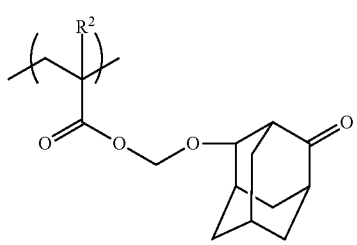

As another group dissociated by an acid used in the present invention, a repeating unit which includes a group dissociated by an acid, from among compounds described in paragraphs "0039" to "0049" of JP2008-197480A, is preferable, and compounds described in paragraphs "0052" to "0056" of JP2012-159830A (JP5191567B) are preferable. In addition, these contents are incorporated in the specification of the present application.

Hereinafter, specific examples of the repeating unit (a1) which is included in the specific resin (A) and has a group dissociated by an acid will be shown, but the present invention is not limited thereto.

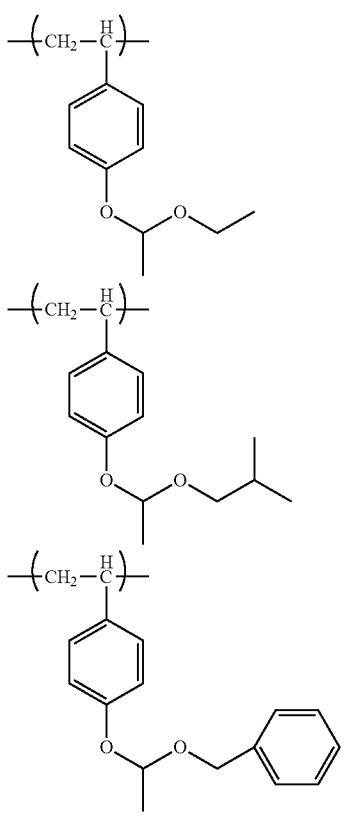

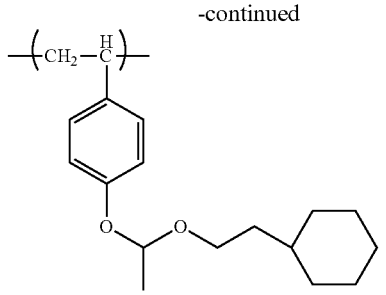

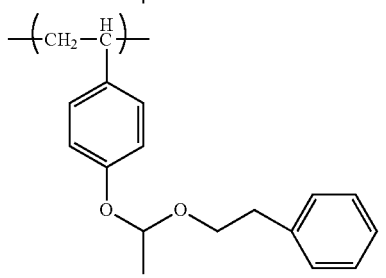

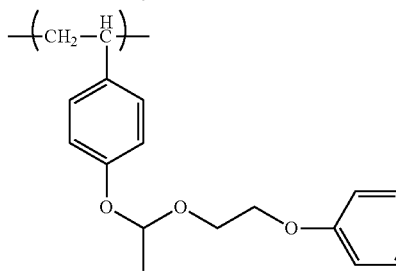

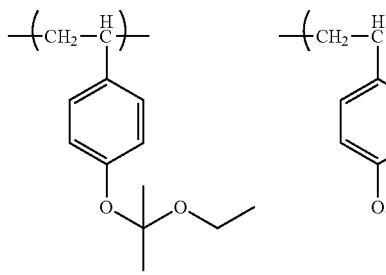

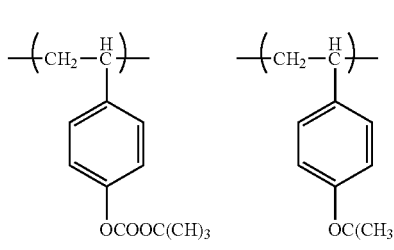

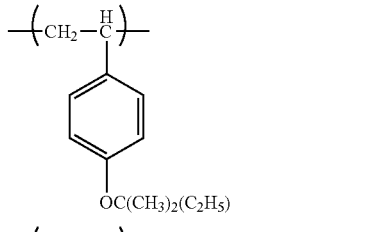

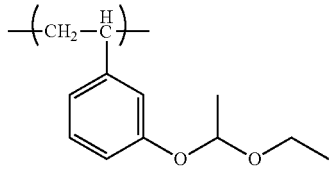

-continued
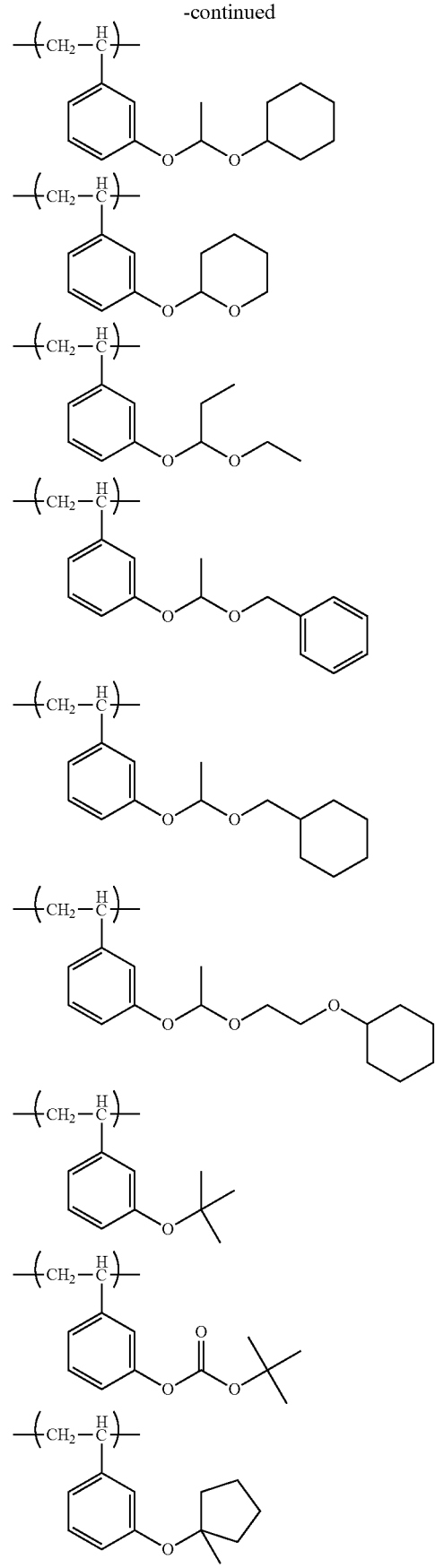
-continued
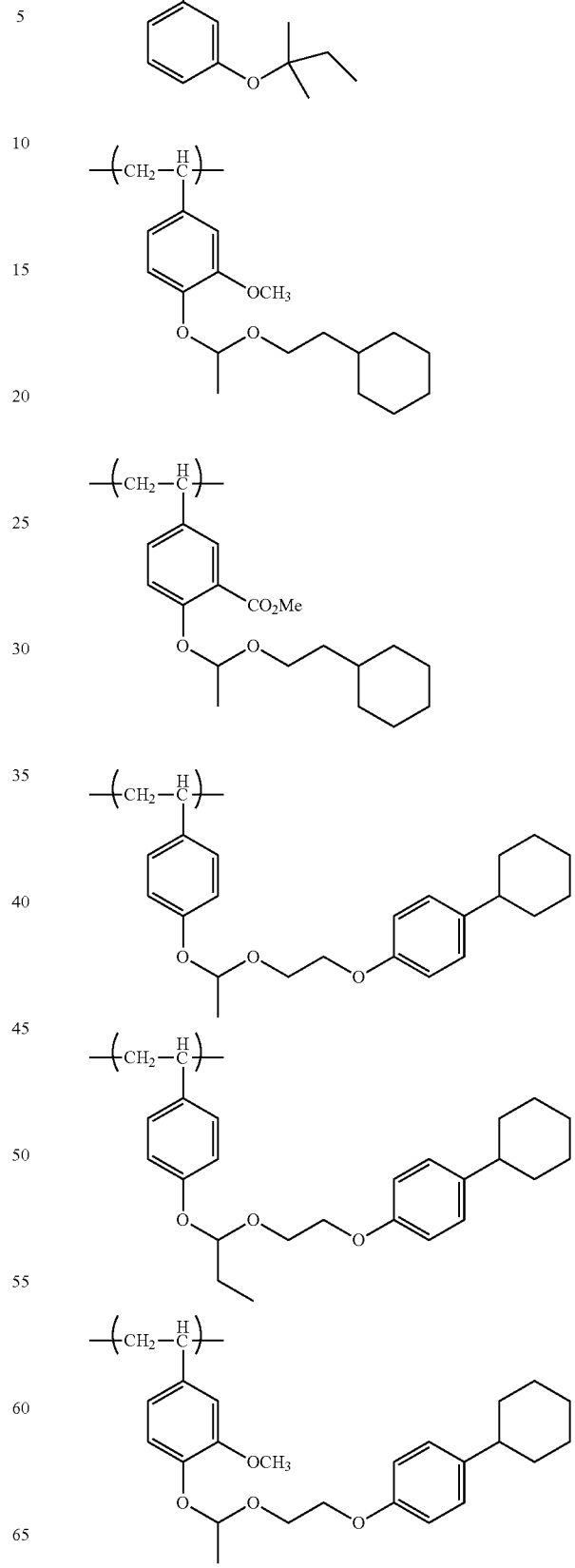

41
-continued
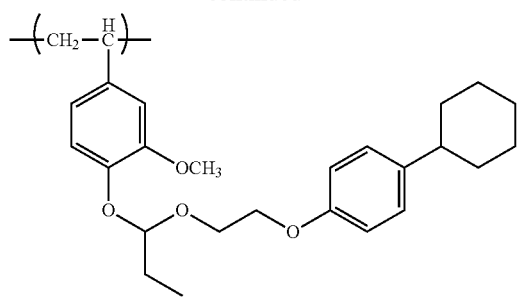
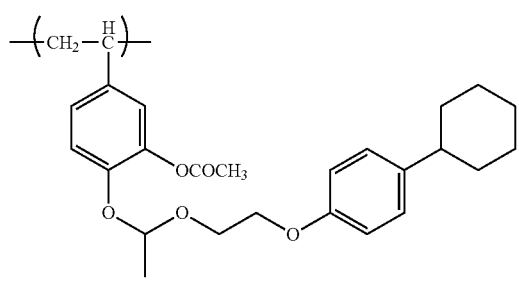
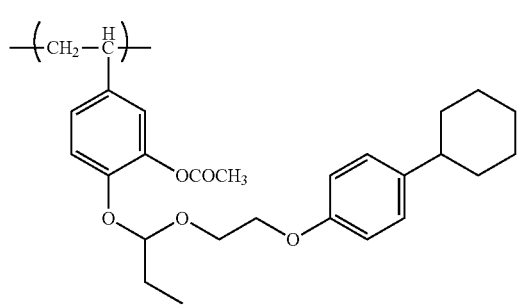
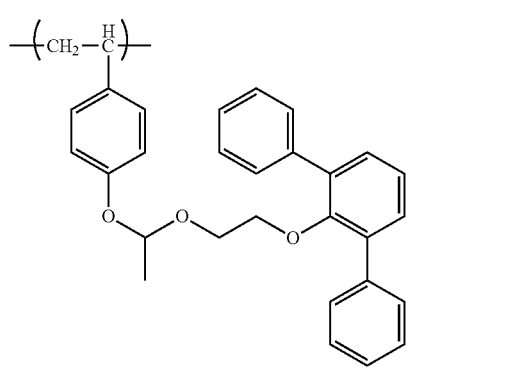
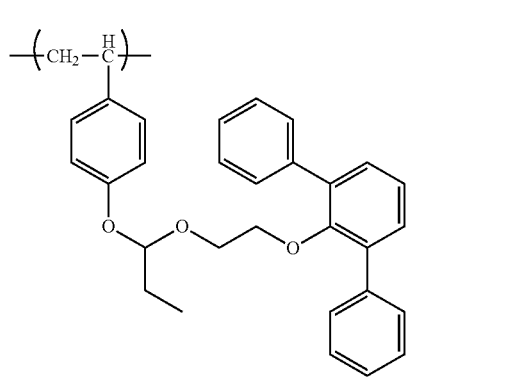
42
-continued
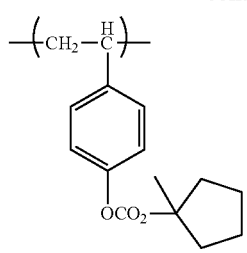 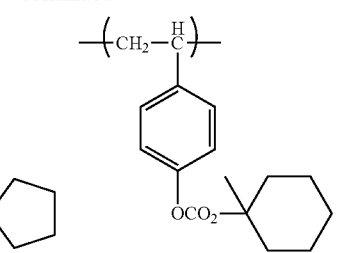
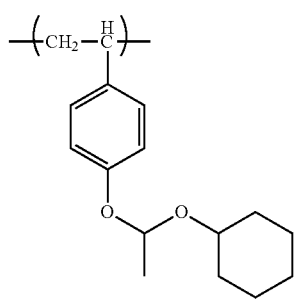
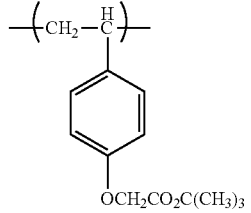
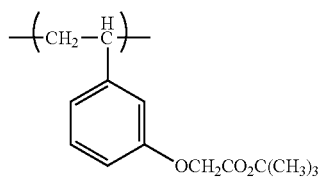
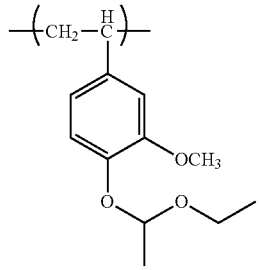
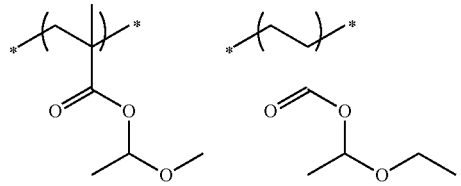
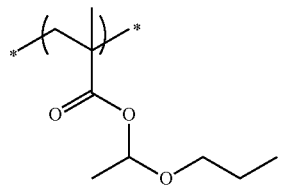

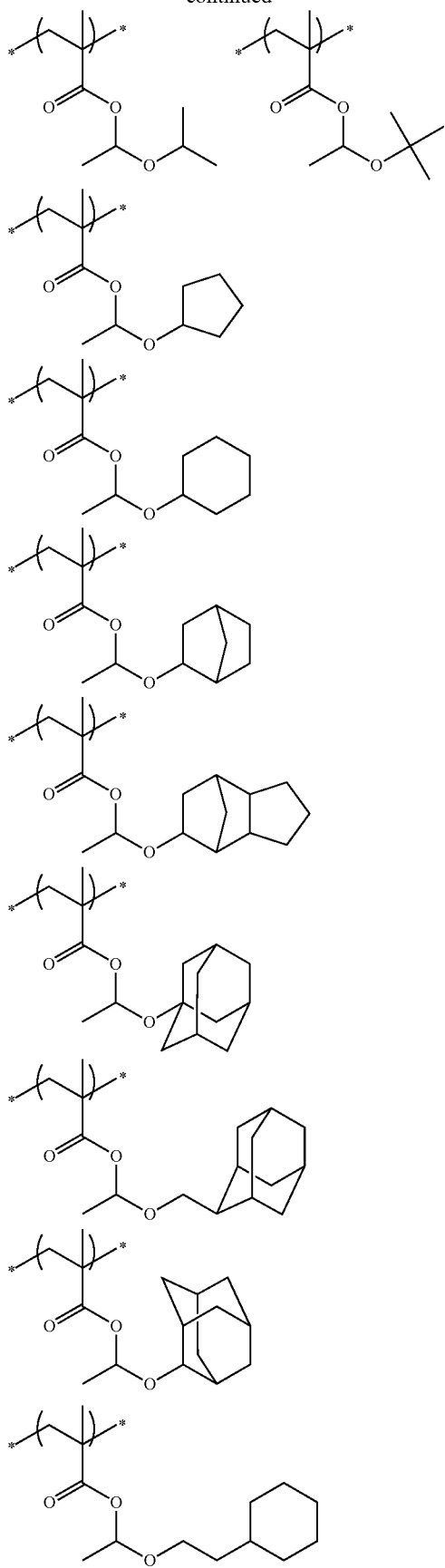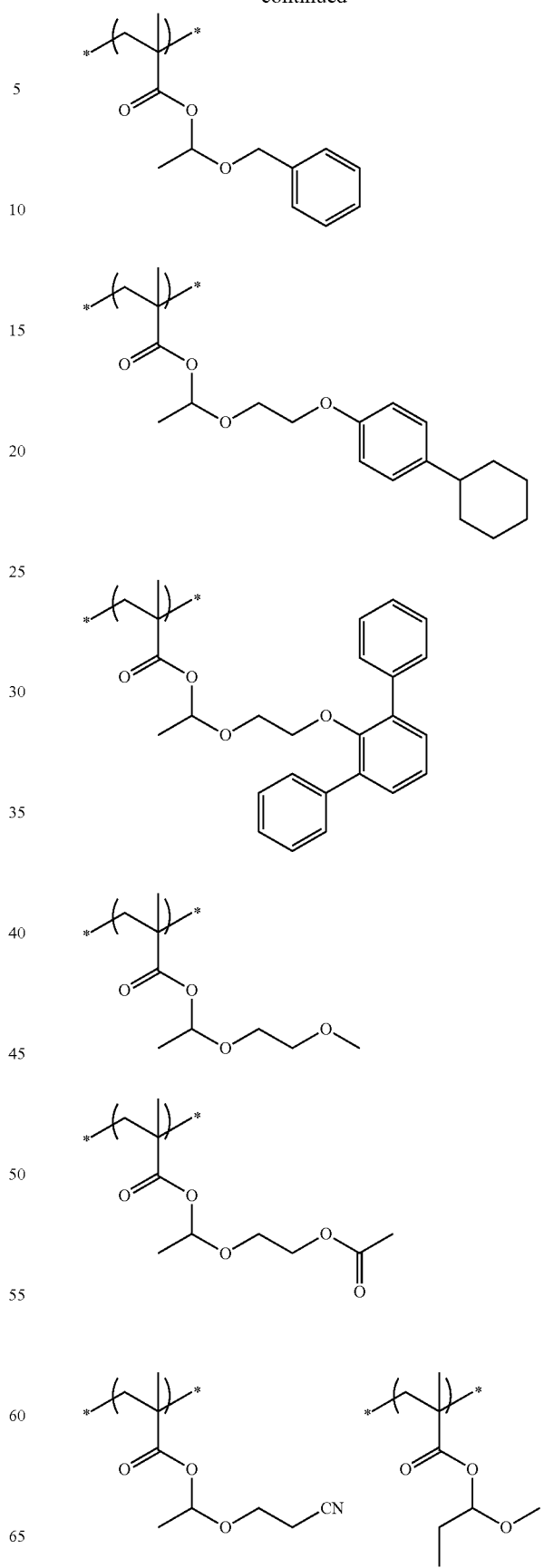

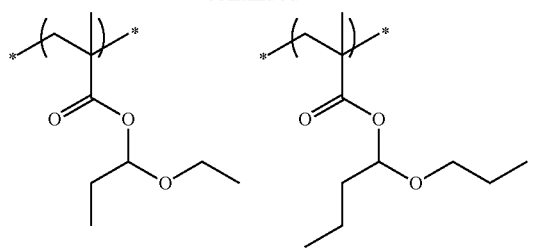
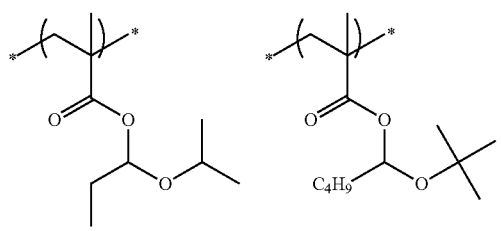
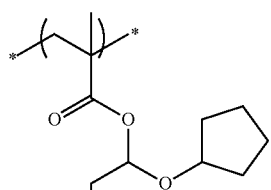
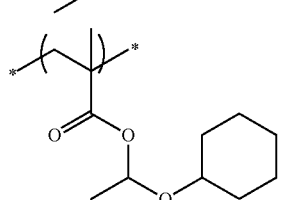
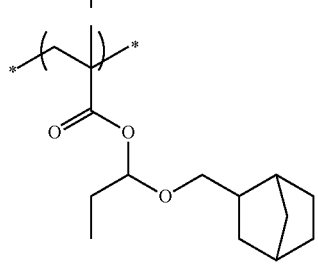
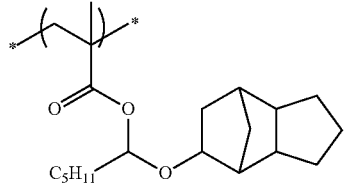
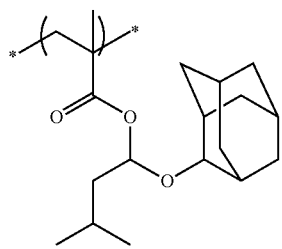
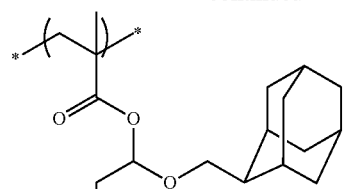
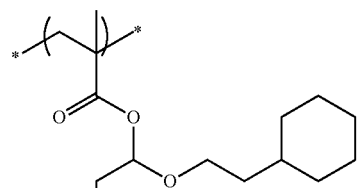
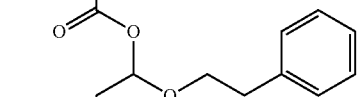
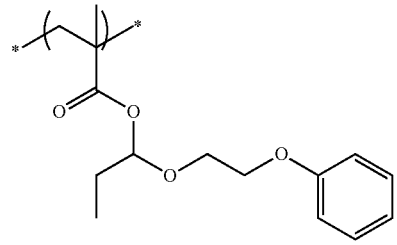
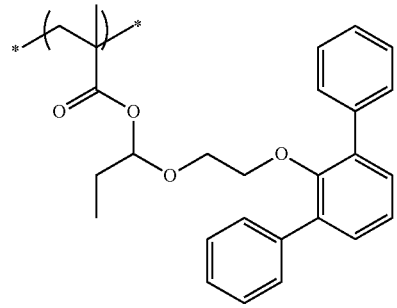
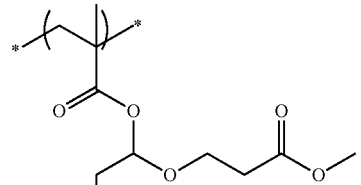
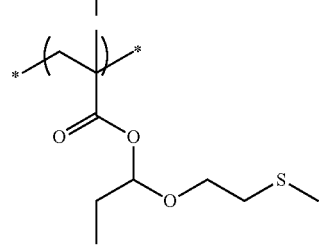

47
-continued
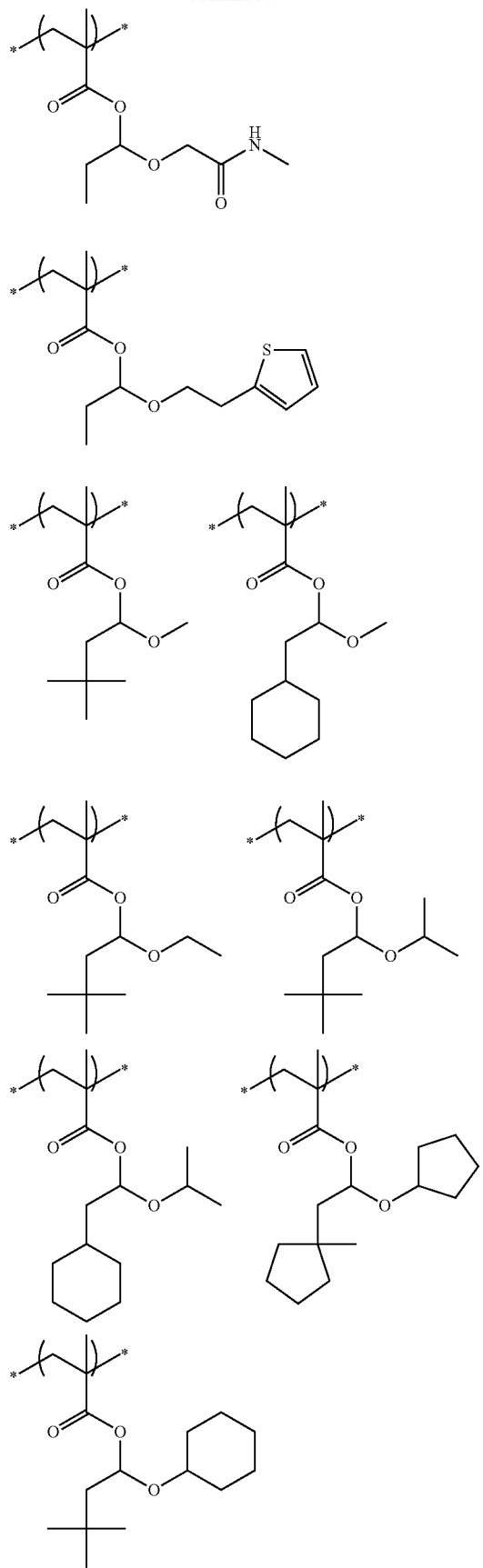
48
-continued
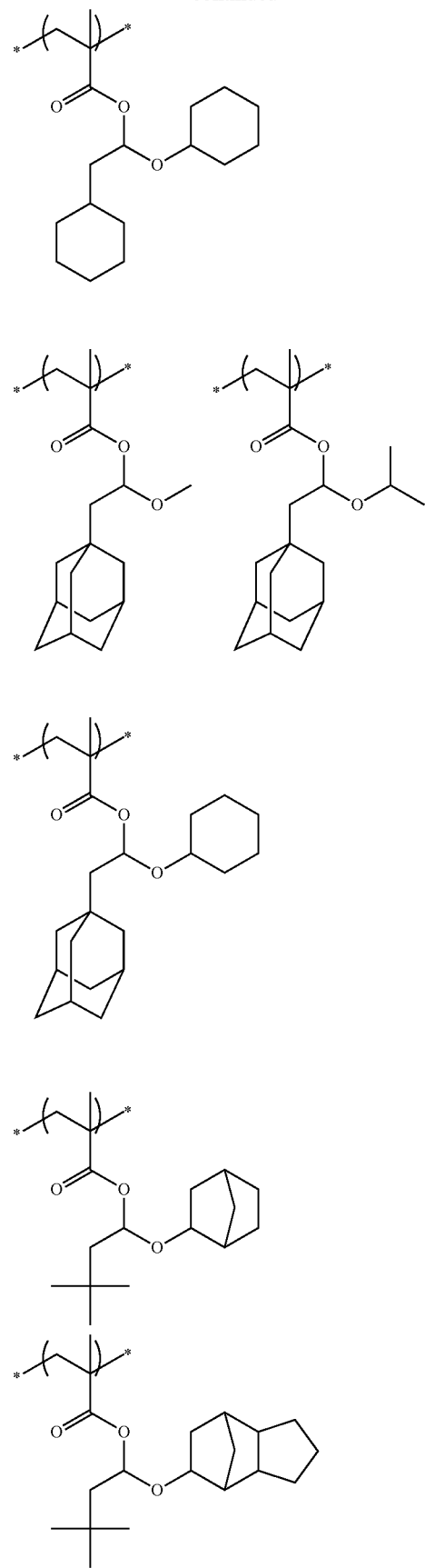

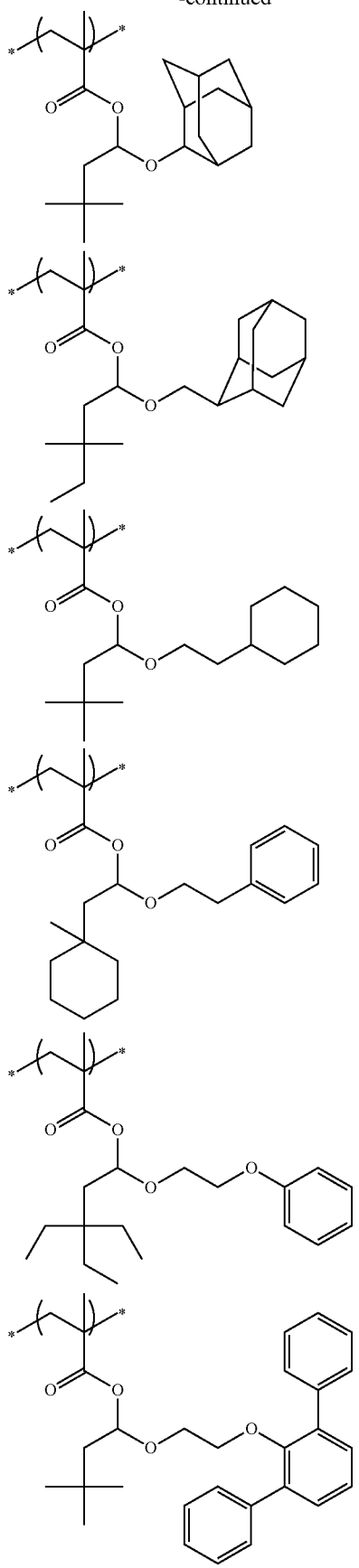
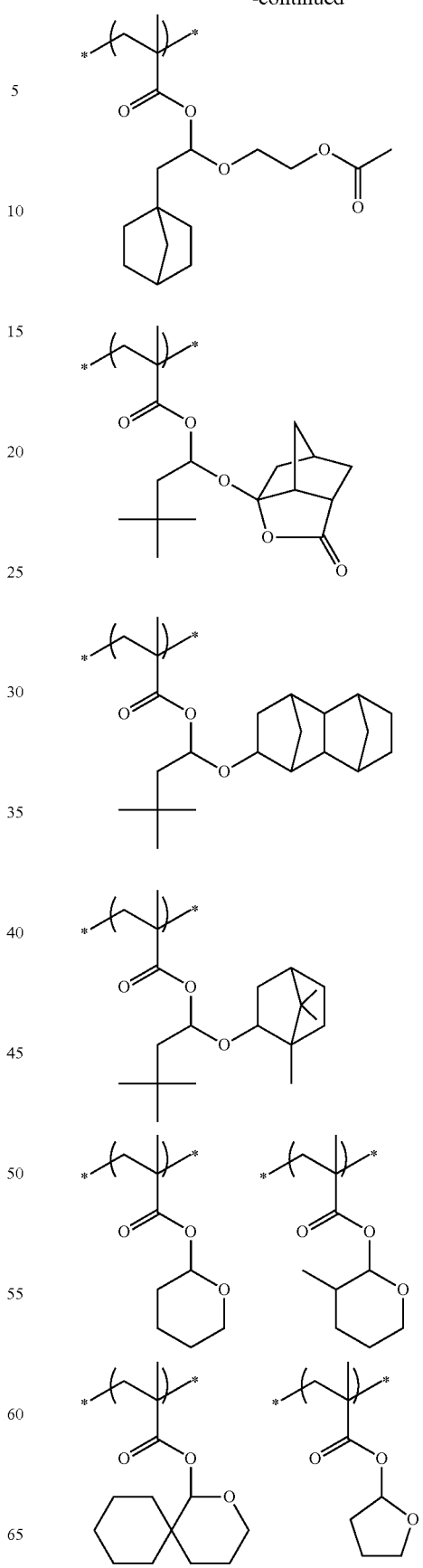

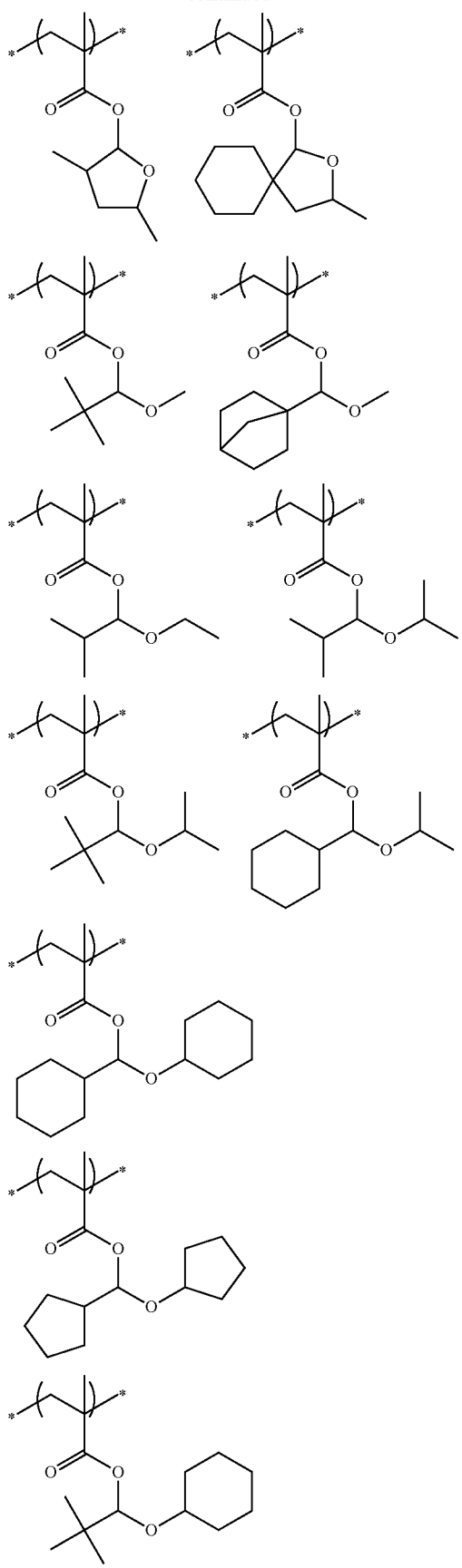
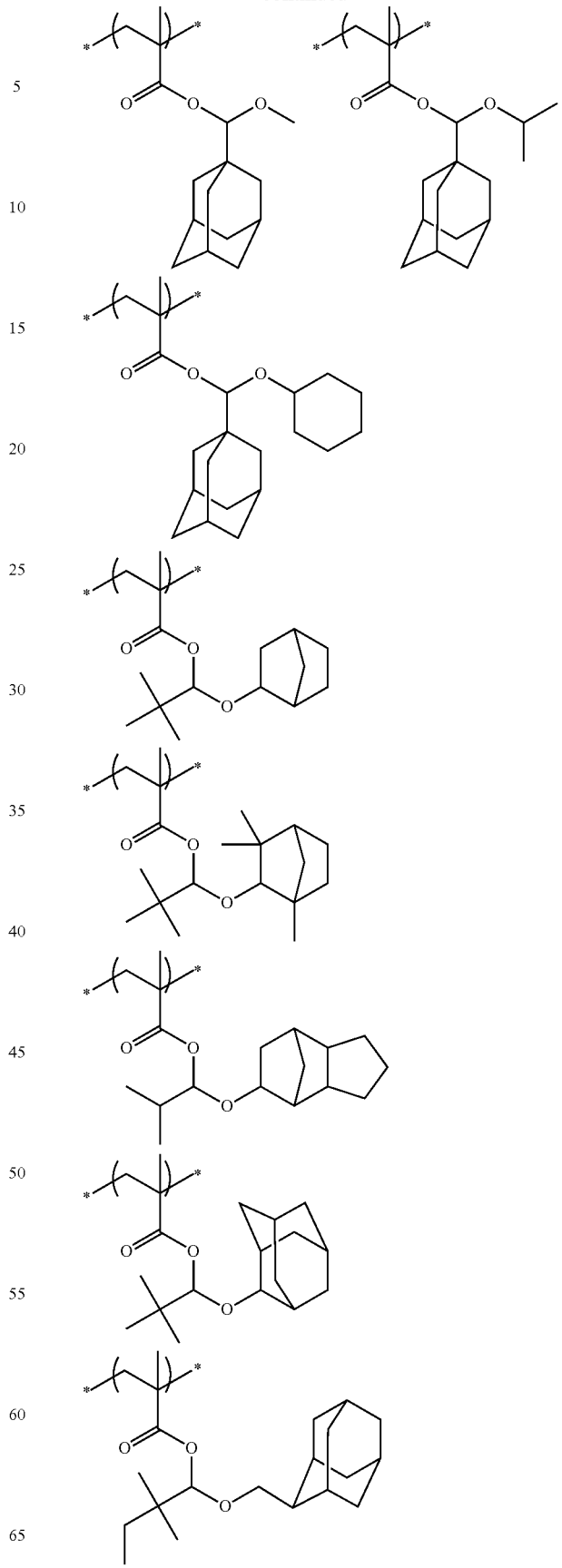

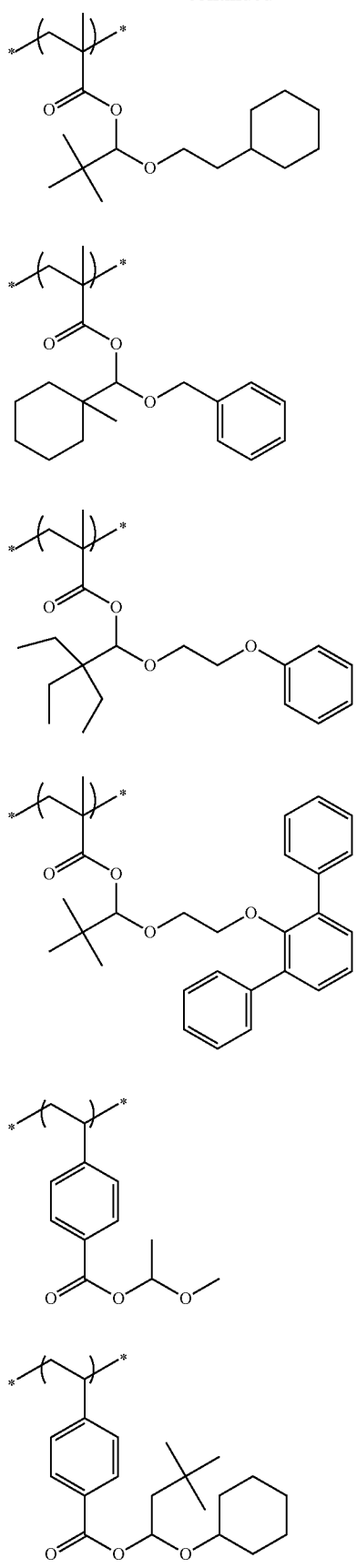
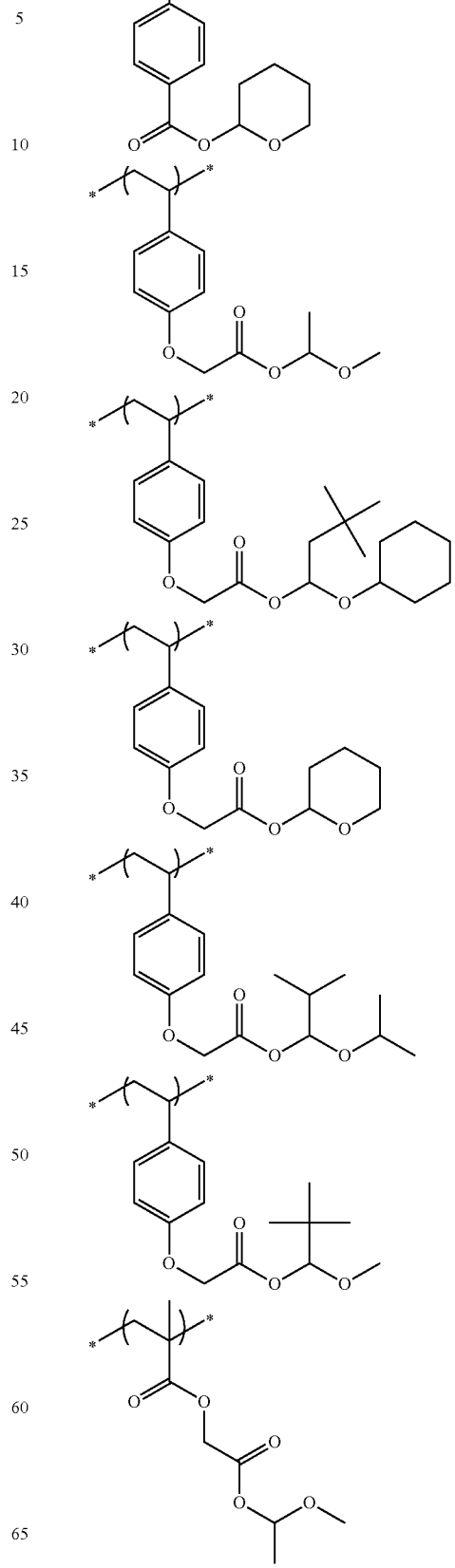

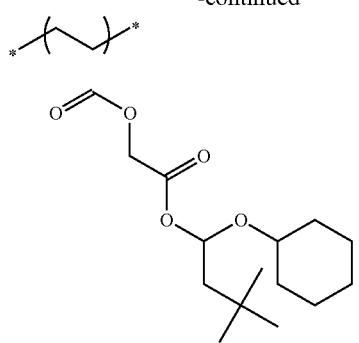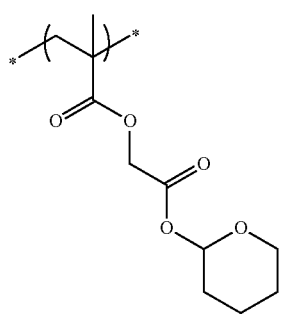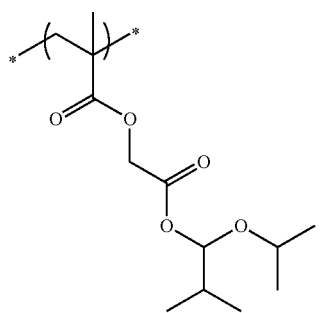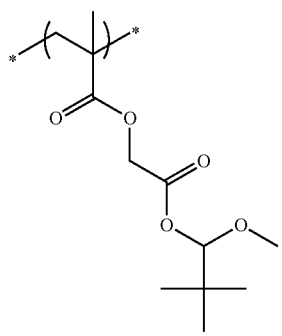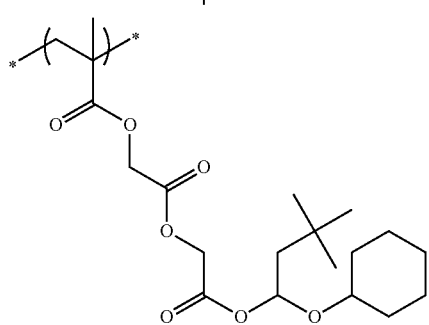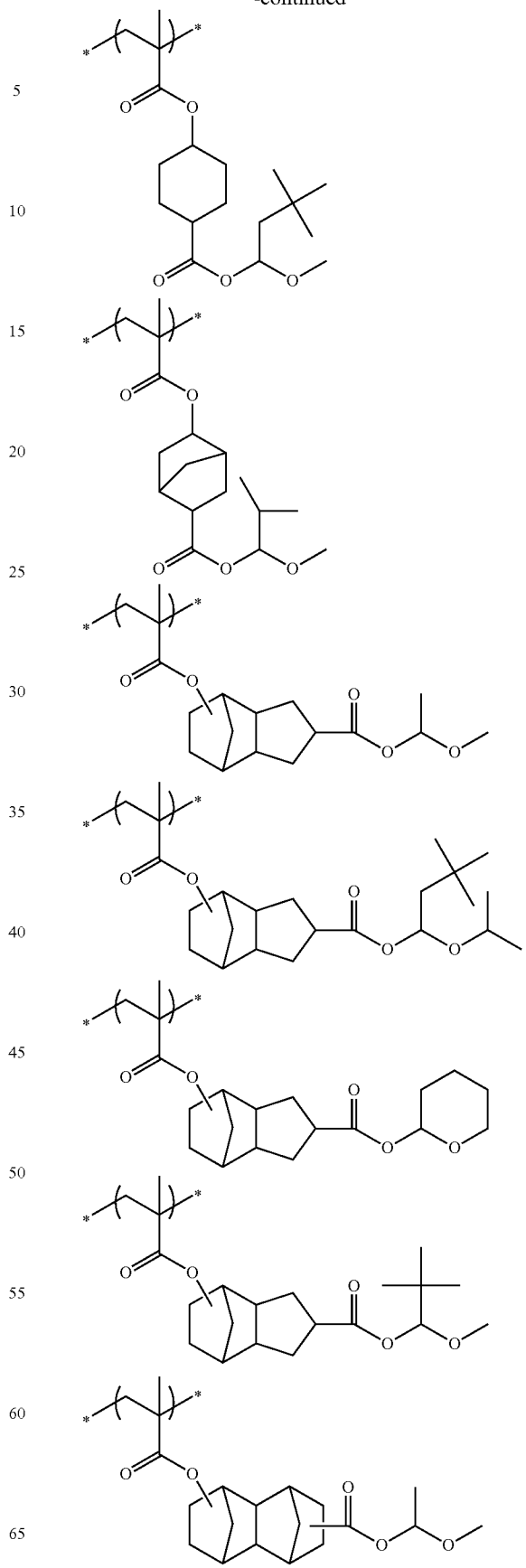

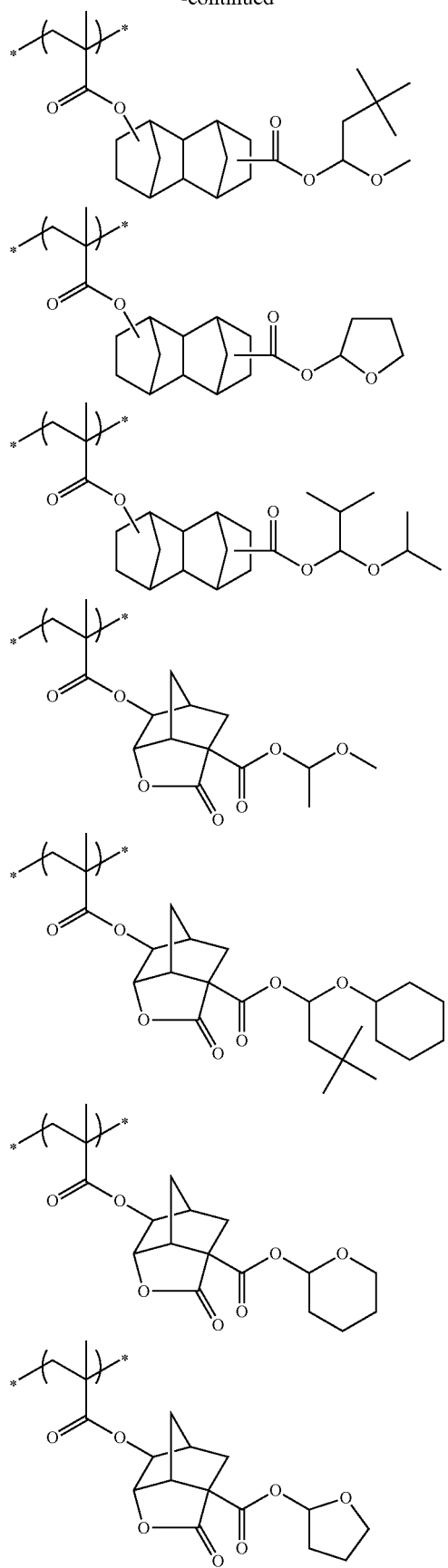
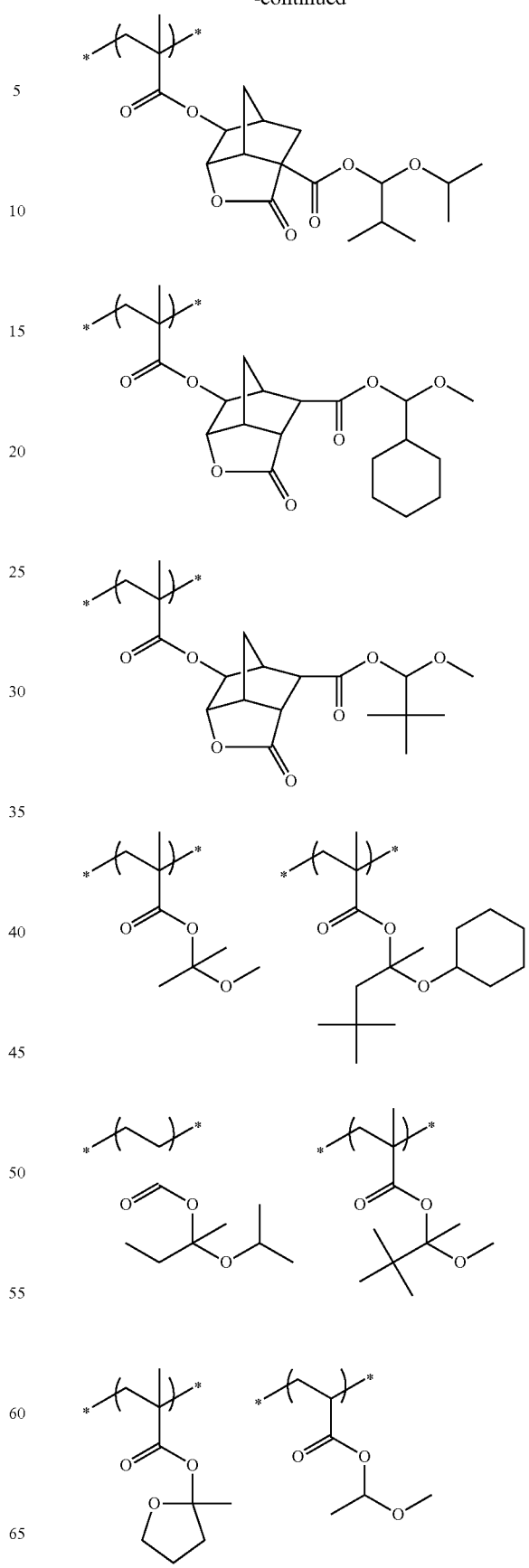

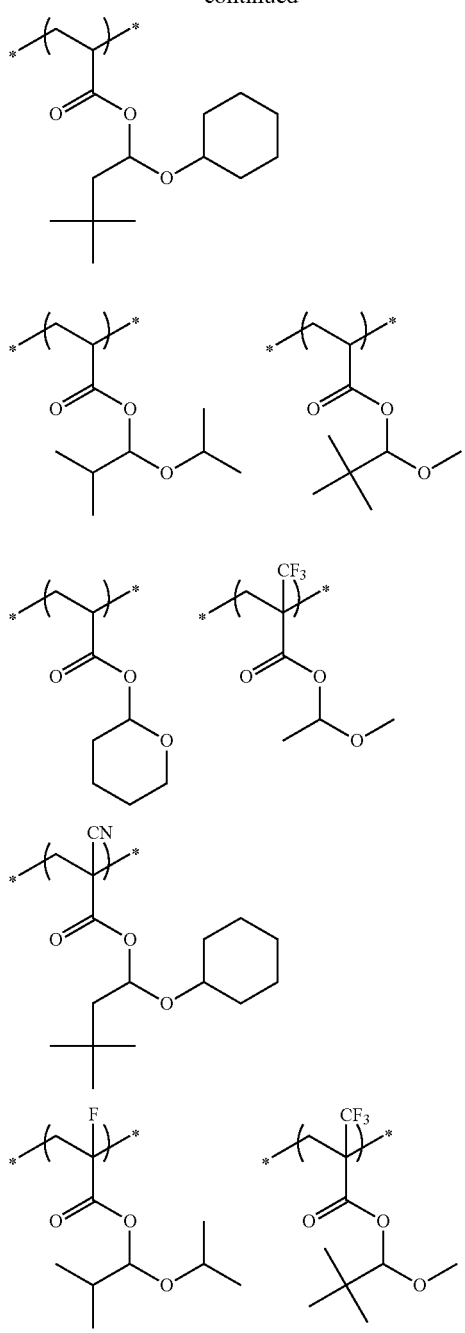
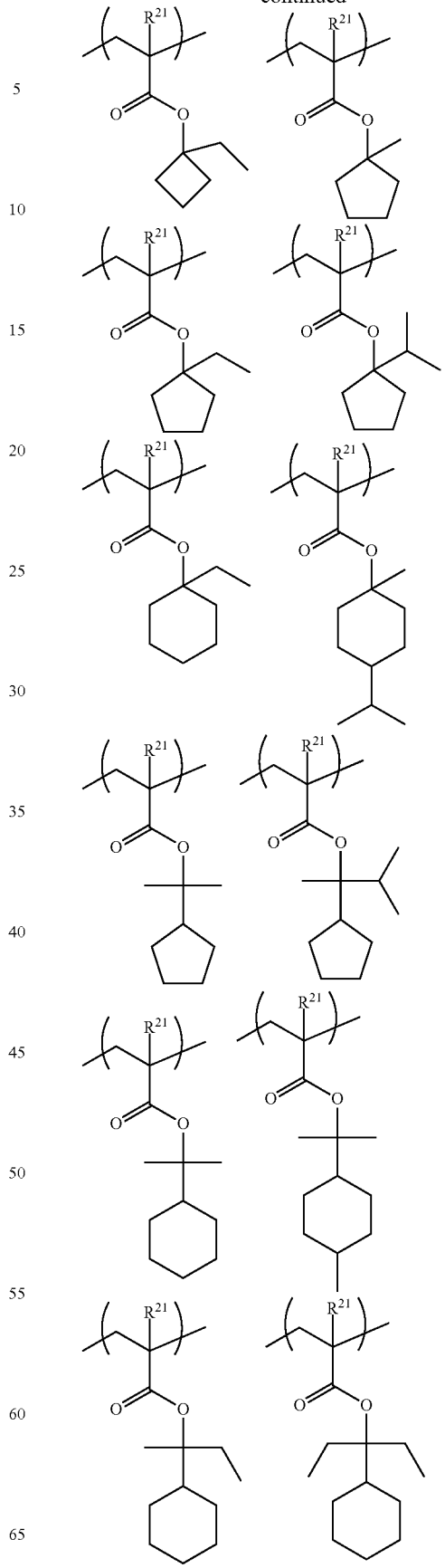
In the structures shown below, $R^{21}$ has the same definition as that for $R^1$ in Formula ($B^1$-1).
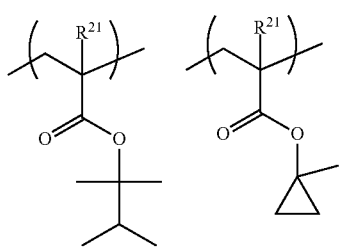

-continued

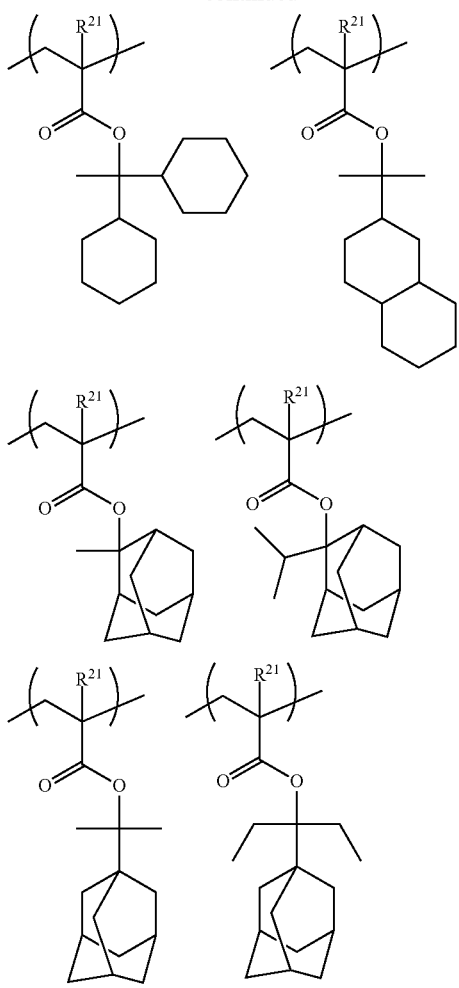

As particularly preferred examples of the repeating unit (a1), the following repeating units are exemplified. Among those, (a1-1) and (a1-2) are particularly preferable as repeating units represented by Formula (1). As a repeating unit represented by Formula (B¹-1), (a1-3) is preferable. As a repeating unit represented by Formula (B1-2), (a1-4) is preferable.

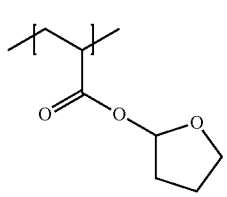
(a1-1)

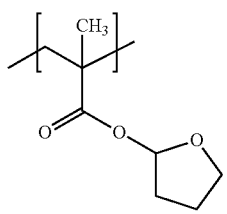
(a1-2)

-continued

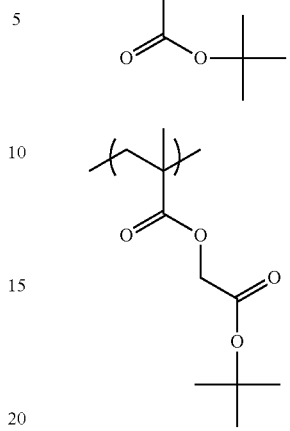
(a1-3)

(a1-4)

In all monomer units constituting the specific resin A, the content of monomer units forming the repeating unit (a1) is preferably in a range of 5% by mole to 80% by mole, more preferably in a range of 10% by mole to 70% by mole, and particularly preferably in a range of 10% by mole to 60% by mole. When the repeating unit (a1) is contained in the above-described proportion, a photosensitive resin composition which has high sensitivity and whose exposure latitude is wide can be obtained. The specific resin A may contain one kind of repeating unit (a1) or may contain two or more kinds of repeating unit (a1).

Constituent Unit (a3) Having Crosslinking Group

The specific resin A in the present invention may include a constituent unit having a crosslinking group (hereinafter, also appropriately referred to as a "constituent unit (a3)"). In regard to the details of the crosslinking group, the description in paragraphs "0032" to "0046" of JP2011-209692A can be referred to and these contents are incorporated in the specification of the present application.

As the specific resin A used in the present invention, an embodiment which includes the constituent unit (a3) having a crosslinking group is also preferable, but a configuration in which substantially no constituent units (a3) having a crosslinking group are contained is preferable. When the above-described configuration is formed, effective removal becomes possible after patterning. Here, the term "substantially" indicates 3% by mole or less and preferably 1% by mole with respect to all repeating units of the specific resin A.

Other Constituent Units (a2)

The specific resin A may contain other constituent units (a2) (hereinafter, also appropriately referred to as a "constituent unit (a2)") within a range not disturbing the effects of the present invention.

As a radical polymerizable monomer used to form the constituent unit (a2), compounds described in paragraphs "0021" to "0024" of JP2004-264623 can be exemplified.

Preferred examples of the constituent unit (a2) include a constituent unit derived from at least one selected from a group consisting of hydroxyl group-containing unsaturated carboxylic acid esters, alicyclic structure-containing unsaturated carboxylic acid esters, styrene, and N-substituted maleimide.

In addition, a constituent unit containing an acid group is exemplified. Examples of the acid group include a carboxyl group, a sulfonic acid group, and a phosphoric acid group, and a carboxyl group is preferable.

Among these, alicyclic structure-containing (meth)acrylic acid esters such as benzyl (meth)acrylate, tricyclo[5.2.1.0$^{2,6}$]decane-8-yl (meth)acrylate, tricyclo[5.2.1.0$^{2,6}$]decane-8-yloxyethyl (meth)acrylate, isobornyl (meth)acrylate, cyclohexyl (meth)acrylate, or 2-methylcyclohexyl (meth)acrylate; (meth)acrylic acids; and a hydrophobic monomer such as styrene are preferable. From a viewpoint of sensitivity, 2-hydroxyethyl (meth)acrylate and N-substituted maleimide (meth)acrylates are preferable. Among these, (meth)acrylic acid esters having an alicyclic structure are more preferable. Further, from a viewpoint of ethylene resistance, styrenes such as styrene and α-methylstyrene are preferable.

These constituent units (a2) can be used alone or in combination of two or more kinds thereof. Preferred examples of the combination of two or more kinds of constituent unit (a2) include a combination of a constituent unit derived from an alicyclic structure-containing unsaturated carboxylic acid and a constituent unit derived from (meth)acrylic acid.

In all monomers constituting the specific resin A, the content of the monomer units that form the constituent unit (a2) in a case where the constituent unit (a2) is contained is preferably 1% by mole to 60% by mole, more preferably in a range of 5% by mole to 50% by mole, and particularly preferably in a range of 5% by mole to 40% by mole.

The weight average molecular weight of the specific resin A in the present invention is preferably in a range of 1,000 to 100,000 and more preferably in a range of 2,000 to 50,000.

Moreover, various methods in regard to a synthesis method of the specific resin A are known. As an example thereof, the specific resin A can be synthesized by polymerizing a radical polymerizable monomer mixture containing radical polymerizable monomers used to form at least a repeating unit (a1) and a constituent unit (a2) in an organic solvent using a radical polymerization initiator.

In addition, as the specific resin, a copolymer obtained by adding 2,3-dihydrofuran to an acid anhydride group in a precursor copolymer formed by copolymerizing unsaturated polyvalent carboxylic anhydrides in a temperature range of room temperature (25° C.) to 100° C. in the absence of an acid catalyst is preferable.

In the present invention, the following resins are shown as preferred examples of the specific resin A.

BzMA/THFMA/t-BuMA (molar ratio: 20 to 60:35 to 65:5 to 30)

BzMA/THFAA/t-BuMA (molar ratio: 20 to 60:35 to 65:5 to 30)

BzMA/THPMA/t-BuMA (molar ratio: 20 to 60:35 to 65:5 to 30)

BzMA/PEES/t-BuMA (molar ratio: 20 to 60:35 to 65:5 to 30)

BzMA/t-BuMA/MA (molar ratio: 20 to 60:35 to 65:5 to 30)

PMA/t-BuMA/MA (molar ratio: 20 to 60:35 to 65:5 to 30)

The content of the specific resin A in the photosensitive resin composition of the present invention is preferably in a range of 20% by mass to 99% by mass, more preferably in a range of 40% by mass to 99% by mass, and still more preferably in a range of 70% by mass to 99% by mass with respect to total solid contents of the photosensitive resin composition. When the content thereof is in the above-described range, pattern formability at the time of development becomes excellent. Only one specific resin A or two or more kinds of specific resin may be included.

Moreover, resins other than the specific resin A may be combined with the photosensitive resin composition of the present invention within a range not disturbing the effects of the present invention. In this case, it is preferable that the content of the resins other than specific resin A is smaller than the content of the specific resin A from a viewpoint of developability.

Photoacid generator which is decomposed in an amount of 80% by mole or greater when exposed to light under a condition of 100 mJ/cm$^2$ or greater at a wavelength of 365 nm The photosensitive resin composition of the present invention contains a photoacid generator (specific photoacid generator) which is decomposed in an amount of 80% by mole or greater when exposed to light under the condition of 100 mJ/cm$^2$ or greater at a wavelength of 365 nm.

The decomposition ratio of the specific photoacid generator can be acquired by forming a chemically amplified photosensitive resin composition having a film thickness of 700 nm on a silicon wafer, heating the wafer at 100° C. for 1 minute, exposing the wafer to light under the condition of 100 mJ/cm$^2$ at a wavelength of 365 nm, and immersing the substrate, heated at 100° C. for 1 minute, in a solution having a ratio of "methanol/THF=50/50" for 10 minutes while ultrasonic waves are applied thereto. The decomposition rate of the photoacid generator can be acquired through calculation using the following formula by analyzing an extract with HPLC.

Decomposition rate (%)=Amount of decomposition product (mol)/Feed amount (mol)×100

The specific photoacid generator used in the present invention is not particularly limited as long as 80% by mole or greater thereof is decomposed when exposed to light under the condition of 100 mJ/cm$^2$ or greater at a wavelength of 365 nm, and it is preferable that 85% by mole or greater thereof is decomposed when exposed to light under the condition of 100 mJ/cm$^2$ to 200 mJ/cm$^2$.

As the specific photoacid generator, a non-ionic photoacid generator which generates an acid having a pKa of −6 or less using irradiation with active rays or radiation and whose molar absorption coefficient at a wavelength of 365 nm is 4000 L/(mol·cm) or greater is preferable, a non-ionic photoacid generator which generates an acid having a pKa of −6 or less using irradiation with active rays or radiation and whose molar absorption coefficient at a wavelength of 365 nm is 5000 L/(mol·cm) or greater is more preferable, and a non-ionic photoacid generator which generates an acid having a pKa of −6 or less using irradiation with active rays or radiation and whose molar absorption coefficient at a wavelength of 365 nm is 6000 L/(mol·cm) or greater is still more preferable.

It is preferable that the specific photoacid generator is a non-ionic photoacid generator. In addition, the specific photoacid generator is a compound which includes a fluoroalkyl group chain having 2 or 3 carbon atoms and is preferably a compound which includes a fluoroalkyl group having 3 or less carbon atoms and generates sulfonic acid using irradiation with active rays and/or radiation. The fluoroalkyl group may be linear, branched, or cyclic, but it is preferable that the fluoroalkyl group is linear.

It is preferable that the specific photoacid generator used in the present invention is a compound including an oxime sulfonate group (hereinafter, simply referred to as an oxime sulfonate compound). Further, it is also preferable that the photoacid generator is a compound including an imide sulfonate group.

<Oxime Sulfonate Compound>

The oxime sulfonate compound is not particularly limited as long as the compound includes an oxime sulfonate group, and it is preferable that the oxime sulfonate compound is an oxime sulfonate compound represented by the following Formula (2), or (OS-103), (OS-104), (OS-105) or Formula (4) shown below.

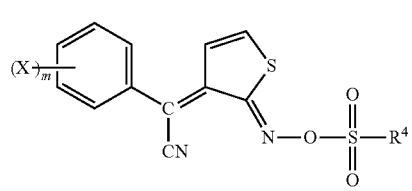

(2)

X's in Formula (2) each independently represent an alkyl group, an alkoxy group, or a halogen atom.

The alkyl group and the alkoxy group as X may include a substituent. As the alkyl group as X described above, a linear or branched alkyl group having 1 to 4 carbon atoms is preferable. As the alkoxy group as X described above, a linear or branched alkoxy group having 1 to 4 carbon atoms is preferable. As the halogen atom as X, a chlorine atom or a fluorine atom is preferable.

m in Formula (2) represents an integer of 0 to 3, and 0 or 1 is preferable. When m represents 2 or 3, a plurality of X's may be the same as or different from each other.

$R^4$ in Formula (2) represents an alkyl group or an aryl group. It is preferable that $R^4$ represents an alkyl group having 1 to 10 carbon atoms, an alkoxy group having 1 to 10 carbon atoms, a halogenated alkyl group having 1 to 5 carbon atoms, a halogenated alkoxy group having 1 to 5 carbon atoms, a phenyl group which may be substituted with W, a naphthyl group which may be substituted with W, or an anthranyl group which may be substituted with W. W represents a halogen atom, a cyano group, a nitro group, an alkyl group having 1 to 10 carbon atoms, an alkoxy group having 1 to 10 carbon atoms, a halogenated alkyl group having 1 to 5 carbon atoms, or a halogenated alkoxy group having 1 to 5 carbon atoms.

Specific examples of the alkyl group having 1 to 10 carbon atoms as $R^4$ include a methyl group, an ethyl group, an n-propyl group, an i-propyl group, an n-butyl group, an i-butyl group, an s-butyl group, a t-butyl group, an n-amyl group, an i-amyl group, an s-amyl group, an n-hexyl group, an n-heptyl group, an n-octyl group, an n-nonyl group, and an n-decyl group.

Specific examples of the alkoxy group having 1 to 10 carbon atoms as $R^4$ include a methoxy group, an ethoxy group, an n-propoxy group, an i-propoxy group, an n-butoxy group, an n-amyloxy group, an n-octyloxy group, and an n-decyloxy group.

Specific examples of the halogenated alkyl group having 1 to 5 carbon atoms as $R^4$ include a trifluoromethyl group, a pentafluoroethyl group, a perfluoro-n-propyl group, a perfluoro-n-butyl group, and a perfluoro-n-amyl group.

Specific examples of the halogenated alkoxy group having 1 to 5 carbon atoms as $R^4$ include a trifluoromethoxy group, a pentafluoroethoxy group, a perfluoro-n-propoxy group, a perfluoro-n-butoxy group, and a perfluoro-n-amyloxy group.

Specific examples of the phenyl group which can be substituted with W as $R^4$ include an o-tolyl group, an m-tolyl group, a p-tolyl group, an o-ethylphenyl group, an m-ethylphenyl group, a p-ethylphenyl group, a p-(n-propyl)phenyl group, a p-(i-propyl)phenyl group, a p-(n-butyl)phenyl group, a p-(i-butyl)phenyl group, a p-(s-butyl)phenyl group, a p-(t-butyl)phenyl group, a p-(n-amyl)phenyl group, a p-(i-amyl)phenyl group, a p-(t-amyl)phenyl group, an o-methoxyphenyl group, an m-methoxyphenyl group, a p-methoxyphenyl group, an o-ethoxyphenyl group, an m-ethoxyphenyl group, a p-ethoxyphenyl group, a p-(n-propopxy)phenyl group, a p-(i-propoxy)phenyl group, a p-(n-butoxy)phenyl group, a p-(i-butoxy)phenyl group, a p-(s-butoxy)phenyl group, a p-(t-butoxy)phenyl group, a p-(n-amyloxy)phenyl group, a p-(i-amyloxy)phenyl group, a p-(t-amyloxy)phenyl group, a p-chlorophenyl group, a p-bromophenyl group, a p-fluorophenyl group, a 2,4-dichlorophenyl group, a 2,4-dibromophenyl group, a 2,4-difluorophenyl group, a 2,4,6-dichlorophenyl group, a 2,4,6-tribromophenyl group, a 2,4,6-trifluorophenyl group, a pentachlorophenyl group, a pentabromophenyl group, a pentafluorophenyl group, and a p-biphenylyl group.

Specific examples of the naphthyl group which can be substituted with W as $R^4$ include a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, an 8-methyl-1-naphthyl group, a 1-methyl-2-naphthyl group, a 3-methyl-2-naphthyl group, a 4-methyl-2-naphthyl group, a 5-methyl-2-naphthyl group, a 6-methyl-2-naphthyl group, a 7-methyl-2-naphthyl group, and an 8-methyl-2-naphthyl group.

Specific examples of the anthranyl group which can be substituted with W as $R^4$ include a 2-methyl-1-anthranyl group, a 3-methyl-1-anthranyl group, a 4-methyl-1-anthranyl group, a 5-methyl-1-anthranyl group, a 6-methyl-1-anthranyl group, a 7-methyl-1-anthranyl group, an 8-methyl-1-anthranyl group, a 9-methyl-1-anthranyl group, a 10-methyl-1-anthranyl group, a 1-methyl-2-anthranyl group, a 3-methyl-2-anthranyl group, a 4-methyl-2-anthranyl group, a 5-methyl-2-anthranyl group, a 6-methyl-2-anthranyl group, a 7-methyl-2-anthranyl group, an 8-methyl-2-anthranyl group, a 9-methyl-2-anthranyl group, and a 10-methyl-2-anthranyl group.

In Formula (2), a compound in which m represents 1, X represents a methyl group, a substitution position of X is an ortho-position, and $R^4$ represents a linear alkyl group having 1 to 10 carbon atoms, a 7,7-dimethyl-2-oxonorbornylmethyl group, or a p-toluyl group is particularly preferable.

Specific examples of the oxime sulfonate compound represented by Formula (2) include a compound (i), a compound (ii), a compound (iii), and a compound (iv). These compounds may be used alone or in combination of two or more kinds thereof. The compounds (i) to (iv) can be obtained as commercially available products. In addition, specific examples of other oxime sulfonate compounds represented by Formula (2) will be shown below.

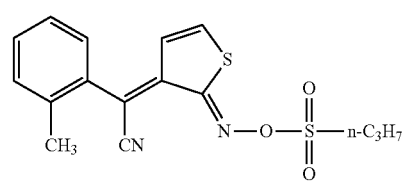

(i)

-continued
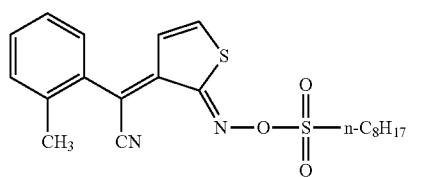
(ii)
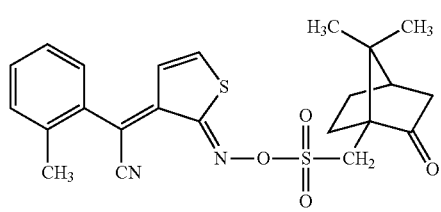
(iii)
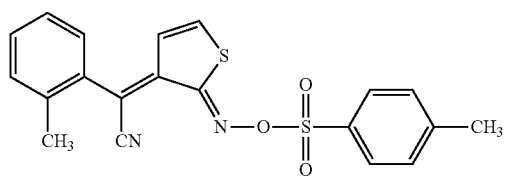
(iv)
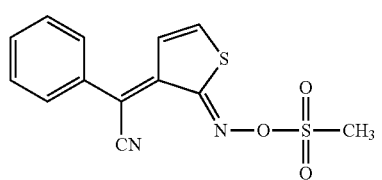
OS-1
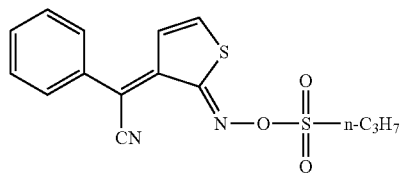
OS-2
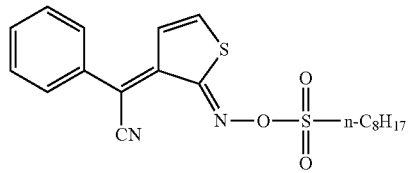
OS-3
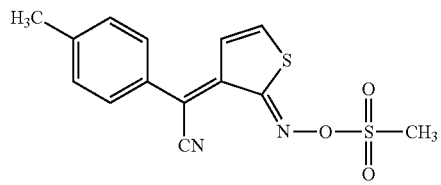
OS-4
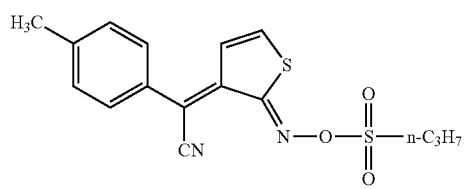
OS-5
-continued
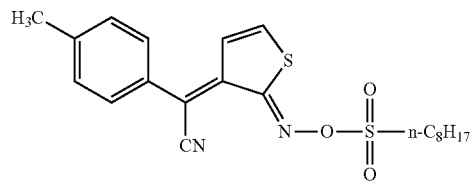
OS-6
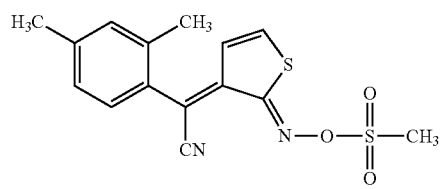
OS-7
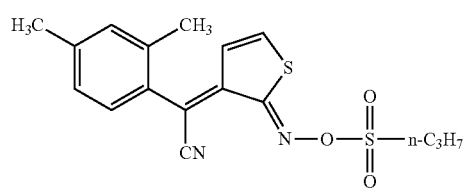
OS-8
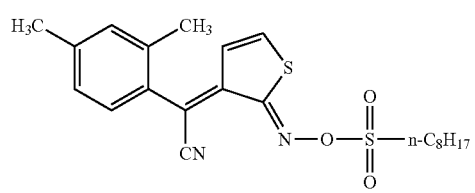
OS-9
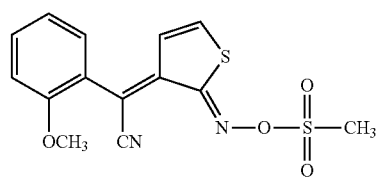
OS-10
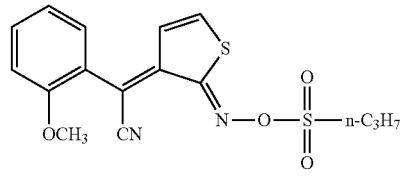
OS-11
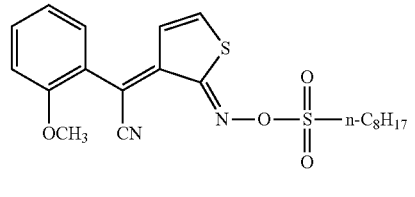
OS-12
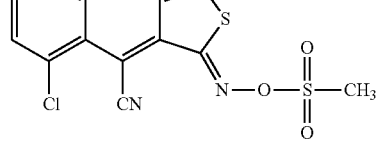
OS-13

-continued
OS-14
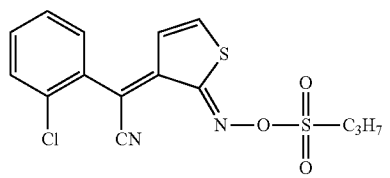
OS-15
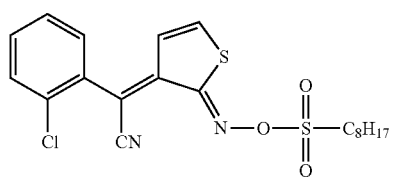
OS-16
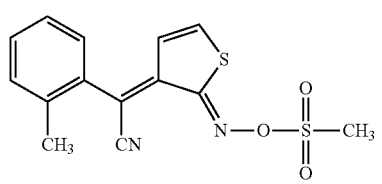
OS-17
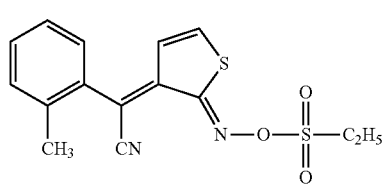
OS-18
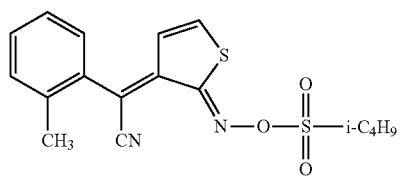
OS-19
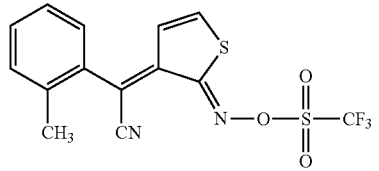
OS-20
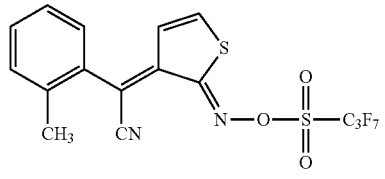
OS-21
-continued
OS-22
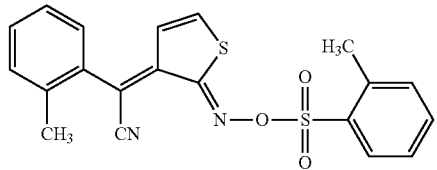
OS-23
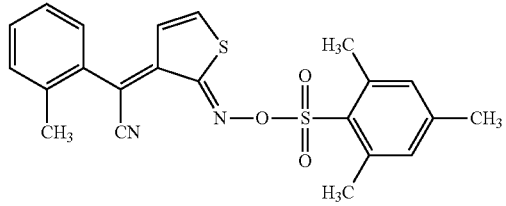
OS-24
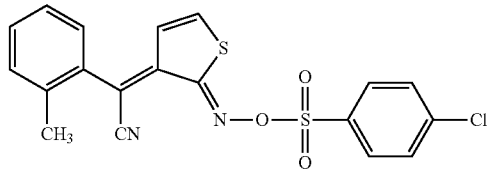
OS-25
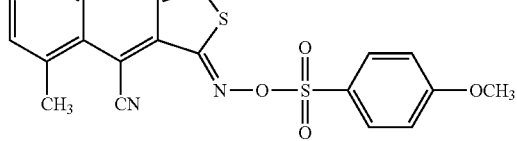
OS-26
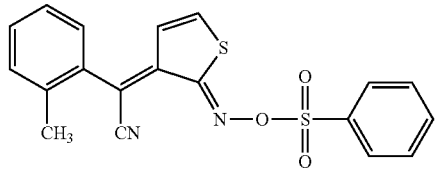
OS-27
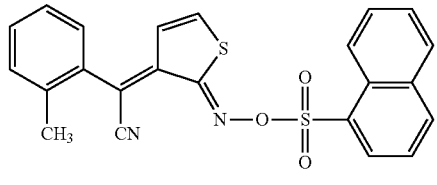
OS-28
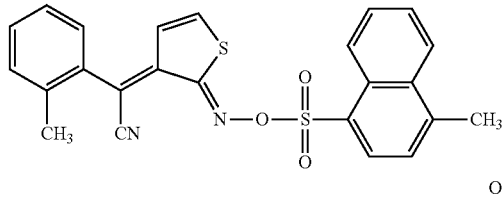
OS-29
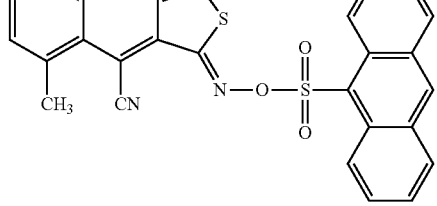

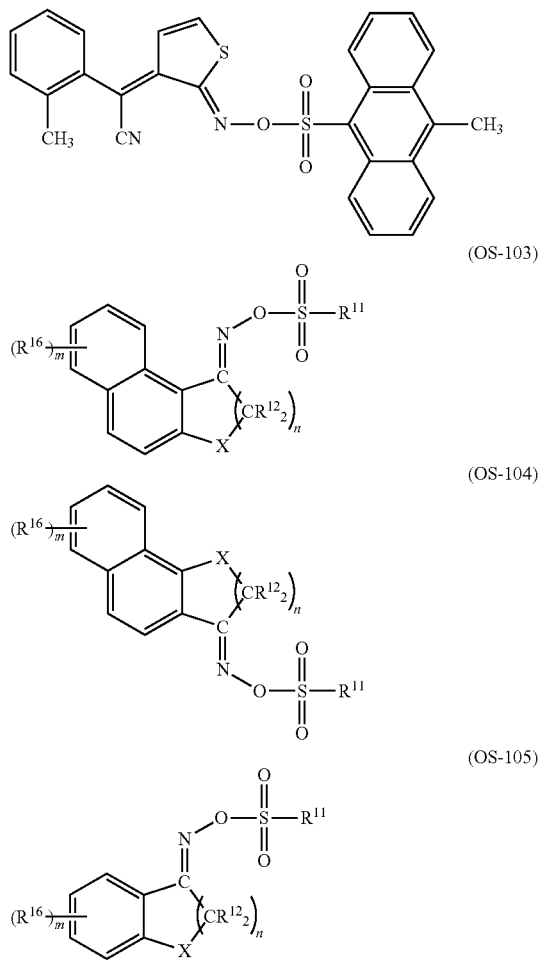

(In Formulae (OS-103) to (OS-105), $R^{11}$ represents an alkyl group, an aryl group, or a heteroaryl group; a plurality of $R^{12}$'s each independently represent a hydrogen atom, an alkyl group, an aryl group, or a halogen atom; a plurality of $R^{16}$'s each independently represent a halogen atom, an alkyl group, an alkyloxy group, a sulfonic acid group, an aminosulfonyl group, or an alkoxysulfonyl group; X represents O or S; n represents 1 or 2; and m represents an integer of 0 to 6.)

In Formula (OS-103) to (OS-105), the alkyl group, the aryl group, or the heteroaryl group represented by $R^{11}$ may include a substituent.

In Formulae (OS-103) to (OS-105), it is preferable that the alkyl group represented by $R^{11}$ is an alkyl group which may include a substituent and has 1 to 30 carbon atoms.

Examples of the substituent which may be included in the alkyl group represented by $R^{11}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), examples of the alkyl group represented by $R^{11}$ include a methyl group, an ethyl group, an n-propyl group, an i-propyl group, an n-butyl group, an s-butyl group, a t-butyl group, an n-pentyl group, an n-hexyl group, an n-octyl group, an n-decyl group, an n-dodecyl group, a trifluoromethyl group, a perfluoropropyl group, a perfluorohexyl group, and a benzyl group.

In Formulae (OS-103) to (OS-105), as the aryl group represented by $R^{11}$, an aryl group which may include a substituent and has 6 to 30 carbon atoms is preferable.

Examples of the substituent which may be included in the aryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

Examples of the aryl group represented by $R^{11}$ include a phenyl group, a p-methylphenyl group, a p-chlorophenyl group, a pentachlorophenyl group, a pentafluorophenyl group, an o-methoxyphenyl group, and a p-phenoxyphenyl group.

In Formulae (OS-103) to (OS-105), as the heteroaryl group represented by $R^{11}$, a heteroaryl group which may include a substituent and has 4 to 30 carbon atoms is preferable.

Examples of the substituent which may be included in the heteroaryl group represented by $R^{11}$ include a halogen atom, an alkyl group, an alkyloxy group, an aryloxy group, an alkylthio group, an arylthio group, an alkyloxycarbonyl group, an aryloxycarbonyl group, an aminocarbonyl group, a sulfonic acid group, an aminosulfonyl group, and an alkoxysulfonyl group.

In Formulae (OS-103) to (OS-105), the heteroaryl group represented by $R^{11}$ may include at least one heteroaromatic ring and, for example, a heteroaromatic ring and a benzene ring may be condensed.

The heteroaryl group represented by $R^{11}$ may include a substituent. A group obtained by removing one hydrogen atom from a ring selected from a group consisting of a thiophene ring, a pyrrole ring, a thiazole ring, an imidazole ring, a furan ring, a benzothiophene ring, a benzothiazole ring, and a benzimidazole ring is exemplified.

In Formulae (OS-103) to (OS-105), it is preferable that $R^{12}$ represents a hydrogen atom, an alkyl group, or an aryl group and more preferable that $R^{12}$ represents a hydrogen atom or an alkyl group.

In Formulae (OS-103) to (OS-105), among two or more $R^{12}$'s existing in a compound, it is preferable that one or two $R^{12}$'s represent an aryl group or a halogen atom, more preferable that one $R^{12}$ represents an alkyl group, an aryl group, or a halogen atom, and particularly preferable that one $R^{12}$ represents an alkyl group and the rest represent a hydrogen atom.

In Formulae (OS-103) to (OS-105), the alkyl group or the aryl group represented by $R^{12}$ may include a substituent.

Examples of the substituent which may be included in the alkyl group or the aryl group represented by $R^{12}$ are the same as those of the substituent which may be included in the alkyl group or the aryl group represented by $R^1$.

In Formulae (OS-103) to (OS-105), as the alkyl group represented by $R^{12}$, an alkyl group which may include a substituent and has 1 to 12 carbon atoms is preferable and an alkyl group which may include a substituent and has 1 to 6 carbon atoms is more preferable.

As the alkyl group represented by $R^{12}$, a methyl group, an ethyl group, an n-propyl group, an i-propyl group, an n-butyl group, an i-butyl group, an s-butyl group, an n-hexyl group, an allyl group, a chloromethyl group, a bromomethyl group, a methoxymethyl group, or a benzyl group is preferable; a methyl group, ethyl group, an n-propyl group, an i-propyl group, an n-butyl group, an i-butyl group, an s-butyl group, or an n-hexyl group is more preferable; a methyl group, an ethyl group, an n-propyl group, an n-butyl group, or an n-hexyl group is still more preferable; and a methyl group is particularly preferable.

In Formulae (OS-103) to (OS-105), as the aryl group represented by $R^{12}$, an aryl group which may include a substituent and has 6 to 30 carbon atoms is preferable.

Preferred examples of the aryl group represented by $R^{12}$ include a phenyl group, a p-methylphenyl group, an o-chlorophenyl group, a p-chlorophenyl group, an o-methoxyphenyl group, and a p-phenoxyphenyl group.

Examples of the halogen atom represented by $R^{12}$ include a fluorine atom, a chlorine atom, a bromine atom, and iodine atom. Among these, a chlorine atom or a bromine atom is preferable.

In Formulae (OS-103) to (OS-105), X represents O or S, and it is preferable that X represents O. In Formulae (OS-103) to (OS-105), a ring containing X as a ring member is a 5- or 6-membered ring.

In Formulae (OS-103) to (OS-105), n represents 1 or 2. It is preferable that n represents 1 when X represents O and it is preferable that n represents 2 when X represents S.

In Formulae (OS-103) to (OS-105), the alkyl group and the alkyloxy group represented by $R^{16}$ may include a substituent.

In Formulae (OS-103) to (OS-105), as the alkyl group represented by $R^{16}$, an alkyl group which may include a substituent and has 1 to 30 carbon atoms is preferable.

Examples of the substituent which may be included in the alkyl group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), preferred examples of the alkyl group represented by $R^{16}$ include a methyl group, an ethyl group, an n-propyl group, an i-propyl group, an n-butyl group, an s-butyl group, a t-butyl group, an n-pentyl group, an n-hexyl group, an n-octyl group, an n-decyl group, an n-dedecyl group, a trifluoromethyl group, a perfluoropropyl group, a perfluorohexyl group, and a benzyl group.

In Formulae (OS-103) to (OS-105), as the alkyloxy group represented by $R^{16}$, an alkyloxy group which may include a substituent and has 1 to 30 carbon atoms is preferable.

Examples of the substituent which may be included in the alkyloxy group represented by $R^{16}$ include a halogen atom, an alkyloxy group, an aryloxy group, an alkylthio group, an arylthio group, an alkyloxycarbonyl group, an aryloxycarbonyl group, and an aminocarbonyl group.

In Formulae (OS-103) to (OS-105), as the alkyloxy group represented by $R^{16}$, a methyloxy group, an ethyloxy group, a butyloxy group, a hexyloxy group, a phenoxyethyloxy group, a trichloromethyloxy group, or an ethoxyethyloxy group is preferable.

Examples of the aminosulfonyl group as $R^{16}$ include a methylaminosulfonyl group, a dimethylaminosulfonyl group, a phenylaminosulfonyl group, a methylphenylaminosulfonyl group, and an aminosulfonyl group.

Examples of the alkoxysulfonyl group represented by $R^{16}$ include a methoxysulfonyl group, an ethoxysulfonyl group, a propyloxysulfonyl group, and a butyloxysulfonyl group.

Moreover, in Formulae (OS-103) to (OS-105), m represents an integer of 0 to 6, preferably represents an integer of 0 to 2, more preferably represents 0 or 1, and particularly preferably represents 0.

In addition, it is particularly preferable that the compound represented by Formula (OS-103) is a compound represented by the following Formula (OS-106), (OS-110), or (OS-111), the compound represented by Formula (OS-104) is a compound represented by the following Formula (OS-107), and the compound represented by Formula (OS-105) is a compound represented by the following Formula (OS-108) or (OS-109).

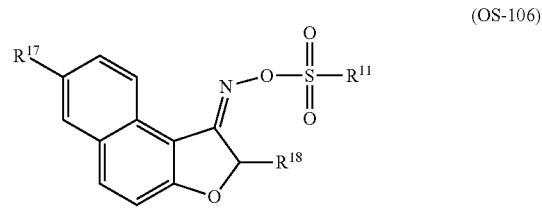
(OS-106)

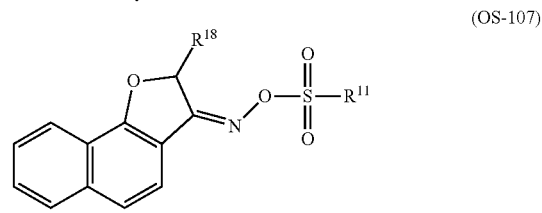
(OS-107)

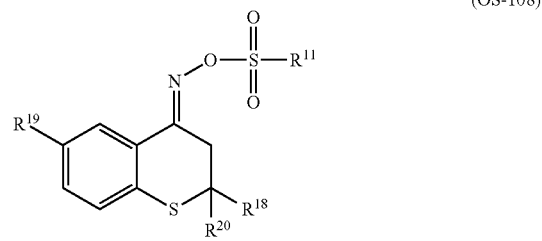
(OS-108)

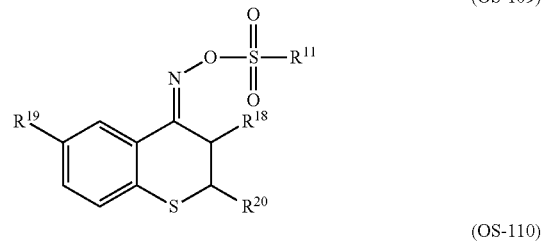
(OS-109)

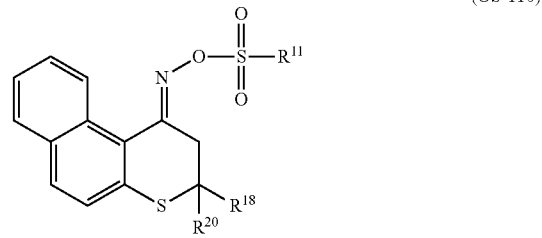
(OS-110)

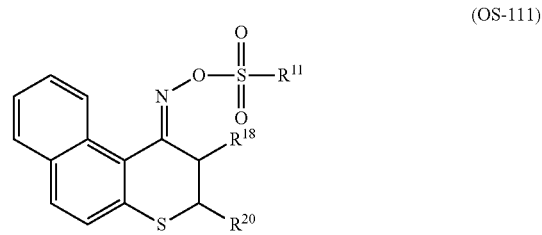
(OS-111)

(In Formulae (OS-106) to (OS-111), $R^{11}$ represents an alkyl group, an aryl group, or a heteroaryl group; $R^{17}$ represents a hydrogen atom or a bromine atom; $R^{18}$ represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group; $R^{19}$ represents a hydrogen atom, a halogen atom, a methyl group, or a methoxy group, and $R^{20}$ represents a hydrogen atom or a methyl group.)

$R^{11}$ in Formulae (OS-106) to (OS-111) has the same definition as that for $R^{11}$ in Formulae (OS-103) to (OS-105) and preferred embodiments are the same as each other.

$R^{17}$ in Formula (OS-106) represents a hydrogen atom or a bromine atom and preferably represents a hydrogen atom.

$R^{18}$ in Formulae (OS-106) to (OS-111) represents a hydrogen atom, an alkyl group having 1 to 8 carbon atoms, a halogen atom, a chloromethyl group, a bromomethyl group, a bromoethyl group, a methoxymethyl group, a phenyl group, or a chlorophenyl group, preferably represents an alkyl group having 1 to 8 carbon atoms, a halogen atom, or a phenyl group, more preferably represents an alkyl group having 1 to 8 carbon atoms, still more preferably represents an alkyl group having 1 to 6 carbon atoms, and particularly preferably represents a methyl group.

$R^{19}$ in Formulae (OS-108) and (OS-109) represents a hydrogen atom, a halogen atom, a methyl group, or a methoxy group and preferably represents a hydrogen atom.

$R^{20}$ in Formulae (OS-108) to (OS-111) represents a hydrogen atom or a methyl group and preferably represents a hydrogen atom.

Moreover, the above-described oxime sulfonate compound may have one or a mixture of oxime steric structures (E, Z).

Specific examples of the oxime sulfonate compounds represented by Formula (OS-103) to (OS-105) include the following exemplary compounds shown below, but the present invention is not limited thereto.

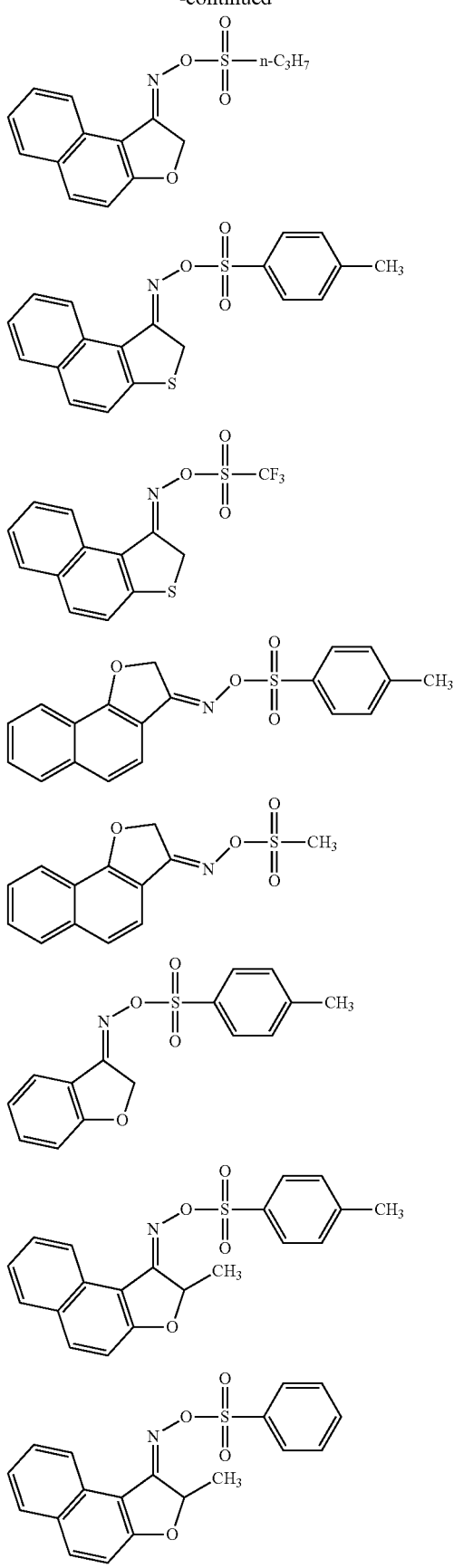

77
-continued
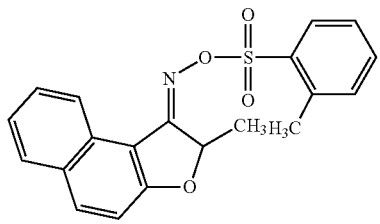
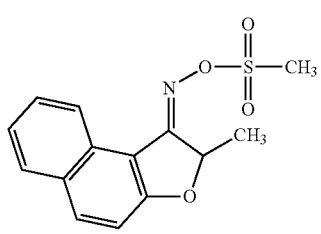
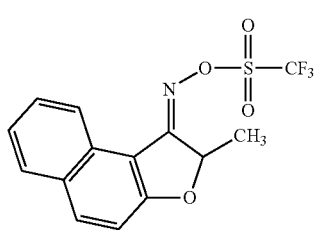
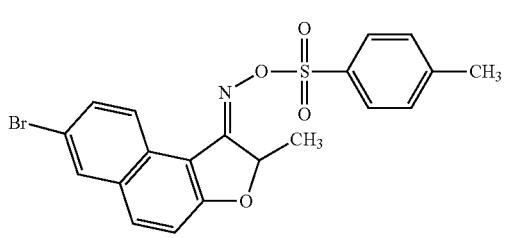
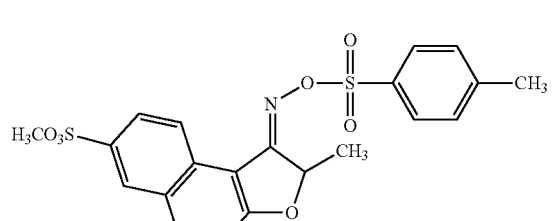
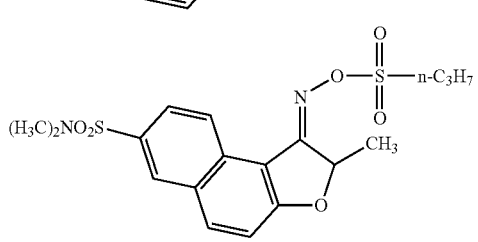
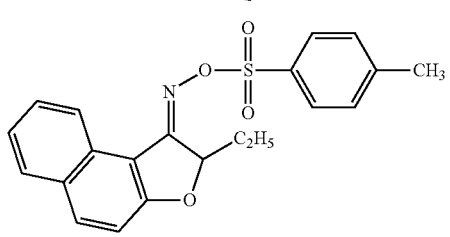
78
-continued
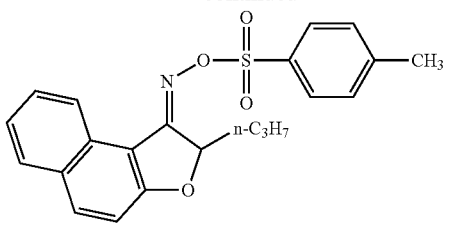
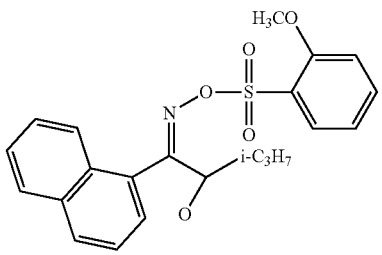
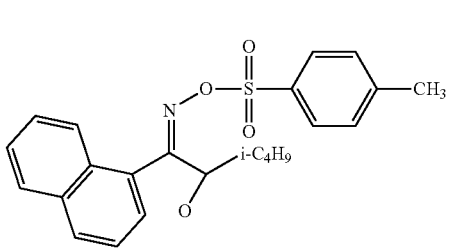
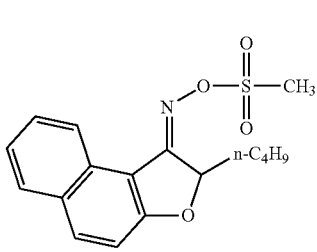
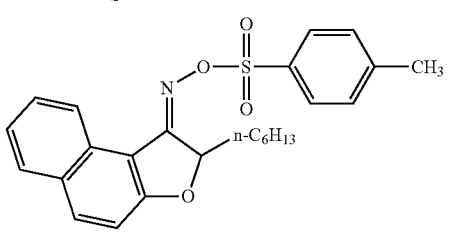
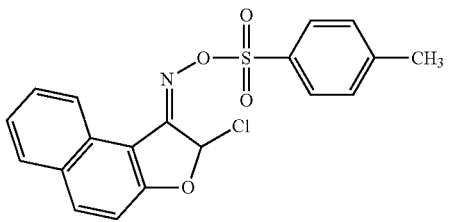
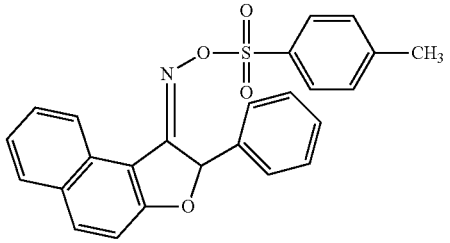

-continued
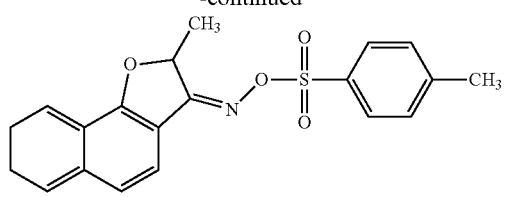
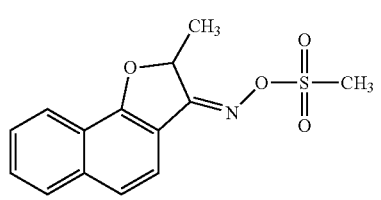
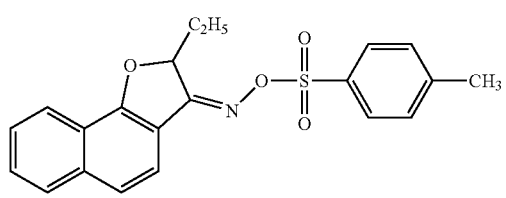
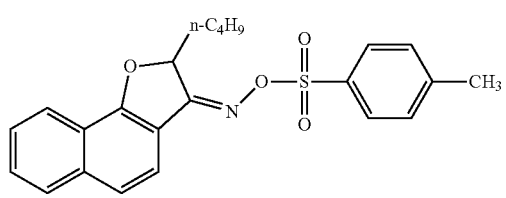
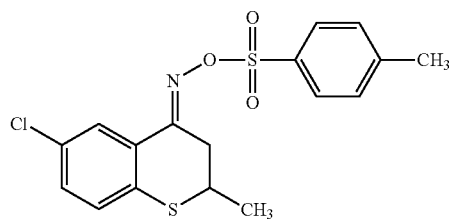
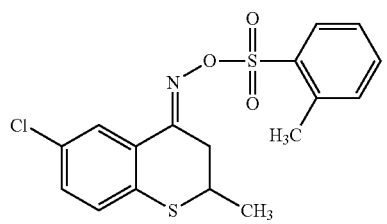
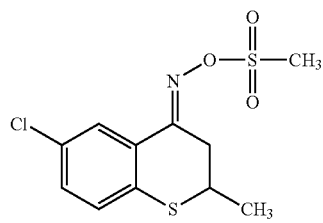
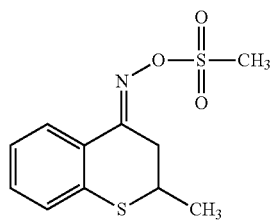
-continued
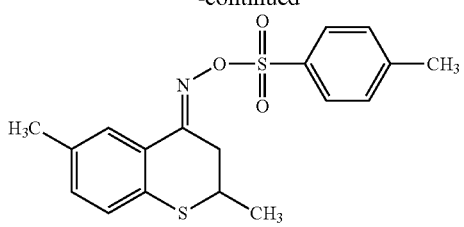
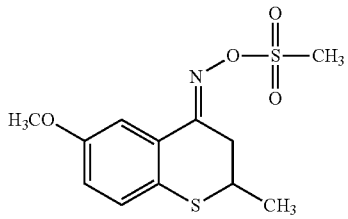
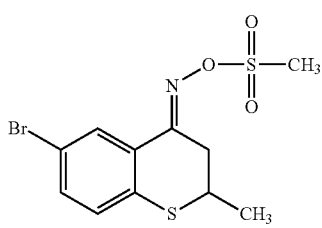
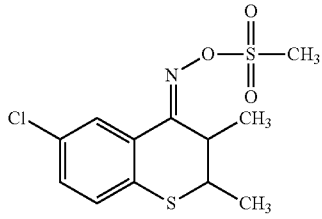
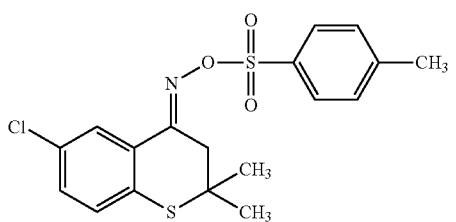
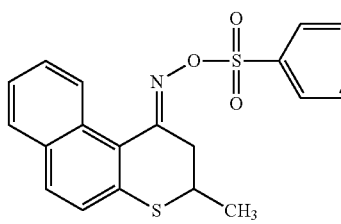
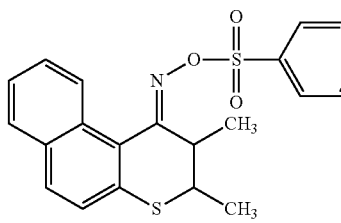

-continued

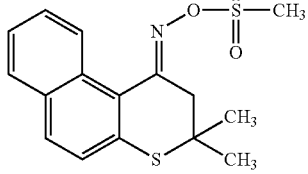

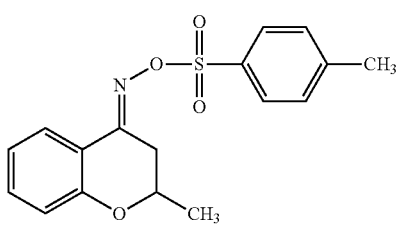

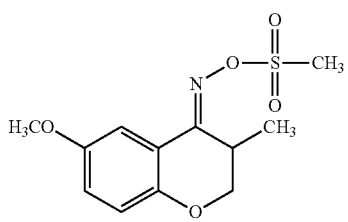

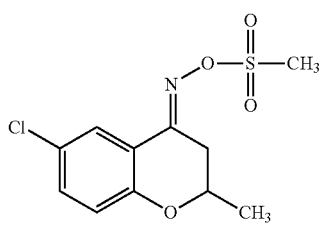

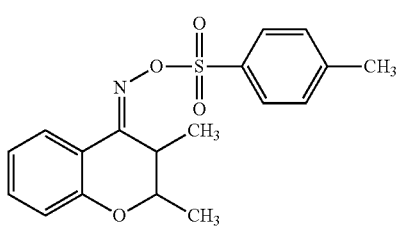

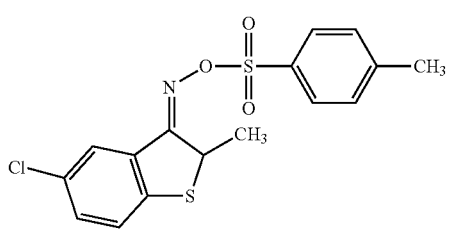

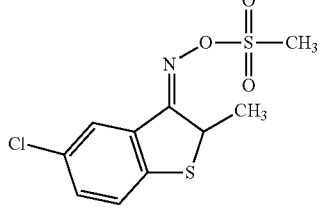

-continued

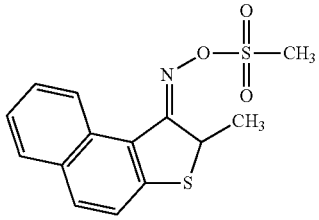

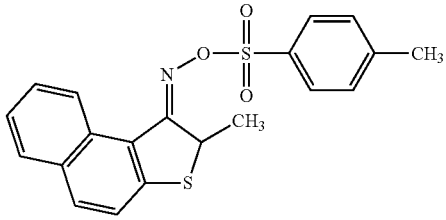

As another preferred embodiment of an oxime sulfonate compound which includes at least one oxime sulfonate group, a compound represented by the following Formula (OS-101) is exemplified.

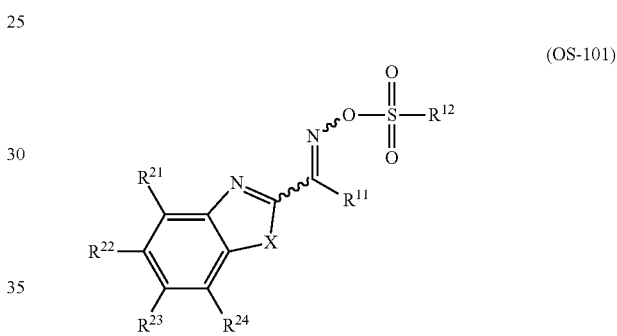

(OS-101)

In Formula (OS-101), $R^{11}$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^{12}$ represents an alkyl group or an aryl group.

X represents —O—, —S—, —NH—, —NR$^{15}$—, —CH$_2$—, —CR$^{16}$H—, or —CR$^{16}$R$^{17}$—, and $R^{15}$ to $R^{17}$ each independently represent an alkyl group or an aryl group.

$R^{21}$ to $R^{24}$ each independently represent a hydrogen atom, a halogen atom, an alkyl group, an alkenyl group, an alkoxy group, an amino group, an alkoxycarbonyl group, an alkylcarbonyl group, an arylcarbonyl group, an amide group, a sulfo group, a cyano group, or an aryl group. Two of $R^{21}$ to $R^{24}$ may be bonded to each other to form a ring.

As $R^{21}$ to $R^{24}$, a hydrogen atom, a halogen atom, or an alkyl group is preferable and an embodiment in which at least two of $R^{21}$ to $R^{24}$ are bonded to each other to form an aryl group is preferably exemplified. Among these, from a viewpoint of sensitivity, an embodiment in which all of $R^{21}$ to $R^{24}$ represent a hydrogen atom is preferable.

Any of the above-described substituents may further include a substituent.

It is more preferable that the compound represented by Formula (OS-101) above is a compound represented by the following Formula (OS-102).

(OS-102)

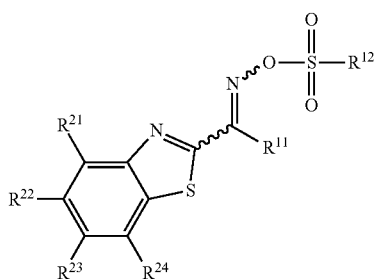

In Formula (OS-102), $R^{11}$, $R^{12}$, and $R^{21}$ to $R^{24}$ respectively have the same definitions as those for $R^{11}$, $R^{12}$, and $R^{21}$ to $R^{24}$ in Formula (SO-101), and preferred examples are the same as each other.

Among these, an embodiment in which $R^{11}$ in Formulae (OS-101) and (OS-102) represents a cyano group or an aryl group is more preferable and an embodiment which is represented by Formula (OS-102) and $R^{11}$ represents a cyano group, a phenyl group, or a naphthyl group is most preferable.

Moreover, the above-described oxime sulfonate compound may have one or a mixture of steric structures (E, Z, and the like) of oxime or a benzothiazole ring.

Hereinafter, specific examples (exemplary compounds b-1 to b-34) of the compounds represented by Formula (OS-101) which can be suitably used in the present invention will be shown, but the present invention is not limited thereto. Further, in the specific examples, Me represents a methyl group, Et represents an ethyl group, Bn represents a benzyl group, and Ph represents a phenyl group.

b-1

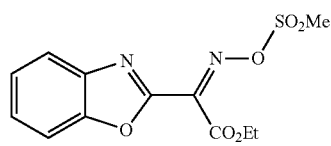

b-2

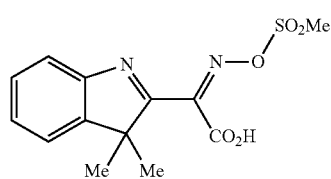

b-3

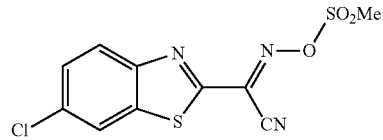

b-4

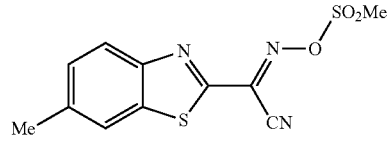

b-5

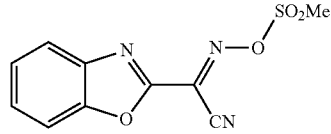

b-6

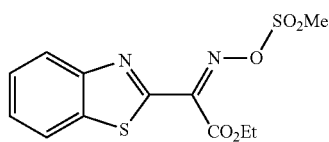

b-7

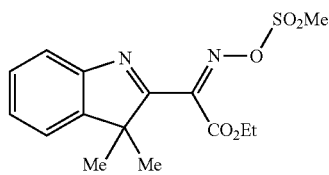

b-8

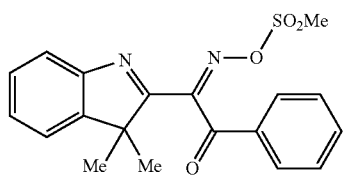

b-9

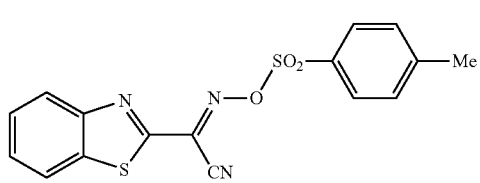

b-10

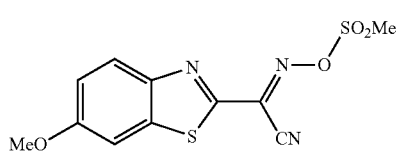

b-11

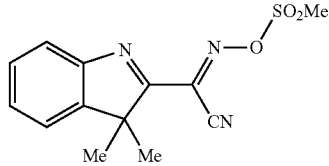

b-12

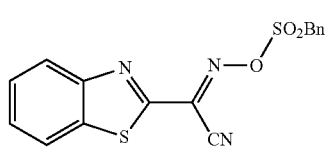

b-13

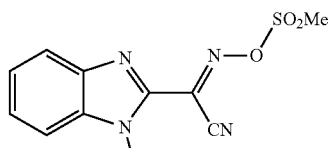

b-14

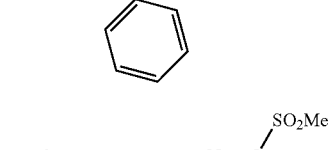

b-15 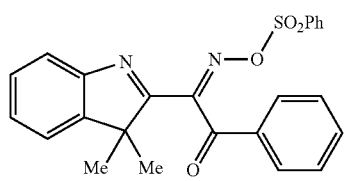
b-16 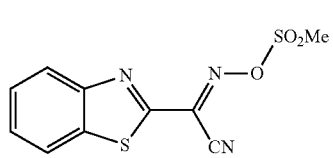
b-17 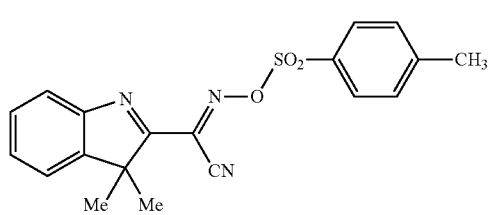
b-18 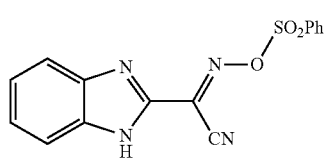
b-19 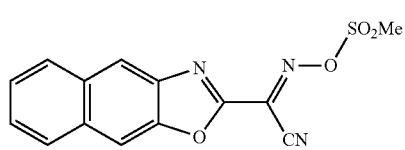
b-20 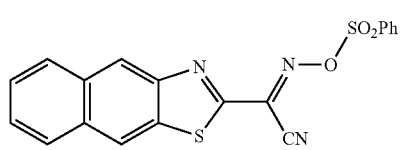
b-21 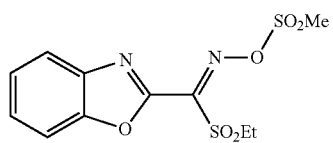
b-22 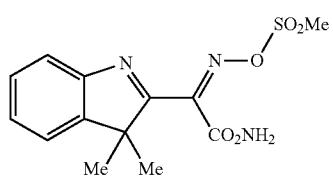
b-23 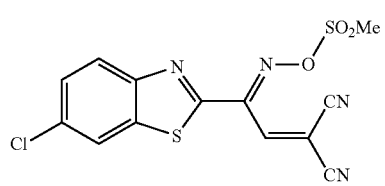
b-24 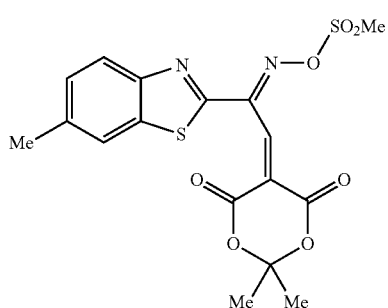
b-25 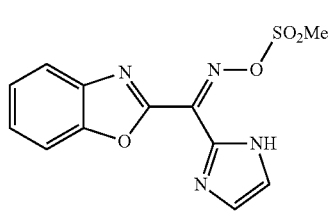
b-26 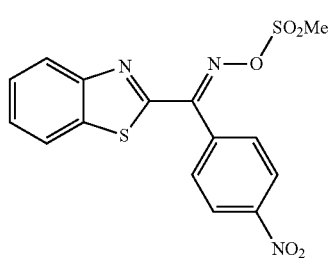
b-27 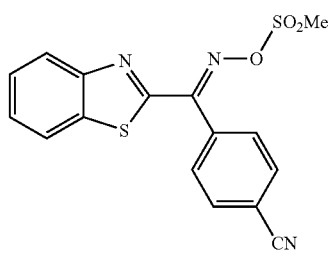
b-28 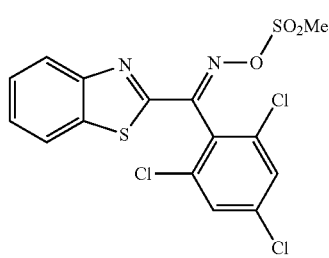
b-29 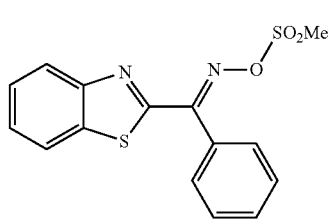

-continued

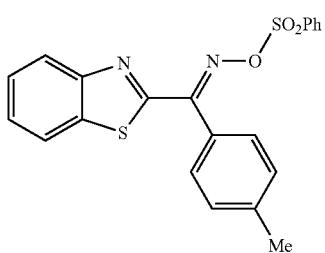
b-30

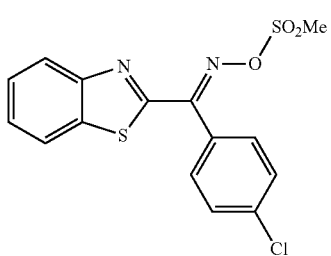
b-31

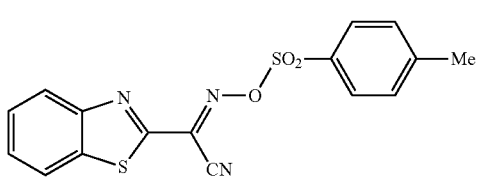
b-32

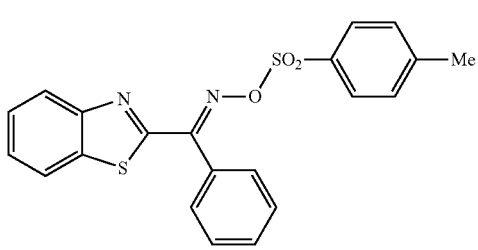
b-33

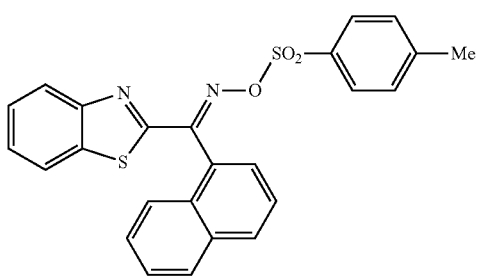
b-34

Among the above-described compounds, from a viewpoint of compatibility of sensitivity and stability, compounds b-9, b-16, b-31, and b-33 are preferable.

Examples of commercially available products thereof include WPAG-336 (manufactured by Wako Pure Chemical Industries, Ltd.), WPAG-443 (the following structure, manufactured by Wako Pure Chemical Industries, Ltd.), and MBZ-101 (the following structure, manufactured by Midori Kagaku Co., Ltd.).

<<Compound Represented by Formula (4)>>

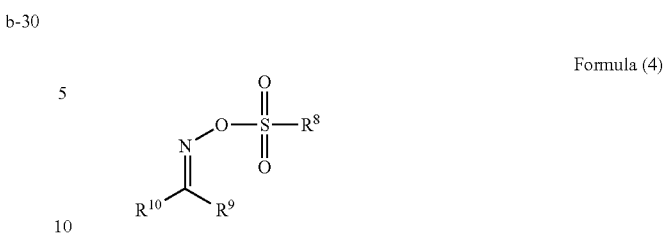
Formula (4)

In Formula (4), $R^8$ represents a fluoroalkyl group having 2 or 3 carbon atoms, $R^9$ represents an alkyl group having 1 to 8 carbon atoms or a fluoroalkyl group, and $R^{10}$ represents an aromatic hydrocarbon group or an aromatic heterocyclic group.

In Formula (4), it is preferable that $R^8$ represents a perfluoroalkyl group having 2 or 3 carbon atoms.

It is preferable that $R^9$ represents an alkyl group having 3 to 8 carbon atoms or a fluoroalkyl group and a perfluoroalkyl group having 3 to 8 carbon atoms is preferable.

It is preferable that $R^{10}$ represents an aromatic hydrocarbon group. The aromatic hydrocarbon group may be a single ring or a condensed ring, and a condensed ring is preferable. The number of carbon atoms of the aromatic hydrocarbon group is preferably in a range of 6 to 30, more preferably in a range of 6 to 18, and still more preferably in a range of 6 to 15. It is preferable that the aromatic hydrocarbon group is a fluorene ring.

When $R^{10}$ represents an aromatic heterocyclic group, the aromatic heterocyclic group may be a single ring or a condensed ring. The number of carbon atoms of the aromatic heterocyclic group is preferably in a range of 6 to 30, more preferably in a range of 6 to 18, and still more preferably in a range of 6 to 15.

It is preferable that the compound represented by Formula (4) is represented by Formula (4-1).

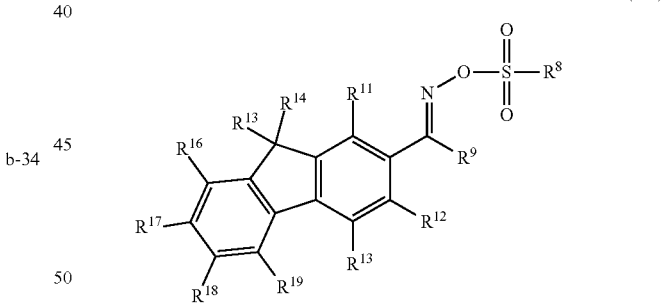
Formula (4-1)

In Formula (4-1), $R^8$ represents a fluoroalkyl group having 2 or 3 carbon atoms, $R^9$ represents an alkyl group having 1 to 8 carbon atoms, or a fluoroalkyl group, and $R^{11}$ to $R^{19}$ each independently represent a hydrogen atom or an alkyl group.

$R^8$ and $R^9$ have the same definitions as those for $R^8$ and $R^9$ in Formula (4) and preferred ranges are the same as each other.

It is preferable that $R^{11}$ to $R^{19}$ represent a hydrogen atom.

When $R^{11}$ to $R^{19}$ represent an alkyl group, the number of carbon atoms of the alkyl group is preferably in a range of 1 to 30.

As specific examples of the compound represented by Formula (4), the following exemplary compounds are exemplified, but the present invention is not limited thereto.

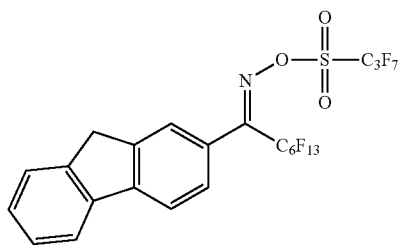

<Compound Having Imide Sulfonate Group>

It is preferable that a compound including an imide sulfonate group which can be used as a specific photoacid generator is a compound including a 5-membered ring imide sulfonate group. Moreover, it is preferable that a compound including an imide sulfonate group is a compound represented by the following Formula (3).

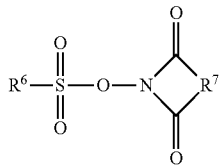

Formula (3)

In Formula (3), $R^6$ represents a fluoroalkyl group having 2 or 3 carbon atoms and $R^7$ represents an alkylene group, an alkenylene group, or an arylene group.

In Formula (3), it is preferable that $R^6$ represents a perfluoroalkyl group having 2 or 3 carbon atoms.

In Formula (3), $R^7$ represents an alkylene group, an alkenylene group, or an arylene group.

The alkylene group may be linear, branched, or cyclic and a cyclic alkylene group is preferable.

The alkenyl group may be linear, branched, or cyclic and cyclic is preferable. The number of carbon atoms of the alkylene group is preferably in a range of 1 to 12, more preferably in a range of 3 to 12, and still more preferably in a range of 3 to 8. The number of carbon atoms of the alkenylene group is preferably in a range of 2 to 12, more preferably in a range of 3 to 12, and still more preferably in a range of 3 to 8.

The number of carbon atoms of the arylene group is preferably in a range of 6 to 18 and more preferably in a range of 6 to 12.

It is preferable that a compound including an imide sulfonate group is a compound including a 5-membered ring imide sulfonate group and a norbornene group.

As a commercially available product of the compound including an imide sulfonate group, NT-1TF or NT3TF (manufactured by San-Apro Ltd.) can be used.

In addition, as specific examples of other compounds including an imide sulfonate group, the following exemplary compounds are exemplified, but the present invention is not limited thereto.

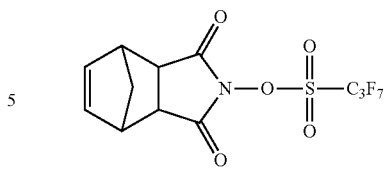

It is preferable that the photosensitive resin composition of the present invention does not contain a 1,2-quinonediazide compound as a photo acid generator that responds to active rays. The reason for this is that a 1,2-quinonediazide compound generates a carboxy group using a sequential photochemical reaction, but the quantum yield is 1 or less and thus the sensitivity is low compared to an oxime sulfonate compound.

On the contrary, it is assumed that the oxime sulfonate compound acts as a catalyst with respect to deprotection of an acid group which is protected in which an acid is generated by the compound responding to active rays, and thus an acid generated due to an action of one light quantum contributes to deprotection reaction multiple times, the quantum yield exceeds 1 and becomes a large value, for example, a multiple of 10, and then high sensitivity is obtained as a result of so-called chemical amplification.

Further, since the oxime sulfonate compound has a π conjugated system which is extended, the compound has absorption on a long wavelength side and extremely high sensitivity is shown with respect to not only deep ultraviolet (DUV) and i-line but also g-line.

In the photosensitive resin composition of the present invention, an amount of acid decomposition greater than or equal to that for acetal or ketal can be obtained using a tetrahydrofuranyl group as an acid decomposable group in the specific resin. In this manner, the acid decomposable group can be reliably consumed through post-baking over a shorter period of time. In addition, since the sulfonic acid generation rate is increased when an oxime sulfonate compound which is a photoacid generator is combined and then used, generation of an acid is promoted and decomposition of an acid decomposable group of a resin is promoted. Further, in acids obtained through decomposition of the oxime sulfonate compound, since a sulfonic acid with small molecules is generated, diffusibility in a curing film becomes improved and thus sensitivity can be increased.

The specific photoacid generator may be used alone or in combination of two or more kinds thereof. In addition, the specific photoacid generator can be used by being combined with another kind of specific photo acid generator.

In the photosensitive resin composition in the present invention, the content of the specific photoacid generator used is preferably in a range of 0.1% by mass to 20% by mass and more preferably in a range of 0.5% by mass to 18% by mass with respect to total solid content of the photoacid resin composition.

The content of the specific photoacid generator can be suitably selected according to the film thickness of the water-soluble resin film. In a case where the film thickness of the water-soluble resin film is less than 2 μm, since the specific photoacid generator is unlikely to diffuse into the water-soluble resin film, a desired mask shape can be easily obtained even when the content of the specific photoacid generator is set to be in a range of 0.5% by mass to 2% by mass. Meanwhile, in a case where the film thickness of the water-soluble resin film is 2 μm or greater, since the specific photoacid generator easily diffuses into the water-soluble resin film, it is preferable that the content of the specific photoacid generator is set to be in a range of 2% by mass to 18% by mass in order to obtain a desired mask shape. Further, a more excellent mask shape can be obtained by setting the addition amount of the specific photoacid generator to be 18% by mass or less.

Other Components

The photosensitive resin composition of the present invention may contain other components.

As other components, it is preferable that a solvent is contained in the photosensitive resin composition from a viewpoint of coating properties.

Solvent

It is preferable that the photosensitive resin composition of the present invention contains a solvent.

In the photosensitive resin composition of the present invention, it is preferable that a solution obtained by dissolving a specific resin and a specific photoacid generator which are essential components, and optional compositions of various additives in a solvent is prepared.

A known solvent can be used as the solvent to be used for the photosensitive resin composition of the present invention, and examples thereof include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers, diethylene glycol monoalkyl ether acetates, dipropylene glycol monoalkyl ethers, dipropylene glycol dialkyl ethers, dipropylene glycol monoalkyl ether acetates, esters, ketones, amides, and lactones.

Examples of the solvent to be used for the photosensitive resin composition of the present invention include (1) ethylene glycol monoalkyl ethers such as ethylene glycol monomethyl ether, ethylene glycol monoethyl ether, ethylene glycol monopropyl ether, and ethylene glycol monobutyl ether; (2) ethylene glycol dialkyl ethers such as ethylene glycol dimethyl ether, ethylene glycol diethyl ether, and ethylene glycol dipropyl ether; (3) ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; (4) propylene glycol monoalkyl ethers such as propylene glycol monomethyl ether, propylene glycol monoethyl ether, propylene glycol monopropyl ether, and propylene glycol monobutyl ether; (5) propylene glycol dialkyl ethers such as propylene glycol dimethyl ether, propylene glycol diethyl ether, diethylene glycol monomethyl ether, and diethylene glycol monoethyl ether; (6) propylene glycol monoalkyl ether acetates such as propylene glycol monomethyl ether acetate, propylene glycol monoethyl ether acetate, propylene glycol monopropyl ether acetate, and propylene glycol monobutyl ether acetate, (7) diethylene glycol dialkyl ethers such as diethylene glycol dimethyl ether, diethylene glycol diethyl ether, and diethylene glycol ethyl methyl ether; (8) diethylene glycol monoalkyl ether acetates such as diethylene glycol monomethyl ether acetate, diethylene glycol monoethyl ether acetate, diethylene glycol monopropyl ether acetate, and diethylene glycol monobutyl ether acetate; (9) dipropylene glycol monoalkyl ethers such as dipropylene glycol monomethyl ether, dipropylene glycol monoethyl ether, dipropylene glycol monopropyl ether, and dipropylene glycol monobutyl ether; (10) dipropylene glycol dialkyl ethers such as dipropylene glycol dimethyl ether, dipropylene glycol diethyl ether, and dipropylene glycol ethyl methyl ether;

(11) dipropylene glycol monoalkyl ether acetates such as dipropylene glycol monomethyl ether acetate, dipropylene glycol monoethyl ether acetate, dipropylene glycol monopropyl ether acetate, and dipropylene glycol monobutyl ether acetate; (12) lactates such as methyl lactate, ethyl lactate, n-propyl lactate, isopropyl lactate, n-butyl lactate, isobutyl lactate, n-amyl lactate, and isoamyl lactate; (13) aliphatic carboxylates such as n-butyl acetate, isobutyl acetate, n-amyl acetate, isoamyl acetate, n-hexyl acetate, 2-ethylhexyl acetate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, and isobutyl butyrate; (14) esters such as ethyl hydroxyacetate, ethyl 2-hydroxy-2-methylpropionate, ethyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxy butyl acetate, 3-methyl-3-methoxy butyl acetate, 3-methyl-3-methoxy butyl propionate, 3-methyl-3-methoxy butyl butyrate, methyl acetoacetate, ethyl acetoacetate, methyl pyruvate, and ethyl pyruvate;

(15) ketones such as methyl ethyl ketone, methyl propyl ketone, methyl-n-butyl ketone, methyl isobutyl ketone, 2-heptanone, 3-heptanone, 4-heptanone, and cyclohexanone; (16) amides such as N-methylformamide, N,N-dimethylformamide, N-methylacetamide, N,N-dimethylacetamide, and N-methylpyrrolidone; and (17) lactones such as γ-butyrolactone.

Moreover, in addition to these solvents, solvents such as benzyl ethyl ether, dihexyl ether, ethylene glycol monophenyl ether acetate, diethylene glycol monomethyl ether, diethylene glycol monoethyl ether, isophorone, caproic acid, caprylic acid, 1-octanol, 1-nonanol, benzyl alcohol, anisole, benzyl acetate, ethyl benzoate, diethyl oxalate, diethyl maleate, or ethylene carbonate, and propylene carbonate can be added as needed.

Among the above-described solvents, propylene glycol monoalkyl ether acetates and/or diethylene glycol dialkyl ethers are preferable, and diethylene glycol ethyl methyl ether and/or propylene glycol monomethyl ether acetate are particularly preferable.

These solvents can be used alone or in combination of two or more kinds thereof.

In a case where the photosensitive resin composition of the present invention contains a solvent, the content of the solvent is preferably in a range of 1 part by weight to 3000 parts by weight, more preferably in a range of 5 parts by weight to 2000 parts by weight, and still more preferably in a range of 10 parts by weight to 1500 parts by weight with respect to 100 parts by weight of the specific resin.

Further, it is preferable that the photosensitive resin composition of the present invention contains a basic compound from a viewpoint of liquid storage stability and contains a surfactant from a viewpoint of coating properties.

Basic Compound

It is preferable that the photosensitive resin composition of the present invention contains a basic compound.

A basic compound can be arbitrarily selected from compounds used for chemically amplified resists and then used. Examples thereof include aliphatic amines, aromatic amines, heterocyclic amines, quaternary ammonium hydroxide, and quaternary ammonium salts of carboxylic acids.

As the basic compound, a primary or secondary amine compound is preferable. Particularly, in a case where the specific resin A includes a repeating unit represented by Formula (B¹-1) or a repeating unit represented by Formula (B¹-2), it is preferable that the basic compound is a primary amine compound.

Examples of the aliphatic amine include trimethylamine, diethylamine, trimethylamine, di-n-propylamine, tri-n-propylamine, di-n-pentylamine, tri-n-pentylamine, diethanolamine, triethanolamine, dicyclohexylamine, dicyclohexylmethylamine, and hexylamine.

Examples of the aromatic amine include aniline, benzylamine, N,N-dimethylaniline, diphenylamine, 2,6-diisopropylaniline, and 2,4,6-tri-tert-butylaniline.

Examples of the heterocyclic amine include pyridine, 2-methylpyridine, 4-methylpyridine, 2-ethylpyridine, 4-ethylpyridine, 2-phenylpyridine, 4-phenylpyridine, N-methyl-4-phenylpyridine, 4-dimethylaminopyridine, N,N-dimethyl-4-aminopyridine, imidazole, benzimidazole, 4-methylimidazole, 2-phenylbenzimidazole, 2,4,5-triphenylimidazole, nicotine, nicotinic acid, nicotinic acid amide, quinoline, 8-oxyquinoline, pyrazine, pyrazole, pyridazine, purine, pyrrolidine, piperidine, cyclohexyl morpholinoethyl thiourea, piperizine, morpholine, 4-methylmorpholine, 1,5-diazabicyclo[4.3.0]-5-nonene, and 1,8-diazabicyclo[5,3,0]-7-undecene.

Examples of the quaternary ammonium hydroxide include tetramethylammonium hydroxide, tetraethylammonium hydroxide, tetra-n-butylammonium hydroxide, and tetra-n-hexylammonium hydroxide.

Examples of the quaternary ammonium salts of carboxylic acid include tetramethylammonium acetate, tetramethylammonium benzoate, tetra-n-butylammonium acetate, and tetra-n-butylammonium benzoate.

The basic compound which can be used in the present invention may be used alone or in combination of two or more kinds thereof, but a combination of two or more kinds thereof is preferable, a combination of two kinds thereof is more preferable, and a combination of two kinds of heterocyclic amine is still more preferable.

In a case where the photosensitive resin composition of the present invention contains a basic compound, the content of the basic compound is preferably in a range of 0.001 parts by weight to 1 part by weight and more preferably in a range of 0.002 parts by weight to 0.2 parts by weight with respect to 100 parts by weight of the specific resin.

Surfactant

It is preferable that the photosensitive resin composition of the present invention contains a surfactant.

As the surfactant, any of an anionic surfactant, a cationic surfactant, a non-ionic surfactant, and an amphoteric surfactant can be used, but a preferable surfactant is a non-ionic surfactant.

Examples of the non-ionic surfactant include polyoxyethylene higher alkyl ethers, polyoxyethylene higher alkyl phenyl ethers, higher fatty acid diesters of polyoxyethylene glycol, a fluorine-based surfactant, and a silicone-based surfactant.

It is more preferable that the photosensitive resin composition of the present invention contains a fluorine-based surfactant and/or a silicone-based surfactant as a surfactant.

As the fluorine-based surfactant and the silicone-based surfactant, surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), and JP2001-330953A can be exemplified, and commercially available products can be also used.

Examples of the commercially available products which can be used include fluorine-based surfactants and silicone based surfactants such as F TOP EF301 and F TOP EF303 (both manufactured by Shin Akita Kasei Inc.), Fluorad FC430 and Fluorad FC431 (both manufactured by Sumitomo 3M Limited), Megaface F171, Megaface F173, Megaface F176, Megaface F189, and Megaface R08 (all manufactured by DIC Corporation), Surflon S-382, Surflon SC101, Surflon SC102, Surflon SC103, Surflon SC104, Surflon SC105, and Surflon SC106 (all manufactured by ASAHI GLASS CO., LTD.), and the PF-6320 PolyFox Series of and the like (manufactured by OMNOVA Solution Inc.). In addition, polysiloxane polymer KP-341 (manufactured by Shin-Etsu Chemical Co., Ltd.) can be also used as a silicone-based surfactant. Moreover, acetylene E00 (manufactured by Kawaken Fine Chemicals Co., Ltd.) can be also used.

Further, as a surfactant, a copolymer which contains a constituent unit A and a constituent unit B which are represented by the following Formula (1) and whose weight average molecular weight (Mw) measured by gel permeation chromatography in terms of polystyrene is in a range of 1000 to 10000 in a case where tetrahydrofuran (THF) is used as a solvent is exemplified.

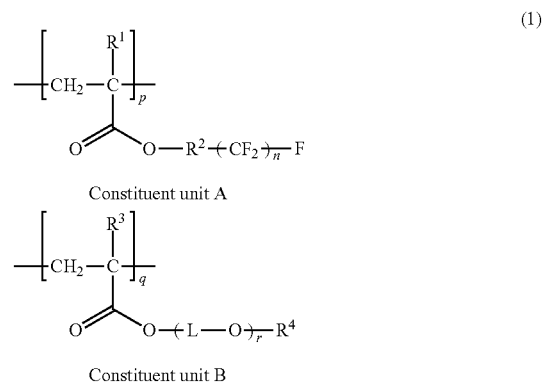

(In Formula (1), $R^1$ and $R^3$ each independently represent a hydrogen atom or a methyl group; $R^2$ represents a linear alkylene group having 1 to 4 carbon atoms; $R^4$ represents a hydrogen atom or an alkyl group having 1 to 4 carbon atoms; L represents an alkylene group having 3 to 6 carbon atoms, p and q represent the weight percentages showing a weight ratio; p represents a numerical value of 10% by mass to 80% by mass; q represents a numerical value of 20% by mass to 90% by mass; r represents an integer of 1 to 18; and n represents an integer of 1 to 10.)

It is preferable that L represents a branched alkylene group represented by the following Formula (2). $R^5$ in Formula (2) represents an alkyl group having 1 to 4 carbon atoms, and an alkyl group having 1 to 3 carbon atoms is preferable and an alkyl group having 2 or 3 carbon atoms is more preferable in terms of compatibility and wettability with respect to a surface to be coated.

The weight average molecular weight (Mw) of the copolymer is more preferably in a range of 1500 to 5000.

These surfactants can be used alone or in combination of two or more kinds thereof.

In a case where the photosensitive resin composition of the present invention contains a surfactant, the amount of the surfactant to be added is preferably 10 parts by weight or less, more preferably in a range of 0.01 parts by weight to 10 parts by weight, and still more preferably in a range of 0.01 parts by weight to 1 part by weight with respect to 100 parts by weight of the specific resin.

Moreover, if necessary, known additives such as an antioxidant, a plasticizer, a thermal radical generator, a thermal acid generator, an acid proliferation agent, an ultraviolet absorber, a thickener, and an organic or inorganic precipitation inhibitor can be added to the photosensitive resin composition of the present invention. The description of paragraphs "0143" to "0148" of JP2011-209692A can be referred to for details and the contents are incorporated in the specification of the present application.

The film thickness of the resist film is preferably in a range of 100 nm to 1000 nm and more preferably in a range of 300 nm to 850 nm from a viewpoint of improving resolving power. Such a film thickness can be obtained by setting the solid content concentration in a chemically amplified photosensitive resin composition to be in an appropriate range, allowing the composition to have a suitable viscosity, and improving coating properties and film forming properties.

<Method of Patterning Organic Semiconductor Film>

A method of patterning an organic semiconductor film of the present invention includes:

(1) a process of forming a water-soluble resin film on the organic semiconductor film;

(2) a process of forming a resist film, on the water-soluble resin film that is on the opposite side of the organic semiconductor film, which contains a photoacid generator that is decomposed in an amount of 80% by mole or greater when exposed to light under the condition of 100 mJ/cm$^2$ or greater at a wavelength of 365 nm and is formed of a chemically amplified photosensitive resin composition;

(3) a process of exposing the resist film;

(4) a process of performing development using a developer containing an organic solvent to prepare a mask pattern;

(5) a process of removing at least the water-soluble resin film and the organic semiconductor film of a non-mask portion during an etching treatment; and (6) a process of dissolving the water-soluble resin film using water.

<<(1) Process of Forming Water-Soluble Resin Film on Organic Semiconductor Film>>

The method of patterning the organic semiconductor film of the present invention includes a process of forming a water-soluble resin film 3 on an organic semiconductor film 2 as illustrated in FIG. 1(B). The present process is normally performed after the organic semiconductor film 2 is formed on the substrate 1 as illustrated in FIG. 1(A). In this case, the water-soluble resin film is formed on a surface that is the opposite side to the surface on the substrate side of the organic semiconductor. The water-soluble resin film is normally provided on the surface of the organic semiconductor film, but another layer may be provided within the range not departing from the scope of the present invention. Specifically, a water-soluble undercoat layer is exemplified. In addition, only one sheet or two or more sheets of water-soluble resin films may be provided.

<<(2) Process of Forming Resist Film, on Water-Soluble Resin Film on Opposite Side of Organic Semiconductor Film, which Contains Photoacid Generator that is Decomposed in an Amount of 80% by Mole or Greater when Exposed to Light Under a Condition of 100 mJ/Cm$^2$ or Greater at Wavelength of 365 nm and is Formed of a Chemically Amplified Photosensitive Resin Composition>>

After the process (1), in a process (2) a resist film formed of a chemically amplified photosensitive resin composition is formed on the water-soluble resin film on the opposite side to the surface of the organic semiconductor side. The resist film is normally formed by applying the chemically amplified photosensitive resin composition to the surface of the water-soluble resin film, but may be formed via a film such as an undercoat layer. The description of the water-soluble resin composition can be referred to for a method of applying the chemically amplified photosensitive resin composition.

The chemically amplified photosensitive resin composition used in the present invention contains a photoacid generator which is decomposed in an amount of 80% by mole or greater when exposed to light under the condition of 100 mJ/cm$^2$ or greater at a wavelength of 365 nm. When such a photo acid generator is mixed, an acid is generated when the acid generator is exposed to light, a specific resin described below contained in the resist reacts with the acid, patterning becomes possible, and a resist film functions.

The solid content concentration of the chemically amplified photosensitive resin composition is normally in a range of 1.0% by mass to 20% by mass, preferably in a range of 1.5% by mass to 17% by mass, and more preferably in a range of 2.0% by mass to 15% by mass. When the solid content concentration is set to be in the above-described range, the water-soluble resin film can be uniformly coated with a resist solution and a resist pattern which has high resolution and a rectangular profile can be formed. The solid content concentration is a weight percentage showing the weight of other resist components other than the solvent with respect to the total weight of the resin composition.

<<(3) Process of Exposing Resist Film>>

After the resist film is formed by the process (2), the resist film is exposed. Specifically, the resist film is irradiated with active rays through a mask having a predetermined pattern. The resist film may be exposed only once or multiple times.

Specifically, a substrate provided with a dried coating film of the photosensitive resin composition is irradiated with active rays having a predetermined pattern. The substrate may be exposed to light through a mask or the predetermined pattern may be directly drawn. Active rays having a wavelength of 300 nm to 450 nm and preferably a wavelength of 365 nm are preferably used. After this process, a heating process after exposure (PEB) may be performed as needed.

A low-pressure mercury lamp, a high-pressure mercury lamp, an ultra-high pressure mercury lamp, a chemical lamp, a laser generator, or an LED light source can be used for exposure using active rays.

In a case where a mercury lamp is used, active rays having a wavelength of g-line (436 nm), a wavelength of i-line (365 nm), and a wavelength of h-line (405 nm) are preferably used. A mercury lamp is preferable compared to a laser in terms of suitability for exposure of a large area.

In a case of using a laser, a solid (YAG) laser having a wavelength of 343 nm or 355 nm is preferably used, an excimer laser having a wavelength of 351 nm (XeF) is preferably used, and a semiconductor laser having a wavelength of 375 nm or 405 nm is preferably used. Among these, a wavelength of 355 nm or 405 nm is more preferable in terms of stability or costs. A coating film can be irradiated with a laser once or multiple times.

The energy density per pulse of a laser is preferably in a range of 0.1 mJ/cm$^2$ to 10000 mJ/cm$^2$. In order for the coating film to be sufficiently cured, the energy density thereof is more preferably 0.3 mJ/cm$^2$ or greater and most preferably 0.5 mJ/cm$^2$ or greater. In order for the coating film not to be decomposed by an ablation phenomenon, the energy density is more preferably 1000 mJ/cm$^2$ or less and most preferably 100 mJ/cm$^2$ or less.

Further, the pulse width is preferably in a range of 0.1 nsec to 30000 nsec. In order for the coloring film not to be decomposed by an ablation phenomenon, the pulse width is more preferably 0.5 nsec or greater and most preferably 1 nsec or greater. Further, in order to improve aligning accuracy at the time of scanning exposure, the pulse width is more preferably 1000 nsec or less and most preferably 50 nsec or less.

In addition, the frequency of the laser is preferably in a range of 1 Hz to 50000 Hz and more preferably in a range of 10 Hz to 1000 Hz.

Moreover, in order to shorten the exposure treatment time, the frequency of the laser is more preferably 10 Hz or greater and most preferably 100 Hz or greater. In order to improve aligning accuracy at the time of scanning exposure, the frequency of the laser is more preferably 10000 Hz or less and most preferably 1000 Hz or less.

When a laser is compared to a mercury lamp, a laser is preferable in terms that a laser can be more easily focused and a mask for pattern formation during the exposure process is unnecessary and this leads to cost reduction.

An exposure device which can be used in the present invention is not particularly limited, and a Callisto (manufactured by V-Technology Co., Ltd.), an AEGIS (manufactured by V-Technology Co., Ltd.), or a DF2200G (manufactured by SCREEN Holdings Co., Ltd.) can be exemplified as a commercially available product. Further, devices other that those described above are suitably used.

Moreover, irradiation light can be adjusted through a spectral filter such as a long wavelength cut filter, a short wavelength cut filter, and a band-pass filter if necessary.

<<(4) Process of Performing Development Using Developer Containing Organic Solvent to Prepare Mask Pattern>>

After the resist film is exposed by the process (3), development is performed using a developer containing an organic solvent. The development is preferably a negative type development. The sp value of the solvent contained in the developer is preferably less than 19 MPa$^{1/2}$ and more preferably 18 MPa$^{1/2}$ or less.

As the organic solvent contained in the developer used in the present invention, a polar solvent such as a ketone-based solvent, an ester-based solvent, or an amide-based solvent and a hydrocarbon-based solvent can be used.

Examples of the ketone-based solvent include 1-octanone, 2-octanone, 1-nonanone, 2-nonanone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the amide-based solvent include N-methyl-2-pyrrolidone, N,N-dimethylacetamide, N,N-dimethylformamide, hexamethyl phosphoric triamide, and 1,3-dimethyl-2-imidazolidinone.

Examples of the hydrocarbon-based solvent include an aromatic hydrocarbon-based solvent such as toluene or xylene and an aliphatic hydrocarbon-based solvent such as pentane, hexane, octane, or decane.

The above-described solvents may be used alone or in combination of two or more kinds thereof. In addition, the solvents may be used by being mixed with solvents other than the solvents described above. In this case, for the purpose of sufficiently exhibiting the effects of the present invention, it is preferable that the moisture content in a whole developer is less than 10% by mass and more preferable that substantially no moisture is contained. The term "substantially" here means that the moisture content in a whole developer is 3% by mass or less and more preferably below the measurement limit.

That is, the amount of the organic solvent used with respect to an organic developer is preferable in a range of 90% by mass to 100% by mass and more preferably in a range of 95% by mass to 100% by mass with respect to the total amount of the developer.

Particularly, it is preferable that the organic developer is a developer containing at least one organic solvent selected from a group consisting of a ketone-based solvent, an ester-based solvent, and an amide-based solvent.

In addition, the organic developer may contain an appropriate amount of a basic compound as needed. Examples of the basic compound are the same as those described above in the section of the basic compound.

The vapor pressure of the organic developer at 20° C. is preferably 5 kPa or less, more preferably 3 kPa or less, and particularly preferably 2 kPa or less. When the vapor pressure of the organic developer is set to 5 kPa or less, evaporation on a substrate of the developer or in a developing cup is suppressed, temperature uniformity in a wafer surface is improved, and thus dimensional uniformity in the wafer surface is improved.

Specific examples of an organic developer having a vapor pressure of 5 kPa or less include a ketone-based solvent such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, or methyl isobutyl ketone; an ester-based solvent such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, butyl formate, propyl formate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as toluene or xylene; and an aliphatic hydrocarbon-based solvent such as octane or decane.

Specific examples of an organic developer having a vapor pressure of 2 kPa or less which is the particularly preferred range include a ketone-based solvent such as 1-octanone, 2-octanone, 1-nonanone, 2-nonanone, 4-heptanone, 2-hexanone, diisobutyl ketone, cyclohexanone, methyl cyclohexanone, or phenyl acetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxy butyl acetate, 3-methyl-3-methoxybutyl acetate, ethyl lactate, butyl lactate, or propyl lactate; an amide-based solvent such as N-methyl-2-pyrrolidone, N,N-dimethylacetamide, or N,N-dimethylformamide; an aromatic hydrocarbon-based solvent such as xylene; and an aliphatic hydrocarbon-based solvent such as octane or decane.

An appropriate amount of a surfactant can be added to the developer as needed.

The surfactants described in the section of the water-soluble resin composition are preferably used as the surfactants although not particularly limited.

In a case where a surfactant is mixed with the developer, the content is normally in a range of 0.001% by mass to 5% by mass, preferably in a range of 0.005% by mass to 2% by mass, and still more preferably in a range of 0.01% by mass to 0.5% by mass with respect to the total amount of the developer.

As a developing method, a method of immersing a substrate in a bath filled with a developer for a certain period of time (dip method); a method of performing development by raising a developer onto the surface of a substrate using the surface tension and allowing the developer to stand still for a certain period of time (paddle method); a method of spraying a developer on the surface of a substrate (spray method); and a method of discharging a developer while a developer discharge nozzle is scanned at a constant rate on a substrate that rotates at a constant rate (dynamic dispense method) can be used.

In a case where the various developing methods include a method of discharging a developer to a resist film from a development nozzle of a developing device, the discharge pressure (the flow rate per unit area of the developer to be discharged) of the developer to be discharged is preferably in a range of 2 mL/sec/mm$^2$ or less, more preferably 1.5 mL/sec/mm$^2$ or less, and still more preferably 1 mL/sec/mm$^2$ or less. The lower limit of the flow rate is not particularly limited, but is preferably 0.2 mL/sec/mm$^2$ or greater when throughput is considered.

When the discharge pressure of the developer to be discharged is set to be in the above-described range, defects in a pattern derived from resist residues after development can be significantly reduced.

The details of this mechanism is not clear, but it is considered that the defects can be reduced because the pressure of the developer being applied to the resist film is decreased and thus unexpected scraping or collapsing of the resist film and the resist pattern is suppressed by setting the discharge pressure to be in the above-described range.

In addition, the discharge pressure (mL/sec/mm$^2$) of the developer is a value in a developing nozzle outlet in the developing device.

Examples of a method of adjusting the discharge pressure of the developer include a method of adjusting the discharge pressure using a pump or the like and a method of adjusting and changing the discharge pressure with a supply from a pressure tank.

Further, after the process of performing development using the developer containing an organic solvent, a process of stopping development may be carried out while the organic solvent is replaced by another solvent.

<<(5) Process of Removing at Least Water-Soluble Resin Film and Organic Semiconductor of Non-Mask Portion During Etching Treatment>>

For example, the resist film is developed and a mask pattern 4 is prepared as illustrated in FIG. 1(C), and then the water-soluble resin film 3 and the organic semiconductor film 2 of at least a non-mask portion are removed during the etching treatment as illustrated in FIG. 1(D). The non-mask portion indicates a portion which is not exposed to light due to a mask when a mask pattern is prepared by exposing the resist film to light. Hereinafter, a case where the etching treatment is a dry etching treatment and a case where the etching treatment is a wet etching treatment will be described.

<<Dry Etching Treatment>>

Specifically, during the dry etching treatment, the resist pattern is used as an etching mask and at least the water-soluble resin film and the organic semiconductor are dry-etched. Typical examples of the dry etching include methods described in JP1984-126506A (JP-S59-126506A), JP1984-46628A (JP-S57-46628A), JP1983-9108A (JP-S58-9108A), JP1983-2809A (JP-S58-2809A), JP1982-148706A (JP-S57-148706A), and JP1986-41102A (JP-S61-41102A).

It is preferable that the dry etching is performed by following an embodiment from viewpoints of forming a pattern section to have a shape close to a rectangular shape and further reducing damage to the organic semiconductor.

An embodiment which includes a first step of etching that performs etching up to a region (depth) to which the organic semiconductor is not exposed using a mixed gas of fluorine-based gas and oxygen gas ($O_2$), a second step of etching that performs etching preferably close to a region (depth) to which the organic semiconductor is exposed using mixed gas of nitrogen gas (N2) and oxygen gas (O2) after the first step of etching, and overetching performed after the organic semiconductor is exposed is preferable. Hereinafter, a specific method of the dry etching, the first step of etching, the second step of etching and the overetching will be described.

The dry etching is performed by acquiring etching conditions in advance using the following method.

(1) An etching rate (nm/min) in the first step of etching and an etching rate (nm/min) in the second step of etching are respectively calculated. (2) The etching time over which a desired thickness is obtained by the first step of etching and the etching time over which a desired thickness is obtained by the second step of etching are respectively calculated. (3) The first step of etching is performed according to the etching time calculated in the process (2) described above. (4) The second step of etching is performed according to the etching time calculated in the process (2) described above. Alternatively, the etching time is determined by end point detection and then the second step of etching may be performed according to the determined etching time. (5) The overetching time with respect to the total time of (3) and (4) described above is calculated and the overetching is performed.

It is preferable that the mixed gas used in the first step of the etching process contains fluorine-based gas and oxygen gas ($O_2$) from a viewpoint of processing an organic material, which is a film to be etched, to have a rectangular shape. Moreover, in the first step of the etching process, damage to the organic semiconductor can be avoided by performing etching up to a region to which the organic semiconductor is not exposed. In addition, it is preferable that the etching treatment is performed using a mixed gas of nitrogen gas and oxygen gas in the second step of the etching process and the overetching process from a viewpoint that the etching is performed up to the region to which the organic semiconductor is not exposed using a mixed gas of fluorine-based gas and oxygen gas during the first step of the etching process and thus damage to the organic semiconductor is avoided.

It is important that the ratio of the etching amount during the first step of the etching process to the etching amount during the second step of the etching process is determined such that the rectangular properties due to the etching treatment during the first step of the etching process are not degraded. In addition, the ratio of the etching amount in the second step of the etching process to the total etching amount (the total amount of the etching amount in the first step of the etching process and the etching amount in the second step of the etching process) is preferably greater than 0% and equal to or less than 50% and more preferably in a range of 10% to 20%. The etching amount indicates the amount calculated from a difference between the film thickness of a remaining film to be etched and the film thickness before etching.

In addition, it is preferable that the etching includes the overetching process. It is preferable that the overetching treatment is performed by setting an overetching ratio. Further, it is preferable that the overetching ratio is calculated from the time for the etching treatment which is carried out for the first time. The overetching ratio can be arbitrarily set, but the overetching ratio is preferably 30% or less, more preferably 5% to 25%, and particularly preferably 10% to 15% of the etching treatment time in this etching process from a viewpoint of maintaining etching resistance of a photoresist and rectangular properties of a pattern to be etched.

<<Wet Etching Treatment>>

Specifically, in wet etching, at least the water-soluble resin film and the organic semiconductor are wet-etched using a resist pattern as an etching mask.

As the wet etching process, a dipping type etching method of performing etching by immersing a substrate in an etching solution; a shower type etching method of performing etching by exposing a substrate to a shower-like etching solution; a spray type etching method of spraying an etching solution onto a substrate; and the like are known, but a shower type etching method and a spray type etching method are preferable from a viewpoint of performing processing on an organic material, which is a film to be etched, to have a rectangular shape.

Moreover, it is preferable that etching is performed by following an embodiment from viewpoints of forming a pattern section to have a shape closer to a rectangular shape and further reducing damage to the organic semiconductor.

An embodiment which includes a first step of etching that performs etching of the water-soluble resin film using at least one of primary alcohols and secondary alcohols and a second step of etching that is performed after the organic semiconductor is exposed using a liquid dissolving the organic semiconductor after the first step of etching is preferable.

Examples of the primary alcohols and the secondary alcohols are the same as the primary alcohols and the secondary alcohols described in the water-soluble resin composition that forms the water-soluble resin film described above.

Hereinafter, a specific method of wet etching, the first step of etching, and the second step of etching will be described.

The wet etching is performed by acquiring etching conditions in advance using the following method.

(1) An etching rate (nm/min) in the first step of etching and an etching rate (nm/min) in the second step of etching are respectively calculated. (2) The etching time over which a desired thickness is obtained by the first step of etching and the etching time for which a desired thickness is obtained by the second step of etching are respectively calculated. (3) The first step of etching is performed according to the etching time calculated in the process (2) described above. (4) The second step of etching is performed according to the etching time calculated in the process (2) described above.

The etching is performed up to a region to which the organic semiconductor is exposed during the first step of the etching process and thus the second step of etching becomes possible. Further, in the second step of etching process, it is preferable that the etching treatment is performed using a solvent that dissolves the organic semiconductor after etching is performed up to a region to which the organic semiconductor is exposed by at least one of the primary alcohols and the secondary alcohols in the first step of the etching process.

It is important that the ratio of the etching amount during the first step of the etching process to the etching amount during the second step of the etching process is determined such that the rectangular properties due to the etching treatment during the first step of the etching process are not degraded. In addition, the ratio of the etching amount in the second step of the etching process to the total etching amount (the total amount of the etching amount in the first step of the etching process and the etching amount in the second step of the etching process) is preferably greater than 0% and equal to or less than 50% and more preferably in a range of 10% to 20%. The etching amount indicates the amount calculated from a difference between the film thickness of a remaining film to be etched and the film thickness before etching.

In a case of the wet etching, since the resist pattern remains on the mask pattern formed of a water-soluble resin, it is necessary to perform peeling off of the resist pattern.

As the organic solvent containing a peeling solution used in the present invention, a polar solvent such as a ketone-based solvent, an amide-based solvent, an alcohol-based solvent, an ether-based solvent, and a nitrile-based solvent can be used.

As the ketone-based solvent, acetone, methyl ethyl ketone, cyclohexanone, methylcyclohexanone, or acetyl acetone can be used.

As the amide-based solvent, N-methyl-2-pyrrolidone, N,N-dimethylacetamide, N,N-dimethylformamide, hexamethyl phosphoric triamide, or 1,3-dimethyl-2-imidazolidinone can be used.

As the alcohol-based solvent, a primary alcohol-based solvent such as methanol, ethanol, or 3-methyl-1-butanol, or a secondary alcohol-based solvent such as 2-propanol, 4-methyl-2-pentanol, or 3-methoxy-1-butanol can be used.

As the ether-based solvent, propylene glycol monomethyl ether or tetrahydrofuran can be used.

As the nitrile-based solvent, acetonitrile can be used.

The organic solvent contained in the peeling solution may be used alone or two or more kinds thereof. In addition, the organic solvent may be used by being mixed with a solvent other than the solvents described above.

Particularly, it is preferable that the peeling solution contains at least one organic solvent selected from a group consisting of a ketone-based solvent, an alcohol-based solvent, an ether-based solvent, and a nitrile-based solvent.

<<(6) Process of Dissolving and Removing Water-Soluble Resin Film Using Water>>

After etching, the water-soluble resin film is removed using water. In this manner, for example, a substrate in which the organic semiconductor film 2 is patterned is obtained as illustrated in FIG. 1(E).

As a method of removing the water-soluble resin film using water, a method of spraying cleaning water to the resist pattern from a spray type or shower type spray nozzle and removing the water-soluble resin film is exemplified. As the cleaning water, pure water can be preferably used. Further, as the spray nozzle, a spray nozzle in which the entire support is included in the spray range or a spray nozzle which is a movable spray nozzle and in which the entire support is included in the movable range can be exemplified. In a case where the injection nozzle is a movable type nozzle, the resist pattern can be more effectively removed by moving the injection nozzle from the center portion of the support to the end portion of the support two or more times during the process of removing the water-soluble resin film and spraying cleaning water.

It is preferable that a process of drying or the like is performed after water is removed. The drying temperature is preferably in a range of 80° C. to 120° C.

INDUSTRIAL APPLICABILITY

The present invention can be used for production of an electronic device using an organic semiconductor. Here, the electronic device means a device that includes a semiconductor and two or more electrodes and controls a current flowing between the electrodes and a voltage to be generated using electricity, light, magnetism, and chemical substances or a device that generates light, an electric field, or a magnetic field using applied voltage or a current. Examples thereof include an organic photoelectric conversion element, an organic field effect transistor, an organic electroluminescence light emitting device, a gas sensor, an organic rectifying element, an organic inverter, and an information recording element. The organic photoelectric conversion element can be used for a light sensor and energy conversion (solar cell). Among these, an organic field effect transistor, an organic photoelectric conversion element, or an organic electroluminescence light emitting device is preferable, an organic field effect transistor or an organic photoelectric conversion element is more preferable, and an organic field effect transistor is particularly preferable.

EXAMPLES

Hereinafter, the present invention will be more specifically described with reference to examples, but the present invention is not limited to the examples described below within the range not departing from the scope of the present invention. Further, "%" and "parts" are on a mass basis unless otherwise noted.

Abbreviations of respective compounds respectively indicate the following compounds.

BzMA: benzyl methacrylate (manufactured by Wako Pure Chemical Industries, Ltd.)
t-BuMA: tert-butyl methacrylate (manufactured by Wako Pure Chemical Industries, Ltd.)
MA: methacrylic acid (manufactured by Wako Pure Chemical Industries, Ltd.)
PMA: phenyl methacrylate (manufactured by Wako Pure Chemical Industries, Ltd.)
THFMA: 2-tetrahydrofuranyl methacrylate (synthetic product)
TFFAA: 2-tetrahydrofuranyl acrylate (synthetic product)
MTHFMA: 5-methyl-2-tetrahydrofuranyl methacrylate (synthetic product)
THPMA: 2-tetrahydropyranyl methacrylate (synthetic product)
THPAA: 2-tetrahydropyranyl acrylate (synthetic product)
PEES: p-ethoxyethoxystyrene
V-601: dimethyl 2,2-azobis(2-methylpropionate) (manufactured by Wako Pure Chemical Industries, Ltd.)
PGMEA: methoxypropyl acetate (manufactured by Daicel Corporation)

Synthesis Example 1

Synthesis of THFMA 50.33 g (0.585 mol) of methacrylic acid and 0.27 g (0.2% by mole) of camphorsulfonic acid were mixed with each other in a three-necked flask and then the mixture was cooled to 15° C. 41.00 g (0.585 mol) of 2,3-dihydrofuran was added dropwise to the solution. A saturated sodium bicarbonate solution (500 mL) was added dropwise to the reaction solution, and the resultant was extracted with ethyl acetate (500 mL) and dried over magnesium sulfate. The insoluble matter was concentrated at 40° C. or lower under a reduced pressure after filtration and a colorless oil residue was distilled off under reduced pressure, thereby obtaining 73.02 g of THFMA.

Synthesis Example 2

Synthesis of THFAA 42.16 g (0.585 mol) of acrylic acid and 0.27 g (0.2% by mole) of camphorsulfonic acid were mixed with each other in a three-necked flask and then the mixture was cooled to 15° C. 41.00 g (0.585 mol) of 2,3-dihydrofuran was added dropwise to the solution. A saturated sodium bicarbonate solution (500 mL) was added dropwise to the reaction solution, and the resultant was extracted with ethyl acetate (500 mL) and dried over magnesium sulfate. The insoluble matter was concentrated at 40° C. or lower under a reduced pressure after filtration and a colorless oil residue was distilled off under reduced pressure, thereby obtaining 62.18 g of THFAA.

Synthesis Example 3

Synthesis of MTHFMA 50.33 g (0.585 mol) of methacrylic acid and 0.27 g (0.2% by mole) of camphorsulfonic acid were mixed with each other in a three-necked flask and then the mixture was cooled to 15° C. 49.21 g (0.585 mol) of 5-methyl-2,3-dihydrofuran was added dropwise to the solution. A saturated sodium bicarbonate solution (500 mL) was added dropwise to the reaction solution, and the resultant was extracted with ethyl acetate (500 mL) and dried over magnesium sulfate. The insoluble matter was concentrated at 40° C. or lower under a reduced pressure after filtration and a colorless oil residue was distilled off under reduced pressure, thereby obtaining 66.70 g of MTHFMA.

Synthesis Example 4

Synthesis of THPMA 50.33 g (0.585 mol) of methacrylic acid and 0.27 g (0.2% by mole) of camphorsulfonic acid were mixed with each other in a three-necked flask and then the mixture was cooled to 15° C. 49.21 g (0.585 mol) of 3,4-dihydrofuran was added dropwise to the solution. A saturated sodium bicarbonate solution (500 mL) was added dropwise to the reaction solution, and the resultant was extracted with ethyl acetate (500 mL) and dried over magnesium sulfate. The insoluble matter was concentrated at 40° C. or lower under a reduced pressure after filtration and a colorless oil residue was distilled off under reduced pressure, thereby obtaining 68.64 g of THPMA.

Synthesis Example 5

Synthesis of THPAA 42.16 g (0.585 mol) of acrylic acid and 0.27 g (0.2% by mole) of camphorsulfonic acid were mixed with each other in a three-necked flask and then the mixture was cooled to 15° C. 49.21 g (0.585 mol) of 3,4-dihydrofuran was added dropwise to the solution. A saturated sodium bicarbonate solution (500 mL) was added dropwise to the reaction solution, and the resultant was extracted by ethyl acetate (500 mL) and dried over magnesium sulfate. The insoluble matter was concentrated at 40° C. or lower under a reduced pressure after filtration and a colorless oil residue was distilled off under reduced pressure, thereby obtaining 63.13 g of THPAA.

Synthesis Example 6

Synthesis of Specific Resin C1

PGMEA (18.12 g) was added to a three-necked flask and the temperature was increased to 86° C. under a nitrogen atmosphere. BzMA (9.25 g), THFMA (11.71 g), t-BuMA (3.20 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C1 was obtained. The weight average molecular weight was 15000.

Synthesis Example 7

Synthesis of Specific Resin C2

PGMEA (18.12 g) was added to a three-necked flask and the temperature was increased to 86° C. under a nitrogen atmosphere. BzMA (9.25 g), THFAA (10.66 g), t-BuMA (3.20 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C2 was obtained. The weight average molecular weight was 14000.

Synthesis Example 8

Synthesis of Specific Resin C3

PGMEA (18.12 g) was added to a three-necked flask and the temperature was increased to 86° C. under a nitrogen atmosphere. BzMA (9.25 g), MTHFAA (11.71 g), t-BuMA (3.20 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C3 was obtained. The weight average molecular weight was 15000.

Synthesis Example 9

Synthesis of Specific Resin C4

PGMEA (18.12 g) was added to a three-necked flask and the temperature was increased to 86° C. under a nitrogen atmosphere. BzMA (9.25 g), THPMA (12.76 g), t-BuMA (3.20 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C4 was obtained. The weight average molecular weight was 16000.

Synthesis Example 10

Synthesis of Specific Resin C5

PGMEA (18.12 g) was added to a three-necked flask and the temperature was increased to 86° C. under a nitrogen atmosphere. BzMA (9.25 g), THPMA (11.71 g), t-BuMA (3.20 g), and V-601 (0.895 g, 2.59% by mole with respect to monomers) were dissolved in in PGMEA (18.12 g) and the mixture was added dropwise to a solution over 2 hours. After dropwise addition, the solution was stirred for 4 hours and the reaction finished. In this manner, a specific resin C5 was obtained. The weight average molecular weight was 16000.

Synthesis Example 11

Synthesis of Specific Resin C6

PGMEA (18.12 g) was added to a three-necked flask and the temperature was increased to 86° C. under a nitrogen atmosphere. BzMA (14.53 g), t-BuMA (9.59 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C6 was obtained. The weight average molecular weight was 16000.

Synthesis Example 12

Synthesis of Specific Resin C7

PGMEA (18.12 g) was added to a three-necked flask and the temperature was increased to 86° C. under a nitrogen atmosphere. BzMA (9.25 g), PEES (14.43 g), t-BuMA (3.20 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C7 was obtained. The weight average molecular weight was 16000.

Synthesis Example 13

Synthesis of Specific Resin C8

PGMEA (18.12 g) was added to a three-necked flask and the temperature was increased to 86° C. under a nitrogen atmosphere. BzMA (14.54 g), PEES (12.99 g), and V-601 (0.895 g, 2.59% by mole with respect to monomers) were dissolved in the PGMEA (18.12 g) and the mixture was added dropwise to a solution over 2 hours. After dropwise addition, the solution was stirred for 4 hours and the reaction finished. In this manner, a specific resin C8 was obtained. The weight average molecular weight was 16000.

Synthesis Example 14

Synthesis of Photoacid Generator D1

Aluminum chloride (10.6 g) and 2-chloropropionyl chloride (10.1 g) were added to a suspension of 2-naphthol (10 g) and chlorobenzene (30 mL) and the mixed solution was heated to 40° C. and reacted for 2 hours. Under ice-cold conditions, a 4N-HCl aqueous solution (60 mL) was added dropwise to the reaction solution and ethyl acetate (50 mL) was added to the solution for liquid separation. Potassium carbonate (19.2 g) was added to an organic layer, the mixture was reacted at 40° C. for 1 hour, a 2N-HCl aqueous solution (60 mL) was added for liquid separation, the organic layer was concentrated, and crystals were reslurried with diisopropyl ether (10 mL), filtered off, and dried, thereby obtaining a ketone compound (6.5 g).

Acetic acid (7.3 g) and a 50 mass % hydroxylamine aqueous solution (8.0 g) were added to a suspension of the obtained ketone compound (3.0 g) and methanol (30 mL), and the solution was heated and refluxed. After the solution was cooled, water (50 mL) was added thereto, and deposited crystals were filtered off and then washed with cold methanol and dried, thereby obtaining an oxime compound (2.4 g).

The obtained oxime compound (1.8 g) was dissolved in acetone (20 mL), trimethylamine (1.5 g) and p-toluenesulfonyl chloride (2.4 g) were added thereto under ice-cold conditions, the temperature was increased to room temperature, and the solution was reacted for 1 hour. Water (50 mL) was added to the reaction solution and the deposited crystals were filtered off, reslurried with methanol (20 mL), filtered off, and dried, thereby obtaining D1 (2.3 g).

Further, $^1$H-NMR spectrum (300 MHz, CNCl$_3$) of D1 was δ=8.3 (d, 1H), 8.0 (d, 2H), 7.9 (d, 1H), 7.8 (d, 1H), 7.6 (dd, 1H), 7.4 (dd, 1H), 7.3 (d, 2H), 7.1 (d, 1H), 5.6 (q, 1H), 2.4 (s, 3H), and 1.7 (d, 3H).

Synthesis Example 15

Synthesis of Photoacid Generator D2

Aluminum chloride (10.6 g) and 2-chloropropionyl chloride (10.1 g) were added to a suspension of 2-naphthol (10 g) and chlorobenzene (30 mL) and the mixed solution was heated to 40° C. and reacted for 2 hours. Under ice-cold conditions, a 4N-HCl aqueous solution (60 mL) was added dropwise to the reaction solution and ethyl acetate (50 mL) was added to the solution for liquid separation. Potassium carbonate (19.2 g) was added to an organic layer, the mixture was reacted at 40° C. for 1 hour, a 2N-HCl aqueous solution (60 mL) was added for liquid separation, the organic layer was concentrated, and crystals were reslurried with diisopropyl ether (10 mL), filtered off, and dried, thereby obtaining a ketone compound (6.5 g).

Acetic acid (7.3 g) and a 50 mass % hydroxylamine aqueous solution (8.0 g) were added to a suspension of the obtained ketone compound (3.0 g) and methanol (30 mL), and the solution was heated and refluxed. After the solution was cooled, water (50 mL) was added thereto, and deposited crystals were filtered off and then washed with cold methanol and dried, thereby obtaining an oxime compound (2.4 g).

The obtained oxime compound (1.8 g) was dissolved in acetone (20 mL), trimethylamine (1.5 g) and p-toluenesulfonyl chloride (2.4 g) were added thereto under ice-cold conditions, the temperature was increased to room temperature, and the solution was reacted for 1 hour. Water (50 mL) was added to the reaction solution and the deposited crystals were filtered off, reslurried with methanol (20 mL), filtered off, and dried, thereby obtaining D2 (2.3 g).

Further, $^1$H-NMR spectrum (300 MHz, CDCl$_3$) of D2 was δ=8.3 (d, 1H), 8.0 (d, 2H), 7.9 (d, 1H), 7.8 (d, 1H), 7.6 (dd, 1H), 7.4 (dd, 1H), 7.3 (d, 2H), 7.1 (d. 1H), 5.6 (q, 1H), 2.4 (s, 3H), and 1.7 (d, 3H).

Synthesis Example 16

Synthesis of Photoacid Generator D3

Aluminum chloride (10.6 g) and 2-chloropropionyl chloride (10.1 g) were added to a suspension of 2-naphthol (10 g) and chlorobenzene (30 mL) and the mixed solution was heated to 40° C. and reacted for 2 hours. Under ice-cold conditions, a 4N-HCl aqueous solution (60 mL) was added dropwise to the reaction solution and ethyl acetate (50 mL) was added to the solution for liquid separation. Potassium carbonate (19.2 g) was added to an organic layer, the mixture was reacted at 40° C. for 1 hour, a 2N-HCl aqueous solution (60 mL) was added for liquid separation, the organic layer was concentrated, and crystals were reslurried with diisopropyl ether (10 mL), filtered off, and dried, thereby obtaining a ketone compound (6.5 g).

Acetic acid (7.3 g) and a 50 mass % hydroxylamine aqueous solution (8.0 g) were added to a suspension of the obtained ketone compound (3.0 g) and methanol (30 mL), and the solution was heated and refluxed. After the solution was cooled, water (50 mL) was added thereto, and deposited crystals were filtered off and then washed with cold methanol and dried, thereby obtaining an oxime compound (2.4 g).

The obtained oxime compound (1.8 g) was dissolved in acetone (20 mL), trimethylamine (1.5 g) and p-toluenesulfonyl chloride (2.4 g) were added thereto under ice-cold conditions, the temperature was increased to room temperature, and the solution was reacted for 1 hour. Water (50 mL) was added to the reaction solution and the deposited crystals were filtered off, reslurried with methanol (20 mL), filtered off, and dried, thereby obtaining D3 (2.3 g).

Further, $^1$H-NMR spectrum (300 MHz, CNCl$_3$) of D3 was δ=8.3 (d, 1H), 8.0 (d, 2H), 7.9 (d, 1H), 7.8 (d, 1H), 7.6 (dd, 1H), 7.4 (dd, 1H), 7.3 (d, 2H), 7.1 (d. 1H), 5.6 (q, 1H), 2.4 (s, 3H), and 1.7 (d, 3H).

(1) Preparation of Water-Soluble Resin Composition and Photosensitive Resin Composition Respective components listed in table below were mixed to obtain a uniform solution, the solution was filtered using a polytetrafluoroethylene filter having a pore size of 0.1 μm, and then water-soluble resin compositions and photosensitive resin compositions of Examples 1 to 21 and Comparative Examples 1 to 12 were respectively prepared.

TABLE 1

| | Water-soluble resin composition | | | | | | Chemically amplified photosensitive resin composition | | | | | | | | | |
|---|---|---|---|---|---|---|---|---|---|---|---|---|---|---|---|---|
| | Water-soluble resin | | Surfactant | | Solvent | | Specific resin | | Photoacid generator | | Decomposition rate of photoacid generator | Basic compound | | Surfactant | | Solvent | |
| | Type | Parts | Type | Parts | Type | Parts | Type | Parts | Type | Parts | | Type | Parts | Type | Parts | Type | Parts |
| Example 1 | A1 | 9.9 | B1 | 0.1 | Water | 90 | C1 | 14.75 | D1 | 0.16 | A | E1 | 0.05 | F1 | 0.05 | PGMEA | 85.00 |
| Example 2 | A1 | 9.9 | B1 | 0.1 | Water | 90 | C1 | 14.75 | D2 | 0.16 | A | E1 | 0.05 | F1 | 0.05 | PGMEA | 85.00 |
| Example 3 | A1 | 9.9 | B1 | 0.1 | Water | 90 | C1 | 14.75 | D3 | 0.16 | A | E1 | 0.05 | F1 | 0.05 | PGMEA | 85.00 |
| Example 4 | A1 | 9.9 | B1 | 0.1 | Water | 90 | C2 | 14.75 | D1 | 0.16 | A | E1 | 0.05 | F1 | 0.05 | PGMEA | 85.00 |
| Example 5 | A1 | 9.9 | B1 | 0.1 | Water | 90 | C2 | 14.75 | D2 | 0.16 | A | E1 | 0.05 | F1 | 0.05 | PGMEA | 85.00 |
| Example 6 | A1 | 9.9 | B1 | 0.1 | Water | 90 | C2 | 14.75 | D3 | 0.16 | A | E1 | 0.05 | F1 | 0.05 | PGMEA | 85.00 |
| Example 7 | A1 | 9.9 | B1 | 0.1 | Water | 90 | C3 | 14.75 | D1 | 0.16 | A | E1 | 0.05 | F1 | 0.05 | PGMEA | 85.00 |
| Example 8 | A1 | 9.9 | B1 | 0.1 | Water | 90 | C3 | 14.75 | D2 | 0.16 | A | E1 | 0.05 | F1 | 0.05 | PGMEA | 85.00 |
| Example 9 | A1 | 9.9 | B1 | 0.1 | Water | 90 | C3 | 14.75 | D3 | 0.16 | A | E1 | 0.05 | F1 | 0.05 | PGMEA | 85.00 |
| Example 10 | A1 | 9.9 | B1 | 0.1 | Water | 90 | C4 | 14.75 | D1 | 0.16 | A | E1 | 0.05 | F1 | 0.05 | PGMEA | 85.00 |
| Example 11 | A1 | 9.9 | B1 | 0.1 | Water | 90 | C4 | 14.75 | D2 | 0.16 | A | E1 | 0.05 | F1 | 0.05 | PGMEA | 85.00 |
| Example 12 | A1 | 9.9 | B1 | 0.1 | Water | 90 | C4 | 14.75 | D3 | 0.16 | A | E1 | 0.05 | F1 | 0.05 | PGMEA | 85.00 |
| Example 13 | A1 | 9.9 | B1 | 0.1 | Water | 90 | C5 | 14.75 | D1 | 0.16 | A | E1 | 0.05 | F1 | 0.05 | PGMEA | 85.00 |
| Example 14 | A1 | 9.9 | B1 | 0.1 | Water | 90 | C5 | 14.75 | D2 | 0.16 | A | E1 | 0.05 | F1 | 0.05 | PGMEA | 85.00 |
| Example 15 | A1 | 9.9 | B1 | 0.1 | Water | 90 | C5 | 14.75 | D3 | 0.16 | A | E1 | 0.05 | F1 | 0.05 | PGMEA | 85.00 |
| Example 16 | A1 | 9.9 | B1 | 0.1 | Water | 90 | C6 | 14.75 | D1 | 0.16 | A | E1 | 0.05 | F1 | 0.05 | PGMEA | 85.00 |
| Example 17 | A1 | 9.9 | B1 | 0.1 | Water | 90 | C7 | 14.75 | D1 | 0.16 | A | E1 | 0.05 | F1 | 0.05 | PGMEA | 85.00 |
| Example 18 | A1 | 9.9 | B1 | 0.1 | Water | 90 | C8 | 14.75 | D1 | 0.16 | A | E1 | 0.05 | F1 | 0.05 | PGMEA | 85.00 |
| Example 19 | A2 | 9.9 | B1 | 0.1 | Water | 90 | C1 | 14.75 | D1 | 0.16 | A | E1 | 0.05 | F1 | 0.05 | PGMEA | 85.00 |
| Example 20 | A3 | 9.9 | B1 | 0.1 | Water | 90 | C1 | 14.75 | D1 | 0.16 | A | E1 | 0.05 | F1 | 0.05 | PGMEA | 85.00 |
| Example 21 | A4 | 9.9 | B1 | 0.1 | Water | 90 | C1 | 14.75 | D1 | 0.16 | A | E1 | 0.05 | F1 | 0.05 | PGMEA | 85.00 |
| Comparative Example 1 | A1 | 9.9 | B1 | 0.1 | Water | 90 | C1 | 14.75 | D4 | 0.16 | B | E1 | 0.05 | F1 | 0.05 | PGMEA | 85.00 |
| Comparative Example 2 | A1 | 9.9 | B1 | 0.1 | Water | 90 | C1 | 14.75 | D5 | 0.16 | C | E1 | 0.05 | F1 | 0.05 | PGMEA | 85.00 |
| Comparative Example 3 | A1 | 9.9 | B1 | 0.1 | Water | 90 | C1 | 14.75 | D6 | 0.16 | C | E1 | 0.05 | F1 | 0.05 | PGMEA | 85.00 |
| Comparative Example 4 | A1 | 9.9 | B1 | 0.1 | Water | 90 | C6 | 14.75 | D4 | 0.16 | B | E1 | 0.05 | F1 | 0.05 | PGMEA | 85.00 |
| Comparative Example 5 | A1 | 9.9 | B1 | 0.1 | Water | 90 | C6 | 14.75 | D5 | 0.16 | C | E1 | 0.05 | F1 | 0.05 | PGMEA | 85.00 |
| Comparative Example 6 | A1 | 9.9 | B1 | 0.1 | Water | 90 | C6 | 14.75 | D6 | 0.16 | C | E1 | 0.05 | F1 | 0.05 | PGMEA | 85.00 |
| Comparative Example 7 | A1 | 9.9 | B1 | 0.1 | Water | 90 | C7 | 14.75 | D4 | 0.16 | B | E1 | 0.05 | F1 | 0.05 | PGMEA | 85.00 |
| Comparative Example 8 | A1 | 9.9 | B1 | 0.1 | Water | 90 | C7 | 14.75 | D5 | 0.16 | C | E1 | 0.05 | F1 | 0.05 | PGMEA | 85.00 |
| Comparative Example 9 | A1 | 9.9 | B1 | 0.1 | Water | 90 | C7 | 14.75 | D6 | 0.16 | C | E1 | 0.05 | F1 | 0.05 | PGMEA | 85.00 |
| Comparative Example 10 | A1 | 9.9 | B1 | 0.1 | Water | 90 | C8 | 14.75 | D4 | 0.16 | B | E1 | 0.05 | F1 | 0.05 | PGMEA | 85.00 |
| Comparative Example 11 | A1 | 9.9 | B1 | 0.1 | Water | 90 | C8 | 14.75 | D5 | 0.16 | C | E1 | 0.05 | F1 | 0.05 | PGMEA | 85.00 |
| Comparative Example 12 | A1 | 9.9 | B1 | 0.1 | Water | 90 | C8 | 14.75 | D6 | 0.16 | C | E1 | 0.05 | F1 | 0.05 | PGMEA | 85.00 |

Abbreviations in Table 1 are as follows.

A1: polyvinyl pyrrolidone (Pitts call K-30, manufactured by DKS Co., Ltd., sp value: 22.5 $(MPa)^{1/2}$)

A2: polyvinyl alcohol (PXP-05, manufactured by JAPAN VAM & POVAL CO., LTD., sp value: 25.8 $(MPa)^{1/2}$)

A3: pullulan (manufactured by Hayashibara Co., Ltd., sp value: 27.8 $(MPa)^{1/2}$)

A4: methyl cellulose (Metolose SM-4, manufactured by Shin-Etsu Chemical Co., Ltd., sp value: 35.6 $(MPa)^{1/2}$)

B1: acetylenol E00 (manufactured by Kawaken Fine Chemical Co., Ltd.)

D1: (the following structure, synthetic product)

D2: (the following structure, synthetic product)

D3: (the following structure, synthetic product)

D4: WPAG-336 (the following structure, manufactured by Wako Pure Chemical Industries, Ltd.)

D5: WPAG-443 (the following structure, manufactured by Wako Pure Chemical Industries, Ltd.)

D6: MBZ-101 (the following structure, manufactured by Midori Kagaku Co., Ltd.)

E1: cyclohexyl morpholinoethyl thiourea (the following structure, manufactured by Inabata & Co., Ltd.)

F1: PF-6320 (the following structure, manufactured by OMNOVA Solutions Inc.)

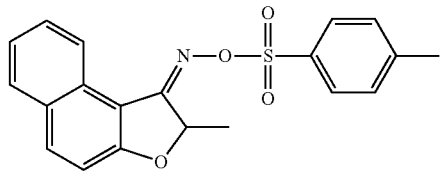

D1

-continued

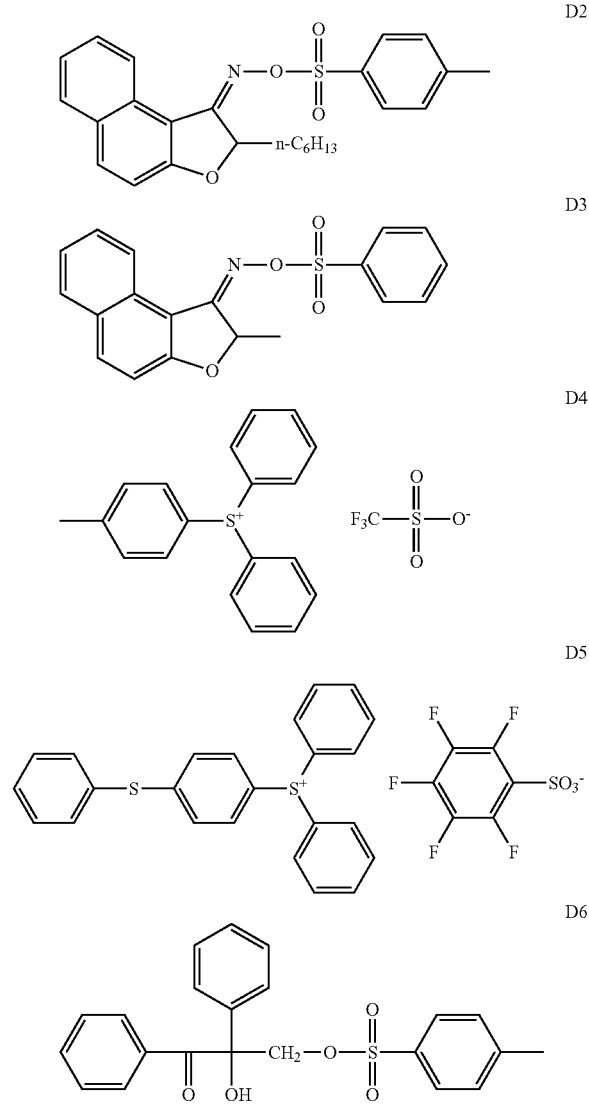

(2) Preparation of Organic Semiconductor Substrate

An organic semiconductor film was formed by spin-coating a glass substrate having dimensions of 5 cm² with an organic semiconductor coating solution formed of a composition described below and drying the glass substrate at 130° C. for 10 minutes. The film thickness was 150 nm.

Composition of organic semiconductor coating solution:

| | |
|---|---|
| P3HT (manufactured by Sigma-Aldrich Co., LLC.) | 10% by mass |
| PCBM (manufactured by Sigma-Aldrich Co., LLC.) | 10% by mass |
| Chloroform (manufactured by Wako Pure Chemical Industries, Ltd.) | 80% by mass |

(3) Process of Coating Substrate with Water-Soluble Resin Composition

A water-soluble resin film was formed by spin-coating the organic semiconductor film formed on the substrate with a water-soluble resin composition formed of a composition listed in the table above and drying the substrate at 100° C. for 1 minute. The film thickness was 320 nm.

(4) Process of Preparing Mask Pattern of Resin on Water-Soluble Resin Film

The formed water-soluble resin film was spin-coated with a chemically amplified photosensitive resin composition formed of a composition listed in the table above and dried at 100° C. for 1 minute. The film thickness was 700 nm. Next, the film was exposed to light under the condition of 135 mJ/cm² using an i-line a parallel light exposure device. Subsequently, the film was heated at 100° C. for 1 minute and developed using butyl acetate, thereby obtaining a mask pattern.

(5) Process of Removing Water-Soluble Resin and Organic Semiconductor of Non-Mask Portion by Performing Dry Etching The water-soluble resin film of a non-mask pattern portion and the organic semiconductor film of the non-mask pattern portion were removed by performing dry etching on the substrate under the following conditions.

Gas: $CF_4$ (flow rate: 200 mL/min), Ar (flow rate: 800 mL/min), $O_2$ (flow rate: 50 mL/min)
Source power: 800 W
Wafer bias: 600 W
Antenna bias: 100 W
ESC voltage: 400 V
Time: 60 sec (6) Process of Dissolving Remaining Water-Soluble Resin in Water and Removing the Same The obtained substrate was washed with water, a pattern formed of the water-soluble resin film was removed, the substrate was heated at 100° C. for 10 minutes, moisture remaining on the organic semiconductor film was removed, and the film was dried so that the damage during the process was repaired, thereby obtaining a substrate on which the organic semiconductor film was patterned.

(7) Evaluation

[In-Plane Uniformity of Water-Soluble Resin Film]

The in-plane uniformity of the water-soluble resin film, before the process of preparing the mask pattern of a resin on the water-soluble resin film was carried out was measured. Specifically, in the film thickness of the water-soluble resin film, the film thicknesses at a total of 100 places from which 2 mm of the outermost peripheral portion was removed were evaluated using a reflecting spectrographic film thickness meter. The evaluation was performed in three stages based on the following criteria using a coefficient of variation CV (=standard deviation of film thicknesses/average value of film thicknesses).

A: $CV < 0.01$
B: $0.01 \leq CV < 0.04$
C: $0.04 \leq CV$

[Decomposition Rate of Photoacid Generator when Exposed to Light Under a Condition of 100 mJ/Cm² or Greater at a Wavelength of 365 nm]

A silicon wafer was coated with a chemically amplified photosensitive resin composition having a film thickness of 700 nm and heated at 100° C. for 1 minute. Subsequently, the substrate exposed to light under the condition of 100 mJ/cm² at a wavelength of 365 nm and heated at 100° C. for 1 minute was immersed in a mixture of methanol and THF (mass ratio: 50/50) for 10 minutes while ultrasonic waves were applied to the solution. The decomposition rate of the photoacid generator was calculated using the following formula by analyzing an extract with HPLC and evaluation was performed based on the following criteria.

Decomposition rate (%)=Amount of decomposition product (mol)/Feed amount (mol)×100

A: 80% by mole or greater of the photoacid generator was decomposed.

B: 40% by mole to less than 80% by mole of the photoacid generator was decomposed.

C: Less than 40% by mole of the photoacid generator was decomposed.

[Pattern Shape of Resist Film]

The taper angle of the chemically amplified photosensitive resin composition was evaluated based on the following criteria by performing section observation on the pattern of the chemically amplified photosensitive resin composition, which was formed by a contact aligner, using a scanning electron microscope.

A: The taper angle of the resin pattern in a 1 μm L/S pattern was 80° or greater.

B: The residual film ratio of the resin pattern in a 1 μm L/S pattern was lower than 80°.

C: Patterning was impossible.

[Pattern Shape of Organic Semiconductor Film]

The line width of the organic semiconductor was evaluated based on the following criteria by performing observation on the pattern of the organic semiconductor, after dry etching was performed and the water-soluble resin film was removed, using a scanning electron microscope.

A: The line-width of the organic semiconductor in the 1 μm L/S pattern of the chemically amplified photosensitive resin composition was 0.8 μm or greater.

B: The line-width of the organic semiconductor in the 1 μm L/S pattern of the chemically amplified photosensitive resin composition was less than 0.8 μm.

C: Patterning was impossible.

TABLE 2

|  | Water-soluble resin film | Chemically amplified photosensitive resin composition Specific resin Type | Photoacid generator Type | In-plane uniformity of water-soluble resin film | Pattern shape of resist film | Pattern shape of organic semi-conductor film |
|---|---|---|---|---|---|---|
| Example 1 | A1 | C1 | D1 | A | A | A |
| Example 2 | A1 | C1 | D2 | A | A | A |
| Example 3 | A1 | C1 | D3 | A | A | A |
| Example 4 | A1 | C2 | D1 | A | A | A |
| Example 5 | A1 | C2 | D2 | A | A | A |
| Example 6 | A1 | C2 | D3 | A | A | A |
| Example 7 | A1 | C3 | D1 | A | A | A |
| Example 8 | A1 | C3 | D2 | A | A | A |
| Example 9 | A1 | C3 | D3 | A | A | A |
| Example 10 | A1 | C4 | D1 | A | A | A |
| Example 11 | A1 | C4 | D2 | A | A | A |
| Example 12 | A1 | C4 | D3 | A | A | A |
| Example 13 | A1 | C5 | D1 | A | A | A |
| Example 14 | A1 | C5 | D2 | A | A | A |
| Example 15 | A1 | C5 | D3 | A | A | A |
| Example 16 | A1 | C6 | D1 | A | B | B |
| Example 17 | A1 | C7 | D1 | A | B | B |
| Example 18 | A1 | C8 | D1 | A | B | B |
| Example 19 | A2 | C1 | D1 | B | A | B |
| Example 20 | A3 | C1 | D1 | B | A | B |
| Example 21 | A4 | C1 | D1 | B | B | B |
| Comparative Example 1 | A1 | C1 | D4 | A | B | C |
| Comparative Example 2 | A1 | C1 | D5 | A | B | C |
| Comparative Example 3 | A1 | C1 | D6 | A | B | C |
| Comparative Example 4 | A1 | C6 | D4 | A | C | C |
| Comparative Example 5 | A1 | C6 | D5 | A | C | C |
| Comparative Example 6 | A1 | C6 | D6 | A | C | C |
| Comparative Example 7 | A1 | C7 | D4 | A | C | C |
| Comparative Example 8 | A1 | C7 | D5 | A | C | C |
| Comparative Example 9 | A1 | C7 | D6 | A | C | C |
| Comparative Example 10 | A1 | C8 | D4 | A | C | C |
| Comparative Example 11 | A1 | C8 | D5 | A | C | C |
| Comparative Example 12 | A1 | C8 | D6 | A | C | C |

As listed in the table above, in Examples 1 to 21, the water-soluble resin film had excellent in-plane uniformity and excellent pattern forming properties in the resist film. Accordingly, it could be understood that a fine pattern of the organic semiconductor was able to be formed. Meanwhile, in Comparative Examples 1 to 12, the in-plane uniformity and the pattern forming properties were degraded. For this reason, it could be understood that it was unlikely that a fine pattern in the organic semiconductor would be able to be formed.

The same as in Examples and Comparative Examples above was performed except that the composition of the water-soluble resin film was changed as described below. It was found that the same tendencies as those in Examples and Comparative Examples were exhibited, as the results therefor.

<Composition 1 of Water-Soluble Resin Composition>

| | |
|---|---|
| Polyvinyl pyrrolidone (Pitts call K-30, manufactured by DKS Co., Ltd.) | 14.475% by mass |
| Glycerin (manufactured by Sigma-Aldrich Co., LLC.) | 0.45% by mass |
| Acetylenol E00 (manufactured by Kawaken Fine Chemical Co., Ltd.) | 0.075% by mass |
| Water | 85% by mass |

<Composition 2 of Water-Soluble Resin Composition>

| | |
|---|---|
| Polyvinyl pyrrolidone (Pitts call K-30, manufactured by DKS Co., Ltd.) | 13.433% by mass |
| Polyvinyl alcohol (PXP-05, manufactured by JAPAN VAM & POVAL CO., LTD.) | 1.493% by mass |
| Acetylenol E00 (manufactured by Kawaken Fine Chemical Co., Ltd.) | 0.075% by mass |
| 2-propanol (manufactured by Sigma-Aldrich Co., LLC.) | 4.25% by mass |
| Water | 80.75% by mass |

The same as in Examples and Comparative Examples above was performed except that the composition of the organic semiconductor coating solution was changed as described below. As a result, it was recognized that the same tendencies as those in Examples and Comparative Examples were shown.

<Composition 1 of Organic Semiconductor Coating Solution>

| | |
|---|---|
| TIPS pentacene (manufactured by Sigma-Aldrich Co., LLC.) | 5% by mass |
| Toluene (manufactured by Sigma-Aldrich Co., LLC.) | 95% by mass |

<Composition 2 of Organic Semiconductor Coating Solution>

| | |
|---|---|
| MEH-PPV (manufactured by Sigma-Aldrich Co., LLC.) | 10% by mass |
| Toluene (manufactured by Sigma-Aldrich Co., LLC.) | 90% by mass |

<Composition 3 of Organic Semiconductor Coating Solution>

| | |
|---|---|
| PEDOT/PSS (manufactured by Sigma-Aldrich Co., LLC., 1.3% by mass aqueous dispersion liquid) | 100% by mass |

The same as in Examples and Comparative Examples above was performed except that wet etching was performed using the following etching solution in place of dry etching. As a result, it was recognized that the same tendencies as those in Examples and Comparative Examples were shown.

<Etching Solution 1 in First Step>
Water 100% by mass
<Etching Solution 1 in Second Step>
Propylene glycol monomethyl ether 100% by mass
<Etching Solution 2 in First Step>
2-propanol 100% by mass
<Etching Solution 2 in Second Step>
Propylene glycol monomethyl ether 100% by mass
<Etching Solution 3 in First Step>
Water 100% by mass
<Etching Solution 3 in Second Step>
3-methyl-1-butanol 100% by mass The water-soluble resin film of a non-mask pattern portion and the organic semiconductor film of the non-mask pattern portion were removed by performing wet etching on the substrate under the following conditions.

System: Two Fluid Spray
<Etching in First Step>
Flow rate: 30 mL/min
Pressure: 200 kPa
Time: 30 sec
<Etching in Second Step>
Flow rate: 20 mL/min
Pressure: 200 kPa
Time: 10 sec The resist pattern was peeled using the obtained substrate under the following conditions, the pattern formed of the water-soluble resin film was removed by being washed with water and heated at 100° C. for 10 minutes, moisture remaining on the organic semiconductor film was removed, and the film was dried so that the damage during the process was repaired, thereby obtaining a substrate on which the organic semiconductor film was patterned.

System: paddle
Peeling solution: propylene glycol monomethyl ether
Time: 60 sec

Synthesis Example 17

Synthesis of Specific Resin C9

PGMEA (18.12 g) was added to a three-necked flask and the temperature was increased to 86° C. under a nitrogen atmosphere. BzMA (8.10 g), t-BuMA (11.00 g), MA (2.60 g), and V-601 (0.840 g, 2.37% by mole with respect to monomers) were dissolved in PGMEA (18.12 g) and the mixture was added dropwise to the solution for 2 hours. After dropwise addition, the solution was stirred for 4 hours and the reaction was finished. In this manner, a specific resin C9 represented by the following Structural Formula was obtained. The weight average molecular weight was 20000.

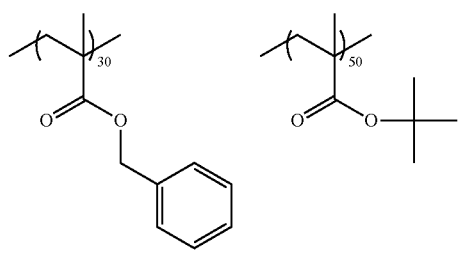

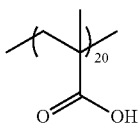

Synthesis Example 18

Synthesis of Specific Resin C10

PGMEA (18.12 g) was added to a three-necked flask and the temperature was increased to 86° C. under a nitrogen atmosphere. PMA (7.50 g), t-BuMA (11.00 g), MA (2.60 g), and V-601 (0.840 g, 2.37% by mole with respect to monomers) were dissolved in PGMEA (18.12 g) and the mixture was added dropwise to the solution for 2 hours. After dropwise addition, the solution was stirred for 4 hours and the reaction was finished. In this manner, a specific resin C10 represented by the following Structural Formula was obtained. The weight average molecular weight was 21000.

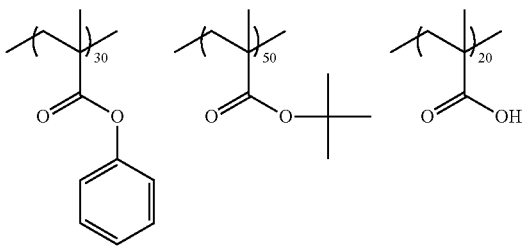

Synthesis Example 19

Synthesis of tBocMMA tBocMMA can be synthesized by reacting an alcohol with a carboxylic halide compound under basic conditions and reacting the resultant with a carboxylic acid compound under basic conditions using the same method as described in JP2005-331918A.

Synthesis Example 20

Synthesis of Specific Resin C11

PGMEA (18.12 g) was added to a three-necked flask and the temperature was increased to 86° C. under a nitrogen atmosphere. BzMA (8.10 g), the above-described tBocMMA (11.70 g), MA (4.20 g), and V-601 (0.840 g, 2.42% by mole with respect to monomers) were dissolved in PGMEA (18.12 g) and the mixture was added dropwise to the solution for 2 hours. After dropwise addition, the solution was stirred for 4 hours and the reaction was finished. In this manner, a specific resin C11 represented by the following structural formula was obtained. The weight average molecular weight was 19500.

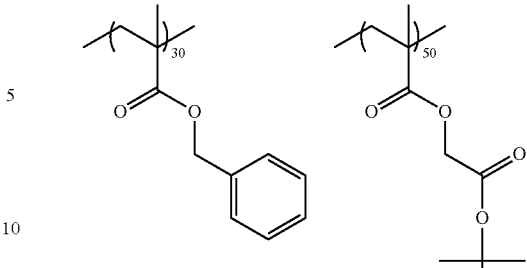

Synthesis Example 20

Synthesis of Specific Resin C12

PGMEA (18.12 g) was added to a three-necked flask and the temperature was increased to 86° C. under a nitrogen atmosphere. BzMA (9.25 g), THFMA (12.30 g), and V-601 (0.730 g, 2.41% by mole with respect to monomers) were dissolved in PGMEA (18.12 g) and the mixture was added dropwise to the solution for 2 hours. After dropwise addition, the solution was stirred for 4 hours and the reaction was finished. In this manner, a specific resin C12 was obtained. The weight average molecular weight was 15000.

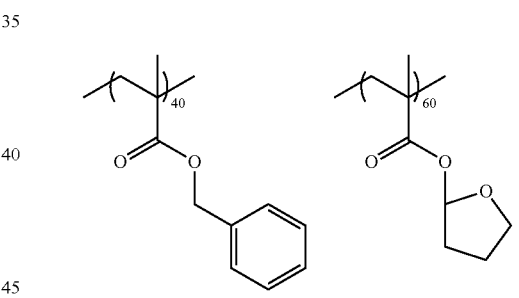

<Preparation of Water-Soluble Resin Composition and Chemically Amplified Photosensitive Resin Composition>

The following water-soluble resin composition and photosensitive resin composition were mixed with each other to obtain a uniform solution, the water-soluble resin composition was filtered using a nylon filter having a pore size of 0.8 µm, the chemically amplified photosensitive resin composition was filtered using a polytetrafluoroethylene filter having a pore size of 0.03 µm, and thus water-soluble resin compositions and chemically amplified photosensitive resin compositions of Examples 22 to 45 and Comparative Examples 13 to 20 were respectively prepared.

[Water-Soluble Resin Compositions]

Water-soluble resin listed in Table 3: parts by mass listed in Table 3 Acetylenol E00 (manufactured by Kawaken Fine Chemical Co., Ltd.): 0.1 parts by mass Solvent listed in Table 3: parts by mass listed in Table 3

Glycerin (only Example 25, manufactured by Tokyo Chemical Industry Co., Ltd.): 0.45 parts by mass

[Chemically Amplified Photosensitive Resin Compositions]

Resin listed in Table 3: parts by mass listed in Table 3
Photoacid generator listed in Table 3: parts by mass listed in Table 3
Basic compound listed in Table 3: parts by mass listed in Table 3
PF-6320 (manufactured by OMNOVA Solutions Inc.): 0.05 parts by mass
Propylene glycol monomethyl ether acetate (manufactured by Wako Pure Chemical Industries, Ltd.): 85 parts by mass <Photoacid Generator>
D7: NT-1TF (trifluoromethane sulfonic acid (pKa=−14)-generated 5-membered ring imide sulfonate type, molar absorption coefficient=5300 L/(mol·cm), manufactured by San-Apro Ltd.)
D8: NT-3TF (trifluoromethane sulfonic acid (pKa=−14)-generated 5-membered ring imide sulfonate type, molar absorption coefficient=6600 L/(mol·cm), manufactured by San-Apro Ltd.)
D9: the following structure (heptafluoropropane sulfonic acid (pKa=−8)-generated oxime sulfonate type, molar absorption coefficient=7000 L/(mol·cm))

TABLE 3

| | Water-soluble resin composition | | | | Chemically amplified photosensitive resin composition | | | | | | | |
|---|---|---|---|---|---|---|---|---|---|---|---|---|
| | Water-soluble resin | | Solvent | | Resin | | Photoacid generator | | | Decomposition rate of photoacid generator | Basic compound | |
| | Type | Parts by mass | Type | Parts by mass | Type | Parts by mass | Type | Parts by mass | Type | Parts by mass | Type | Parts by mass |
| | Type | Parts by mass | Type | Parts by mass | Type | Parts by mass | Type | pKa | Molar absorption coefficient | Parts by mass | | |

| | Type | Parts by mass | Type | Parts by mass | Type | Parts by mass | Type | Parts by mass | Type | pKa | Molar absorption coefficient | Parts by mass | Decomposition rate | Type | Parts by mass |
|---|---|---|---|---|---|---|---|---|---|---|---|---|---|---|---|
| Example 22 | A5 | 13 | | | Water | 86.9 | | | C9 | 14.3 | D7 | −14 | 5300 | 0.5 | A | E2 | 0.15 |
| Example 23 | A6 | 15 | | | Water | 84.9 | | | C9 | 14.3 | D7 | −14 | 5300 | 0.5 | A | E2 | 0.15 |
| Example 24 | A7 | 13 | | | Water | 86.9 | | | C9 | 14.3 | D7 | −14 | 5300 | 0.5 | A | E2 | 0.15 |
| Example 25 | A5 | 7 | A6 | 7 | Water | 85.9 | | | C9 | 14.3 | D7 | −14 | 5300 | 0.5 | A | E2 | 0.15 |
| Example 26 | A5 | 14.55 | | | Water | 84.9 | | | C9 | 14.3 | D7 | −14 | 5300 | 0.5 | A | E2 | 0.15 |
| Example 27 | A5 | 13 | | | Water | 82.4 | IPA | 4.5 | C9 | 14.3 | D7 | −14 | 5300 | 0.5 | A | E2 | 0.15 |
| Example 28 | A5 | 13 | | | Water | 86.9 | | | C9 | 14.3 | D7 | −14 | 5300 | 0.5 | A | E2 | 0.15 |
| Example 29 | A5 | 13 | | | Water | 86.9 | | | C9 | 14.3 | D7 | −14 | 5300 | 0.5 | A | E3 | 0.15 |
| Example 30 | A5 | 13 | | | Water | 86.9 | | | C9 | 14.3 | D7 | −14 | 5300 | 0.5 | A | E4 | 0.15 |
| Example 31 | A5 | 13 | | | Water | 86.9 | | | C10 | 14.3 | D7 | −14 | 5300 | 0.5 | A | E2 | 0.15 |
| Example 32 | A5 | 13 | | | Water | 86.9 | | | C10 | 14.3 | D7 | −14 | 5300 | 0.5 | A | E3 | 0.15 |
| Example 33 | A5 | 13 | | | Water | 86.9 | | | C10 | 14.3 | D7 | −14 | 5300 | 0.5 | A | E4 | 0.15 |
| Example 34 | A5 | 13 | | | Water | 86.9 | | | C11 | 14.3 | D7 | −14 | 5300 | 0.5 | A | E2 | 0.15 |
| Example 35 | A5 | 13 | | | Water | 86.9 | | | C11 | 14.3 | D7 | −14 | 5300 | 0.5 | A | E3 | 0.15 |
| Example 36 | A5 | 13 | | | Water | 86.9 | | | C11 | 14.3 | D7 | −14 | 5300 | 0.5 | A | E4 | 0.15 |
| Example 37 | A5 | 13 | | | Water | 86.9 | | | C9 | 14.3 | D8 | −14 | 6600 | 0.5 | A | E2 | 0.15 |
| Example 38 | A5 | 13 | | | Water | 86.9 | | | C9 | 14.3 | D9 | −8 | 7000 | 0.5 | A | E2 | 0.15 |
| Example 39 | A5 | 13 | | | Water | 86.9 | | | C9 | 14.3 | D10 | −8 | 5500 | 0.5 | A | E2 | 0.15 |
| Example 40 | A5 | 13 | | | Water | 86.9 | | | C9 | 14.3 | D7 | −14 | 5300 | 0.5 | A | E5 | 0.15 |
| Example 41 | A5 | 13 | | | Water | 86.9 | | | C9 | 14.3 | D8 | −14 | 6600 | 0.5 | A | E5 | 0.15 |
| Example 42 | A5 | 13 | | | Water | 86.9 | | | C9 | 14.3 | D7 | −14 | 5300 | 0.5 | A | E6 | 0.15 |
| Example 43 | A5 | 13 | | | Water | 86.9 | | | C9 | 14.3 | D8 | −14 | 6600 | 0.5 | A | E6 | 0.15 |
| Example 44 | A5 | 13 | | | Water | 86.9 | | | C12 | 14.3 | D7 | −14 | 5300 | 0.5 | A | E2 | 0.15 |
| Example 45 | A5 | 13 | | | Water | 86.9 | | | C12 | 14.3 | D8 | −14 | 6600 | 0.5 | A | E2 | 0.15 |
| Comparative Example 13 | A5 | 13 | | | Water | 86.9 | | | C12 | 14.3 | D11 | −14 | 450 | 0.5 | B | E2 | 0.15 |
| Comparative Example 14 | A5 | 13 | | | Water | 86.9 | | | C9 | 14.3 | D11 | −14 | 450 | 0.5 | B | E2 | 0.15 |
| Comparative Example 15 | A5 | 13 | | | Water | 86.9 | | | C9 | 14.3 | D12 | −5.8 | 200 | 0.5 | C | E2 | 0.15 |
| Comparative Example 16 | A5 | 13 | | | Water | 86.9 | | | C9 | 14.3 | D13 | −5.8 | 360 | 0.5 | B | E2 | 0.15 |
| Comparative Example 17 | A5 | 13 | | | Water | 86.9 | | | C9 | 14.3 | D14 | −5.8 | 190 | 0.5 | C | E2 | 0.15 |
| Comparative Example 18 | A5 | 13 | | | Water | 86.9 | | | C9 | 14.3 | D15 | −2.8 | 3400 | 0.5 | B | E2 | 0.15 |
| Comparative Example 19 | A5 | 13 | | | Water | 86.9 | | | C9 | 14.3 | D16 | −5.8 | 1 | 0.5 | C | E2 | 0.15 |
| Comparative Example 20 | A5 | 13 | | | Water | 86.9 | | | C9 | 14.3 | D17 | −5.8 | 600 | 0.5 | B | E2 | 0.15 |

In addition, abbreviations in Table 3 are as follows.
<Water-Soluble Resin>
IPA: isopropyl alcohol (manufactured by Wako Pure Chemical Industries, Ltd.)
A5: polyvinyl alcohol (PVA203, manufactured by KURARAY CO., LTD., sp value=25.8 MPa)$^{1/2}$)
A6: polyvinyl pyrrolidone (polyvinyl pyrrolidone K-30, manufactured by Nippon Shokubai Co., Ltd., sp value=22.5 MPa)$^{1/2}$)
A7: pullulan (manufactured by Hayashibara Co., Ltd., sp value: 27.8 MPa)$^{1/2}$ D10: the following structure (heptafluoropropane sulfonic acid (pKa=−8)-generated 5-membered ring imide sulfonate type, molar absorption coefficient=5500 L/(mol·cm))
D11: NT-2TF (trifluoromethane sulfonic acid (pKa=−14)-generated 6-membered ring imide sulfonate type, molar absorption coefficient=450 L/(mol·cm), manufactured by San-Apro Ltd.)
D12: CGI-1905 (the following structure, nonafluorobutane sulfonic acid (pKa=−5.8)-generated oxime sulfonate type, molar absorption coefficient=200 L/(mol·cm), manufactured by BASF Japan Ltd.)

D13: CGI-1906 (the following structure, nonafluorobutane sulfonic acid (pKa=−5.8)-generated oxime sulfonate type, molar absorption coefficient=360 L/(mol·cm), manufactured by BASF Japan Ltd.)

D14: CGI-1907 (the following structure, nonafluorobutane sulfonic acid (pKa=−5.8)-generated oxime sulfonate type, molar absorption coefficient=190 L/(mol·cm), manufactured by BASF Japan Ltd.)

D15: Irgacure PAG-121 (the following structure, para-toluene sulfonic acid (pKa=−2.8)-generated oxime sulfonate type, molar absorption coefficient=3400 L/(mol·cm), manufactured by BASF Japan Ltd.)

D16: NDI-109 (the following structure, nonafluorobutane sulfonic acid (pKa=−5.8)-generated 5-membered ring imide sulfonate type, molar absorption coefficient=1 L/(mol·cm), manufactured by Midori Kagaku Co., Ltd.)

D17: CPI-310NF (nonafluorobutane sulfonic acid (pKa=−5.8)-generated type, ionic, molar absorption coefficient=600 L/(mol·cm), manufactured by San-Apro Ltd.)

<Resin>

E2: 2,6-diisopropylaniline (primary amine, manufactured by Tokyo Chemical Industry Co., Ltd.)

E3: 2,4,6-tri-tert-butylaniline (primary amine, manufactured by Tokyo Chemical Industry Co., Ltd.)

E4: hexylamine (primary amine, manufactured by Tokyo Chemical Industry Co., Ltd.)

E5: N-cyclohexyl-N'-[2-(4-morpholinyl)ethyl]thiourea (secondary amine, manufactured by Inabata & Co., Ltd.)

E6: N,N-dimethyl-4-aminopyridine (tertiary amine, manufactured by Tokyo Chemical Industry Co., Ltd.)

D9

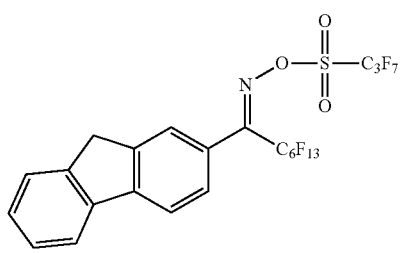

D10

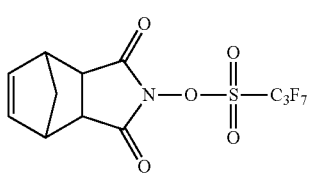

D12

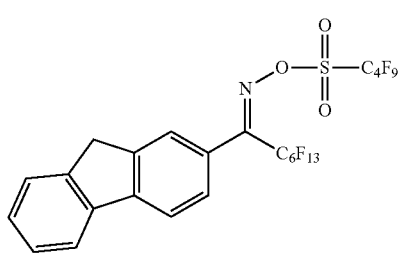

-continued

D13

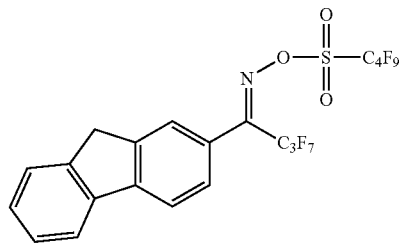

D14

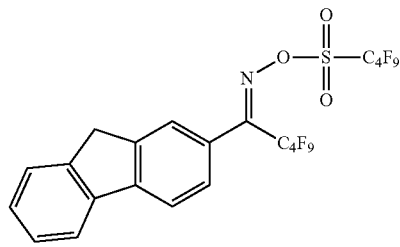

D15

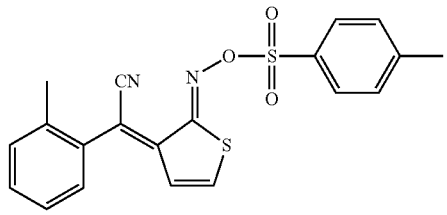

D16

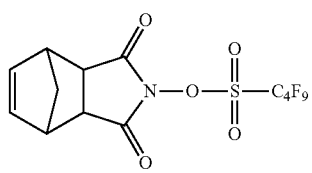

<Organic Semiconductor Film Formation>

An organic semiconductor film was formed by spin-coating a glass substrate having dimensions of 5 cm² with an organic semiconductor coating solution formed of a composition described below and drying the glass substrate at 130° C. for 10 minutes. The film thickness was 150 nm.

P3HT (manufactured by Sigma-Aldrich Co., LLC.): 10% by mass

PCBM (manufactured by Sigma-Aldrich Co., LLC.): 10% by mass

Chloroform (manufactured by Wako Pure Chemical Industries, Ltd.): 80% by mass

<Process of Coating Substrate with Water-Soluble Resin Composition>

A water-soluble resin film was formed by spin-coating the substrate on which the organic semiconductor film was formed with the water-soluble resin composition and drying the substrate at 100° C. for 1 minute. The film thickness was 1 μm.

<Process of Preparing Mask Pattern of Resin on Water-Soluble Resin Film>

The substrate on which the water-soluble resin film was formed was spin-coated with a chemically amplified photosensitive resin composition formed of a composition listed in the table above and dried at 100° C. for 1 minute. The film thickness was 1 μm. Next, the film was exposed to light under the condition of 200 mJ/cm² using a parallel light exposure device of the i-line. Subsequently, the film was heated at 120° C. for 1 minute and developed using butyl acetate, thereby obtaining a mask pattern.

<Process of Patterning Organic Semiconductor by Performing Dry Etching>

The obtained substrate was dry-etched, and the mask pattern, the water-soluble resin film of a non-mask pattern portion, and the organic semiconductor film of the non-mask pattern portion were removed. The dry etching was performed under the same conditions as those described above.

<Process of Dissolving Remaining Water-Soluble Resin in Water and Removing the Same>

The obtained substrate was washed with water, a pattern formed of the water-soluble resin film was removed, the substrate was heated at 100° C. for 10 minutes, moisture remaining on the organic semiconductor film was removed, and the damage during the process was repaired, thereby obtaining a substrate on which the organic semiconductor film was patterned.

<Evaluation>

<<In-Plane Uniformity of Water-Soluble Resin Film>>

Evaluation was performed under the same conditions as those of the evaluation of the in-plane uniformity of the above-described water-soluble resin film.

<<Pattern Shape of Resist Film>>

Evaluation was performed under the same conditions as those of the evaluation of the pattern shape of the above-described resist film.

<<Pattern Shape of Organic Semiconductor Film>>

Evaluation was performed under the same conditions as those of the evaluation of the pattern shape of the above-described organic semiconductor film.

<<Surface Form of Water-Soluble Resin Film>>

The coating surface form of the water-soluble resin film was observed using an optical microscope. Evaluation was performed based on the following criteria.

A: No cracks were not observed over the entire surface.

B: Cracks were partially generated at the time of film formation of the chemically amplified photosensitive resin composition.

C: No cracks were observed over the entire surface immediately after coating.

<<Storage Stability of Chemically Amplified Photosensitive Resin Composition>>

The prepared chemically amplified photosensitive resin composition was left in a thermostatic tank at 50° C. for one week, and the optimum exposure value (exposure value in which a difference from a design pattern line width became the smallest), before and after the composition was left, was calculated by observing a pattern formed using a contact aligner with a scanning electron microscope. Evaluation was performed based on the following criteria.

A: Variation in the optimum exposure value was less than ±3%.

B: Variation in the optimum exposure value was ±3% to less than 10%.

C: Variation in the optimum exposure value was ±10% or greater.

TABLE 4

| | In-plane uniformity of water-soluble resin film | Pattern shape of resist film | Pattern shape of organic semiconductor film |
|---|---|---|---|
| Example 22 | A | A | A |
| Example 23 | B | A | A |
| Example 24 | B | A | A |
| Example 25 | A | A | A |
| Example 26 | A | A | A |
| Example 27 | A | A | A |
| Example 28 | A | A | A |
| Example 29 | A | A | A |
| Example 30 | A | A | A |
| Example 31 | A | A | A |
| Example 32 | A | A | A |
| Example 33 | A | A | A |
| Example 34 | A | A | A |
| Example 35 | A | A | A |
| Example 36 | A | A | A |
| Example 37 | A | A | A |
| Example 38 | A | B | B |
| Example 39 | A | B | B |
| Example 40 | A | A | A |
| Example 41 | A | A | A |
| Example 42 | A | A | A |
| Example 43 | A | A | A |
| Example 44 | A | A | B |
| Example 45 | A | A | B |
| Comparative Example 13 | A | C | B |
| Comparative Example 14 | A | C | B |
| Comparative Example 15 | A | C | C |
| Comparative Example 16 | A | C | B |
| Comparative Example 17 | A | C | C |
| Comparative Example 18 | A | C | B |
| Comparative Example 19 | A | C | C |
| Comparative Example 20 | A | C | B |

TABLE 5

| | Surface form of water-soluble resin film | Storage stability of chemically amplified photosensitive resin composition |
|---|---|---|
| Example 22 | A | A |
| Example 23 | B | A |
| Example 24 | B | A |
| Example 25 | A | A |
| Example 26 | A | A |
| Example 27 | A | A |
| Example 28 | A | A |
| Example 29 | A | A |
| Example 30 | A | A |
| Example 31 | A | A |
| Example 32 | A | A |
| Example 33 | A | A |
| Example 34 | A | A |
| Example 35 | A | A |
| Example 36 | A | A |
| Example 37 | A | A |
| Example 38 | A | A |
| Example 39 | A | A |
| Example 40 | A | B |
| Example 41 | A | B |
| Example 42 | A | B |
| Example 43 | A | B |
| Example 44 | A | B |
| Example 45 | A | B |
| Comparative Example 13 | A | B |
| Comparative Example 14 | A | C |
| Comparative Example 15 | A | C |
| Comparative Example 16 | A | A |
| Comparative Example 17 | A | C |
| Comparative Example 18 | A | A |
| Comparative Example 19 | A | C |
| Comparative Example 20 | A | C |

As listed in the table above, in Examples, the water-soluble resin film was formed to have an excellent surface form, patterning properties of the resist film were excellent, and storage stability was excellent. Accordingly, it could be understood that a fine pattern of the organic semiconductor was able to be formed. Meanwhile, in Comparative Examples, the in-plane uniformity, the patterning properties, or storage stability was degraded. For this reason, it could be understood that a fine pattern of the organic semiconductor was unlikely to be able to be formed.

The same as in Examples and Comparative Examples above was performed except that organic semiconductor coating solutions were changed to the following. As a result, it was recognized that the same tendencies as those in Examples and Comparative Examples were shown.

<Composition A of Organic Semiconductor Coating Solution>

| | |
|---|---|
| TIPS pentacene (manufactured by Sigma-Aldrich Co., LLC.) | 5 parts by mass |
| Toluene (manufactured by Sigma-Aldrich Co., LLC.) | 95 parts by mass |

<Composition B of Organic Semiconductor Film>

| | |
|---|---|
| MEH-PPV (manufactured by Sigma-Aldrich Co., LLC.) | 10 parts by mass |
| Toluene (manufactured by Sigma-Aldrich Co., LLC.) | 90 parts by mass |

<Composition C of Organic Semiconductor Coating Solution>

| | |
|---|---|
| PEDOT/PSS (manufactured by Sigma-Aldrich Co., LLC., 1.3 mass % aqueous dispersion liquid) | 100 parts by mass |

The same as in Examples and Comparative Examples above was performed except that wet etching was performed using the following etching solutions in place of dry etching. As a result, it was recognized that the same tendencies as those in Examples and Comparative Examples were shown.
<Etching Solution 1 in First Step>
Water 100% by mass
<Etching Solution 1 in Second Step>
Propylene glycol monomethyl ether 100% by mass
<Etching Solution 2 in First Step>
2-propanol 100% by mass
<Etching Solution 2 in Second Step>
Propylene glycol monomethyl ether 100% by mass
<Etching Solution 3 in First Step>
Water 100% by mass
<Etching Solution 3 in Second Step>
3-methyl-1-butanol 100% by mass The water-soluble resin film of a non-mask pattern portion and the organic semiconductor film of the non-mask pattern portion were removed by performing wet etching on the substrate under the following conditions.
System: Two Fluid Spray
<Etching in First Step>
Flow rate: 30 mL/min
Pressure: 200 kPa
Time: 30 sec
<Etching in Second Step>
Flow rate: 20 mL/min
Pressure: 200 kPa
Time: 10 sec
The resist pattern was peeled using the obtained substrate under the following conditions, the pattern formed of the water-soluble resin film was removed by being washed with water and heated at 100° C. for 10 minutes, moisture remaining on the organic semiconductor film was removed, and the film was dried so that the damage during the process was repaired, thereby obtaining a substrate on which the organic semiconductor film was patterned.
System: paddle
Peeling solution: propylene glycol monomethyl ether
Time: 60 sec

EXPLANATION OF REFERENCES

1: substrate
2: organic semiconductor film
3: water-soluble resin film
4: mask pattern

What is claimed is:

1. A laminate body which includes, in order, a substrate, an organic semiconductor film, a water-soluble resin film and a resist film formed of a chemically amplified photosensitive resin composition,
    wherein the chemically amplified photosensitive resin composition contains a photoacid generator which decomposes in an amount of 80% by mole or greater when exposed to light under the condition of 100 mJ/cm$^2$ at a wavelength of 365 nm, such that the resin composition is capable of forming a mask pattern for an etching mask as a result of exposed portions being hardly soluble in a developer containing an organic solvent.

2. The laminate body according to claim 1, wherein the sp value of a water-soluble resin of the water-soluble resin film is equal to or greater than 18 (MPa)$^{1/2}$ and less than 29 (MPa)$_{1/2}$.

3. The laminate body according to claim 1, wherein the sp value of a water-soluble resin of the water-soluble resin film is in a range of 20 (MPa)$^{1/2}$ to 26 (MPa)$^{1/2}$.

4. The laminate body according to claim 1, wherein the water-soluble resin of the water-soluble resin film is polyvinyl alcohol, polyvinylpyrrolidone, or a mixture of polyvinyl alcohol and polyvinylpyrrolidone.

5. The laminate body according to claim 1,
    wherein the chemically amplified photosensitive resin composition is a resin composition whose polarity changes and which becomes hardly soluble in an organic solvent having an sp value of less than 18 (MPa)$^{1/2}$ when it is exposed to light under the condition of 100 mJ/cm$^2$ or greater at a wavelength of 365 nm.

6. The laminate body according to claim 1, wherein the chemically amplified photosensitive resin composition includes a resin having a cyclic ether ester structure.

7. The laminate body according to claim 1, wherein the chemically amplified photosensitive resin composition includes a resin having a repeating unit that contains a group represented by the following Formula (11);

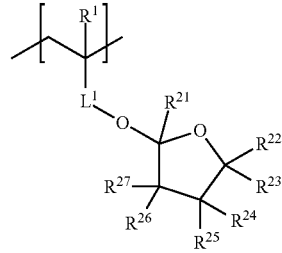

Formula (11)

wherein in Formula (11), $R^1$ represents a hydrogen atom or an alkyl group, $L^1$ represents a carbonyl group or a phenylene group, and $R^{21}$ to $R^{27}$ each independently represents a hydrogen atom or an alkyl group.

8. The laminate body according to claim 1, wherein the chemically amplified photosensitive resin composition includes a resin having a repeating unit represented by the following Formula ($B^1$-1);

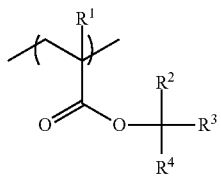

Formula ($B^1$-1)

wherein in Formula ($B^1$-1), $R^1$ represents a hydrogen atom, an alkyl group, a cyano group, or a halogen atom; $R^2$ to $R^4$ each independently represents an alkyl group; and two of $R^2$ to $R^4$ may be bonded to each other to form a cyclic alkyl group.

9. The laminate body according to claim 1, wherein the chemically amplified photosensitive resin composition includes a resin having a repeating unit represented by the following Formula ($B^1$-2);

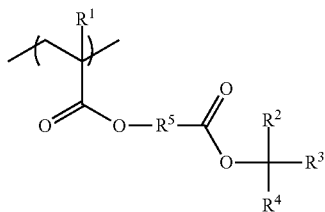

Formula ($B^1$-2)

wherein in Formula ($B^1$-2), $R^1$ represents a hydrogen atom, an alkyl group, a cyano group, or a halogen atom; $R^2$ to $R^4$ each independently represents an alkyl group; two of $R^2$ to $R^4$ may be bonded to each other to form a cyclic alkyl group; and $R^5$ represents a divalent chain-like hydrocarbon group.

10. The laminate body according to claim 1, wherein the photoacid generator is a non-ionic photoacid generator which generates acids having a pKa of −6 or less using irradiation with active rays or radiation and whose molar absorption coefficient at a wavelength of 365 nm is 4000 L/(mol·cm) or greater.

11. The laminate body according to claim 10, wherein the non-ionic photoacid generator is a compound which includes a fluoroalkyl group having 2 or 3 carbon atoms and is a compound which generates a sulfonic acid including a fluoroalkyl group having 2 or 3 carbon atoms using irradiation with active rays and/or radiation.

12. The laminate body according to claim 10, wherein the non-ionic photoacid generator is a compound represented by the following Formula (3);

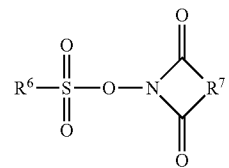

Formula (3)

wherein in Formula (3), $R^6$ represents a fluoroalkyl group having 2 or 3 carbon atoms; and $R^7$ represents an alkylene group, an alkenylene group, or an arylene group.

13. The laminate body according to claim 10, wherein the non-ionic photoacid generator is a compound which includes a 5-membered ring imide sulfonate group.

14. The laminate body according to claim 10, wherein the non-ionic photoacid generator is a compound represented by the following Formula (4);

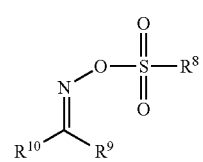

Formula (4)

wherein in Formula (4), $R^8$ represents a fluoroalkyl group having 2 or 3 carbon atoms; $R^9$ represents an alkyl group having 1 to 8 carbon atoms or a fluoroalkyl group; and $R^{10}$ represents an aromatic hydrocarbon group or an aromatic heterocyclic group.

15. The laminate body according to claim 1, wherein the photoacid generator is a compound which includes an oxime sulfonate group.

16. The laminate body according to claim 1, wherein the chemically amplified photosensitive resin composition further includes a basic compound.

17. The laminate body according to claim 16, wherein the basic compound is a primary amine compound.

18. The laminate body according to claim 1,
wherein the chemically amplified photosensitive resin composition further includes a resin including a repeating unit represented by the following Formula ($B^1$-1) and/or a repeating unit represented by the following Formula ($B^1$-2), and a basic compound, and
the photoacid generator is a non-ionic photoacid generator which generates acids having a pKa of −6 or less using irradiation with active rays or radiation and whose molar absorption coefficient at a wavelength of 365 nm is 4000 L/(mol·cm) or greater;

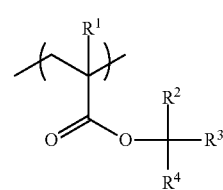

Formula ($B^1$-1)

wherein in Formula ($B^1$-1), $R^1$ represents a hydrogen atom, an alkyl group, a cyano group, or a halogen atom;

$R^2$ to $R^4$ each independently represent an alkyl group; and two of $R^2$ to $R^4$ may be bonded to each other to form a cyclic alkyl group, Formula ($B^1$-2)

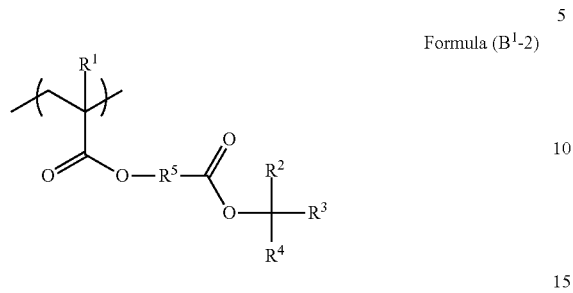

wherein in Formula ($B^1$-2), $R^1$ represents a hydrogen atom, an alkyl group, a cyano group, or a halogen atom; $R^2$ to $R^4$ each independently represents an alkyl group; two of $R^2$ to $R^4$ may be bonded to each other to form a cyclic alkyl group; and $R^5$ represents a divalent chain-like hydrocarbon group.

19. The laminate body according to claim 1, wherein the chemically amplified photosensitive resin composition is a negative type composition.

* * * * *